US006903422B2

(12) United States Patent
Goda et al.

(10) Patent No.: US 6,903,422 B2

(45) Date of Patent: Jun. 7, 2005

(54) SEMICONDUCTOR INTEGRATED CIRCUITS, FABRICATION METHOD FOR THE SAME AND SEMICONDUCTOR INTEGRATED CIRCUIT SYSTEMS

(75) Inventors: Akira Goda, Yokohama (JP); Mitsuhiro Noguchi, Yokohama (JP); Masayuki Tanaka, Yokohama (JP); Shigehiko Saida, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 27 days.

(21) Appl. No.: 10/609,520

(22) Filed: Jul. 1, 2003

(65) Prior Publication Data

US 2004/0071030 A1 Apr. 15, 2004

(30) Foreign Application Priority Data

Jul. 3, 2002 (JP) ...................................... 2002-195005

(51) Int. Cl.[7] ................................................ H01L 29/76

(52) U.S. Cl. ....................... 257/365; 257/382; 257/388; 257/412; 257/640; 257/649; 257/760

(58) Field of Search .......................... 257/69, 195, 204, 257/206, 338, 350, 351, 576, 357–359, 365–388, 410–413, 639–641, 649, 760, 454–456, 485, 486

(56) References Cited

U.S. PATENT DOCUMENTS 6,107,154 A * 8/2000 Lin ............................ 438/396
6,197,639 B1 * 3/2001 Lee et al. .................... 438/258
6,413,861 B1 * 7/2002 Huang et al. ............... 438/682
6,452,227 B2 * 9/2002 Hashimoto et al. ......... 257/326
6,784,503 B2 * 8/2004 Shimizu et al. ............. 257/390

FOREIGN PATENT DOCUMENTS

| | | |
|---|---|---|
| JP | 09-116032 | 5/1997 |
| JP | 2000-252449 | 9/2000 |
| JP | 2001-94076 | 4/2001 |
| JP | 2001-111013 | 4/2001 |
| JP | 2002-026153 | 1/2002 |
| JP | 2002-50705 | 2/2002 |
| JP | 2002-079149 | 3/2002 |
| JP | 2002-124643 | 4/2002 |
| JP | 2002-158298 | 5/2002 |
| JP | 2002-231829 | 8/2002 |
| JP | 2003-347511 | 12/2003 |

* cited by examiner

*Primary Examiner*—Andy Huynh

(74) *Attorney, Agent, or Firm*—Oblon, Spivak, McClelland, Maier & Neustadt, P.C.

(57) ABSTRACT

A semiconductor integrated circuit is disclosed, which includes a semiconductor substrate, a memory cell formed on the semiconductor substrate and having a first gate insulating layer of a stacked structure which includes a silicon nitride layer to become a charge storage layer, and a transistor formed on the semiconductor substrate and having a second gate insulating layer. Here, source and drain diffused layers of the memory cell are covered with a part of the first gate insulating layer, and metal silicide layers are formed on surfaces of source and drain diffused layers of the transistor.

4 Claims, 52 Drawing Sheets

25a
24
11b
10
n
P-Sub
p
12b
23
22
21
20
12a
11a 25a
24
11b
10
n
P-Sub
p
12b
23
22
21
20
12a
11a

P or As
P or As
41
25
24
11b
10
n
P-Sub
25
24
n⁻
31
p
31
n⁻
P-Sub
10
12b
25
n
30
p
n
30
n
P-Sub
23
22
21
20
12a
11a
10

B or $BF_2$
24
25
33
33
$p^-$
$p^-$
n
P-Sub
11b
10
42
25
24
$n^-$
$n^-$
31
31
p
P-Sub
10
12b
42
25
n
n
30
30
p
n
P-Sub
23
22
21
20
12a
11a
10

25
n
p
n
P-Sub
30
30
23
22
21
20
12a
11a
10
12b
31
31
n⁻
24
10
p⁻
33
33
11b 20
23
22
21
12a
11a
10
26
25
n
p
n
P-Sub
30
30
n
n
12b
26
25
n
p
P-Sub
32
32
n⁻
n⁻
24
10
26
25
p
n
P-Sub
33
33
p⁻
p⁻
24
11b
10

20
21
22
23
24
25
26
30
31
32
33
34
10
11a
11b
12a
12b
n
p
n+
n−
p+
p−
P-Sub 51
25a
24
11b
10
n
P-Sub
51
25a
24
p
P-Sub
10
12b
51
25a
p
n
P-Sub
23
22
21
20
12a
11a
10

B or $BF_2$
B or $BF_2$
51
25a
24
11b
10
n
P-Sub
52
51
25a
24
p
P-Sub
12b
10
51
25a
23
22
21
20
12a
11a
10
p
n
P-Sub

P or As
54
25
p+
24
11b
n
P-Sub
10
n+
p
12b
23
22
21
20
12a
11a

B or BF2
25
p+
24
33
p−
n
P-Sub
11b
10
55
n+
31
n−
p
12b
23
22
21
20
12a
11a 25
26
p+
n+
24
33
31
p−
n−
n
p
P-Sub
11b
10
12b
23
22
21
20
12a
11a 20
23
22
21
12a
11a
10
26
25
p+
p
n
P-Sub
12b
26
25
n+
24
n+
n−
31
32
p
P-Sub
10
26
25
p+
24
p+
p−
33
34
n
P-Sub
11b
10

I
42
53
27
25
n
p
30
10
11a
12a
20
21
22
23

I
I
45
42
53
27
25
23
22
21
26
26
43
26
26
43
44
42
27
25
23
22
21
12a
11a
30
30
30
30
10
n
n
n
n
p
n
p 500
501
MONOS SEMICONDUCTOR MEMORY DEVICE
508
430
432
431
420
RAM
410
ROM
CONTROL SECTION
CALCULATION SECTION
CPU
600
PLANE TERMINAL
IC CARD
EXTERNAL DEVICE 500
510
410
MONOS NAND FLASH
ROM
509
430
420
RAM
432
CONTROL SECTION
431
CALCULATION SECTION
CPU
600
PLANE TERMINAL
IC CARD
EXTERNAL DEVICE

SEMICONDUCTOR INTEGRATED CIRCUITS, FABRICATION METHOD FOR THE SAME AND SEMICONDUCTOR INTEGRATED CIRCUIT SYSTEMS

CROSS REFERRENCE TO RELATED APPLICATIONS

This application is based upon and claims the benefit of priority from prior Japanese Patent Applications P2002-195005 filed on Jul. 3, 2002; the entire contents of which are incorporated by reference herein.

BACKGROUND OF THE INVENTION

1. Field of the Invention

The present invention relates to a semiconductor integrated circuit having a nonvolatile memory cell using a silicon nitride layer as a charge storage layer, a fabrication method for the same and semiconductor integrated circuit systems.

2. Description of the Related Art

As one of nonvolatile semiconductor memory devices which enable electrically writing and erasing, a MONOS memory cell using a silicon nitride layer for a charge storage layer has been known.

A gate insulating layer of the MONOS memory cell is specifically formed in a stacked structure of a tunneling insulating layer, a silicon nitride layer and a block insulating layer.

Different from a floating gate memory cell structure, a gate electrode of the MONOS type cell has a single layer structure. Thus, if the MOMOS memory cell array is formed together with a typical MOS transistor having a single gate layer structure similar to that of the MONOS memory cell on the same substrate, it is characterized that commonality of a process thereof can be easily realized.

As a technology for achieving a higher speed of the MOS transistor, a salicide structure and a process for siliciding surfaces of a gate electrode and source and drain diffused layers have been presented. In this silicide structure, since a silicon substrate of the source and drain diffused layer regions reacts with a metal to be silicided, there is a problem of junction leakage which occurs when the source and drain diffused layers are shallow.

Therefore, if the MONOS memory cell and a logic circuit are fabricated on a same chip in hybridization, application of the salicide structure makes the problem serious. It is because the source and drain diffused layers of the MONOS type memory cell are shallow compared with those of the typical MOS transistor and, if these layers are simultaneously silicided, junction leakage of the source and drain diffused layers easily occur in the memory cell array region.

SUMMARY OF THE INVENTION

A first aspect of the present invention inheres in a semiconductor integrated circuit which includes a semiconductor substrate; a memory cell provided on the semiconductor substrate and having a first gate insulating layer of a stacked structure which includes a silicon nitride layer to be a charge storage layer, and having a source and drain diffused layer and a gate electrode; a transistor provided on the semiconductor substrate and having a second gate insulating layer, a source and drain diffused layer and a gate electrode, wherein the source and drain diffused layer of the memory cell is covered by a part of the first gate insulating layer, and a metal silicide layer is provided on a surface of the source and drain diffused layer of the transistor.

A second aspect of the present invention inheres in a semiconductor integrated circuit which includes a semiconductor substrate; a plurality of memory cells provided on the semiconductor substrate and having a first gate insulating layer of a stacked structure which includes a silicon nitride layer to be a charge storage layer, and having a source and drain diffused layer and a gate electrode; an inter-layer insulating layer provided on the memory cell; a metal wiring provided on the inter-layer insulating layer; a contact plug buried in the inter-layer insulating layer and connecting the metal wiring to at least one of the source and drain diffused layer of the memory cell, and an isolation region which electrically isolates neighboring cells of the plurality of memory cells adjacent to the contact plug; wherein the silicon nitride layer is provided above the isolation region adjacent to the contact plug.

A third aspect of the present invention inheres in a fabrication method for a semiconductor integrated circuit which includes forming a first gate insulating layer having a stacked structure including a silicon nitride layer as a charge storage layer, in a cell array region of a substrate; forming a second gate insulating layer, in a circuit region of the substrate; forming a gate electrode of a memory cell on the first gate insulating layer and forming a gate electrode of a transistor on the second gate insulating layer; forming a source and drain diffused region of a memory cell in the cell array region and forming a source and drain diffused region of a transistor in the circuit region; exposing the source and drain diffused region of the transistor in the circuit region of the substrate, and overlaying a silicon nitride layer on the cell array region of the substrate; and forming a metal silicide layer on an exposed surface of the source and drain diffused region of the transistor in the circuit region of the substrate.

A fourth aspect of the present invention inheres in a semiconductor integrated circuit which includes a semiconductor integrated circuit which includes a plurality of word lines disposed in a row direction; a plurality of bit lines disposed in a column direction perpendicular to the word lines; MONOS memory cell transistors having a source region, a drain region, a gate electrode and a charge storage layer of silicon nitride provided in the column direction and an electronic storage condition of the MONOS memory cell transistor configured to be controlled by one of the plurality of the word lines connected to the MONOS memory cell transistors; a plurality of first select transistors, each including a gate electrode for selecting the MONOS memory cell transistors provided in the column direction, arranged in the column direction and adjacent to the MONOS memory cell transistors at a first end of the MONOS memory cell transistors; and a first select gate line connected to each of the gate electrodes of the first select transistors.

A fifth aspect of the present invention inheres in a semiconductor integrated circuit which includes a semiconductor chip; a MONOS semiconductor memory mounted on the semiconductor chip having a plurality of word lines disposed in a row direction; a plurality of bit lines disposed in a column direction perpendicular to the word lines; MONOS memory cell transistors having a source region, a drain region, a gate electrode and a charge storage layer of a silicon nitride provided in the column direction and an electronic storage condition of the MONOS memory cell transistor configured to be controlled by one of the plurality of the word lines connected to the MONOS memory cell transistors; a plurality of first select transistors selecting the MONOS memory cell transistors, arranged in the column direction and adjacent to the MONOS memory cell transistors at a first end of the MONOS memory cell transistors; and a first select gate line connected to each of the gate electrodes of the first select transistors; and a logic circuit mounted on the semiconductor chip to control the MONOS semiconductor memory.

A sixth aspect of the present invention inheres in a semiconductor integrated circuit system for storing information and for accessing a storage medium which includes a memory card including a MONOS semiconductor memory having a plurality of word lines disposed in a row direction; a plurality of bit lines disposed in a column direction perpendicular to the word lines; MONOS memory cell transistors having a source region, a drain region, a gate electrode and a charge storage layer of silicon nitride provided in the column direction and an electronic storage condition of the MONOS memory cell transistor configured to be controlled by one of the plurality of the word lines connected to the MONOS memory cell transistors; a plurality of first select transistors selecting the MONOS memory cell transistors, arranged in the column direction and adjacent to the memory cell transistors at a first end of the MONOS memory cell transistors; and a first select gate line connected to each of the gate electrodes of the first select transistors.

A seventh aspect of the present invention inheres in a semiconductor integrated circuit system for storing information and for accessing a storage medium which includes an IC card board; a MONOS semiconductor memory disposed on the IC card board, having a plurality of word lines disposed in a row direction; a plurality of bit lines disposed in a column direction perpendicular to the word lines; MONOS memory cell transistors having a source region, a drain region, a gate electrode and a charge storage layer of silicon nitride provided in the column direction and an electronic storage condition of the MONOS memory cell transistor configured to be controlled by one of the plurality of the word lines connected to the memory cell; a plurality of first select transistors selecting the MONOS memory cell transistors disposed in the column direction, arranged in the column direction and adjacent to the MONOS memory cell transistors at a first end of the MONOS memory cell transistors disposed in the column direction; and a first select gate line connected to each of the gate electrodes of the first select transistors.

DETAILED DESCRIPTION OF THE EMBODIMENTS

Figure 1:
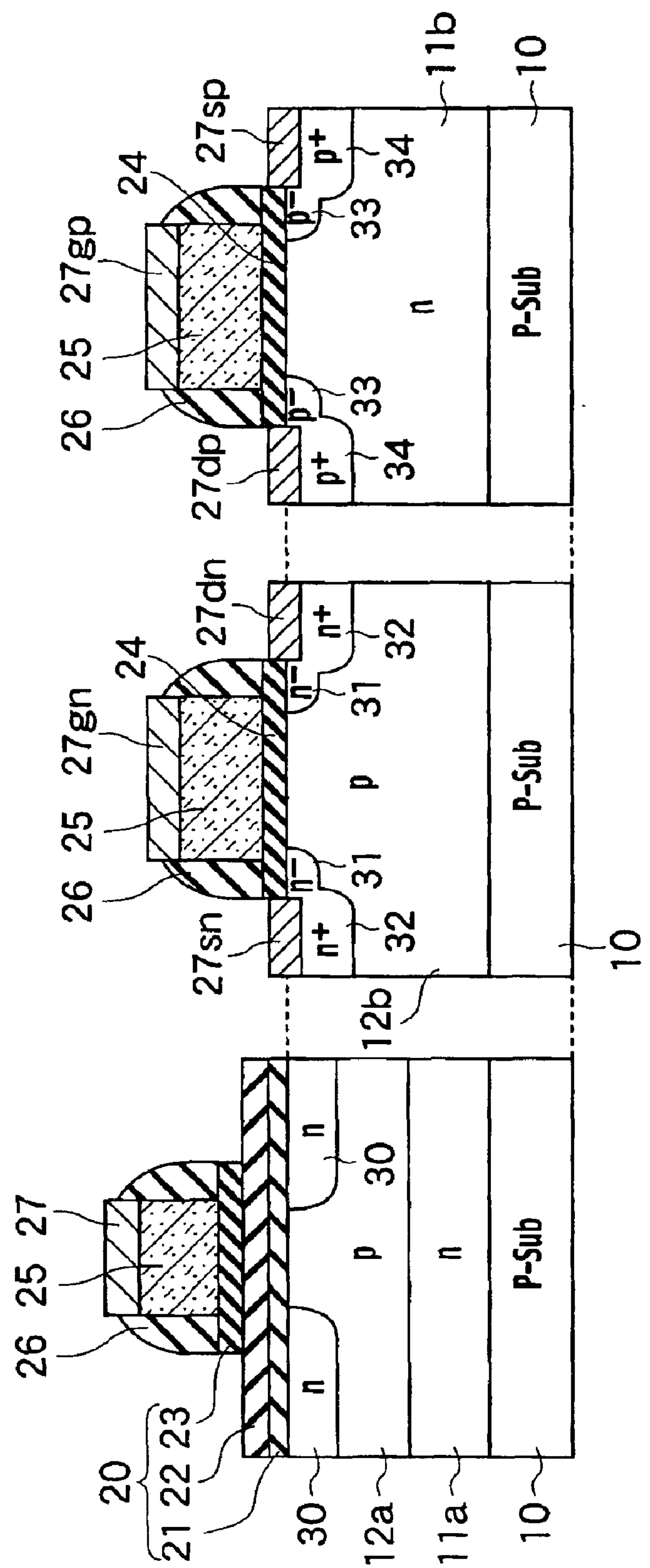
FIG. 1 is a sectional view showing an integrated structure of a MONOS memory cell, an n channel MOS transistor and a p channel MOS transistor in a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

According to the present invention, a semiconductor integrated circuit includes a semiconductor substrate, a memory cell formed on the semiconductor substrate and having a first gate insulating layer of a stacked structure which includes a silicon nitride layer to become a charge storage layer, and a transistor formed on the semiconductor substrate and having a second gate insulating layer. The semiconductor integrated circuit is characterized in that source and drain diffused layers of the memory cell are covered with a part of the first gate insulating layer, and metal silicide layers are formed on surfaces of source and drain diffused layers of the transistor.

According to this invention, while the metal silicide layers are formed on the source and drain diffused layers of the transistor integrated with the memory cell, no metal silicide layers are formed on source and drain diffused layers of the memory cell. Thus, when the source and drain diffused layers of the memory cell are shallow, an increase in junction leakage in the memory cell, which is caused by forming metal silicide layers thereon, can be prevented.

Specifically, the first gate insulating layer in the memory cell has a stacked structure of a tunneling insulating layer, the silicon nitride layer formed on the tunneling insulating layer, and a block insulating layer laid on the silicon nitride layer. In a salicide process, the source and drain diffused layers of the memory cell are covered with the silicon nitride layer used for the gate insulating layer, thereby allowing formation of silicide layers on the source and diffused layers only in a transistor circuit. Preferably, metal silicide layers are also formed on surfaces of gate electrodes of the memory cell and the transistor.

Now that, according to the embodiment of the present invention, a semiconductor integrated circuit includes a semiconductor substrate, a plurality of memory cells formed on the semiconductor substrate and having gate insulating layers of a stacked structure which includes a silicon nitride layer to become a charge storage layer, a metal wiring layer formed on an inter-layer insulating layer which covers the memory cells, and a contact plug which connects at least one of source and drain diffused layers of each of the memory cells with the metal wiring layer, the contact plug being buried in the inter-layer insulating layer. The semiconductor integrated circuit is characterized in that the silicon nitride layer used for the gate insulating layer of the memory cells is also arranged above an element isolation region adjacent to the contact plug.

According to the embodiment of the invention, the silicon nitride layer used for the gate insulating layer of the MONOS memory cell remains above the element isolation region to serve as an etching stopper during the contact plug formation. Thus, it is possible to improve reliability of the MONOS memory cell array, and to achieve high integration.

According to the embodiment of the present invention, a fabrication method for a semiconductor integrated circuit is characterized by including forming a first gate insulating layer of a stacked structure which includes a silicon nitride layer to become a charge storage layer in a memory cell array region of a semiconductor substrate, forming a second gate insulating layer in a transistor circuit region of the semiconductor substrate, forming gate electrodes of a memory cell and a transistor on the first and second gate insulating layers, forming necessary source and drain diffused layers in the cell array region and the transistor circuit region, exposing the source and drain diffused layers of the transistor circuit in a state where the cell array region is covered with the silicon nitride layer, and forming metal silicide layers on surfaces of the exposed source and drain diffused layers of the transistor circuit region.

Preferably, the fabrication method of the invention further includes forming a side-wall insulating layer on a side face of the gate electrode after the formation of the gate electrode. In exposing the source and drain diffused layers of the transistor circuit region, the first insulating layer of the transistor circuit region and the second gate insulating layer of the transistor circuit region are etched by use of the gate electrode and the side-wall insulating layer as masks and the silicon nitride layer of the memory cell array region as an etching stopper. Thus, the source and drain diffused layers are covered with the silicon nitride layers in the memory cell region to enable siliciding thereof.

In forming the metal silicide layers on the surfaces of the source and drain diffused layers of the transistor, metal silicide layers are simultaneously formed on the gate electrode surfaces of the memory cell and the transistor.

The silicon nitride layers remain on the source and drain diffused layers of the cell array region as blocks for preventing formation of metal silicide layers thereon. Thus, after the siliciding process, the silicon nitride layers on the source and drain diffused layers of the cell array region may be etched to be removed.

The embodiment of the present invention provides a high-performance semiconductor integrated circuit where a MONOS memory cell is formed on a semiconductor substrate, its fabrication method and system.

Next, the embodiments of the present invention will be described with reference to the accompanying drawings.

(First Embodiment)

(Element Structure)

FIG. 1 is a sectional view showing an integrated structure of a MONOS memory cell array and a CMOS logic circuit in a semiconductor integrated circuit of a first embodiment of the present invention. In FIG. 1, one MONOS type memory cell (simply referred to as "MONOS cell", hereinafter) in the cell array, a p-channel MOS transistor (pMOSFET, hereinafter) and an n-channel MOS transistor (nMOSFET, hereinafter) of respective surface channel types in the logic circuit are representatively shown.

A silicon substrate 10 is a p-type, and an n-type well 11*a* and a p type well 12*a* are formed in a cell array region of the silicon substrate 10. A p type well 12*b* is formed in the nMOSFET region of the logic circuit (transistor circuit), and an n type well 11*b* is formed in the pMOSFET region. Impurity concentration and the depth of each well are optimally designed in accordance with a formation of the circuit region. The p type well 12*a* of the cell array region and the p type well 12*b* of the transistor circuit region are separately formed.

The MONOS cell has a gate insulating layer 20 of a stacked inter-layer insulating layer structure formed on the surface of the p type well 12*a*. Specifically, the gate insulating layer 20 has a stacked structure of a tunneling insulating layer (first insulating layer) 21 made of a silicon oxide layer or an oxynitride layer having a thickness of, for example, 0.5 to 10 nm, a silicon nitride layer 22 having a thickness of 3 to 50 nm which serves as a charge storage layer, and a block insulating layer 23 made of a silicon oxide layer or an oxynitride layer.

The nMOSFET and the pMOSFET have gate insulating layers 24 made of silicon oxide layers or oxynitride layers, which are 0.5 to 40 nm in thickness on the p type well 12*b* and the n type well 11*b*, respectively.

On each of the gate insulating layers 20 and 24, a gate electrode 25 made of a polycrystal silicon layer having a thickness of 10 to 500 nm is formed. The gate electrode 25 is doped with p type or n type impurities in accordance with the formation of the circuit region.

In the cell array region, an ion implantation process is carried out by use of the gate electrode 25 as a mask to form a n type source and drain diffused layers 30, while a side-wall insulating layer 26 is formed on a side surface of the gate electrode 25. In the nMOSFET region and the pMOSFET region of the logic circuit region, an ion implantation process is carried out by use of the gate electrode 25 as a mask to form shallow source and drain diffused layers 31 and 33 of low concentration, and an ion implantation process is carried out by use of the gate electrode 25 and the side-wall insulating layer 26 as masks to form high concentration deep source and drain diffused layers 32 and 34.

On the surface of the gate electrode 25, a metal silicide layer 27 made of titanium silicide (TiSi) or cobalt silicide (CoSi) is formed to have a thickness of 1 to 40 nm. A thickness of the silicide layer 27 is not varied from the cell array region to the logic circuit region, and is roughly constant. Metal silicide layers 27 are simultaneously formed on the surfaces of the source and drain diffused layers of the logic circuit region. However, in the cell array region, the source and drain diffused layers are covered with the tunneling insulating layer 21 and the silicon nitride layer 22, and no silicide layers are formed.

(CMOS Structure)

Figure 2:
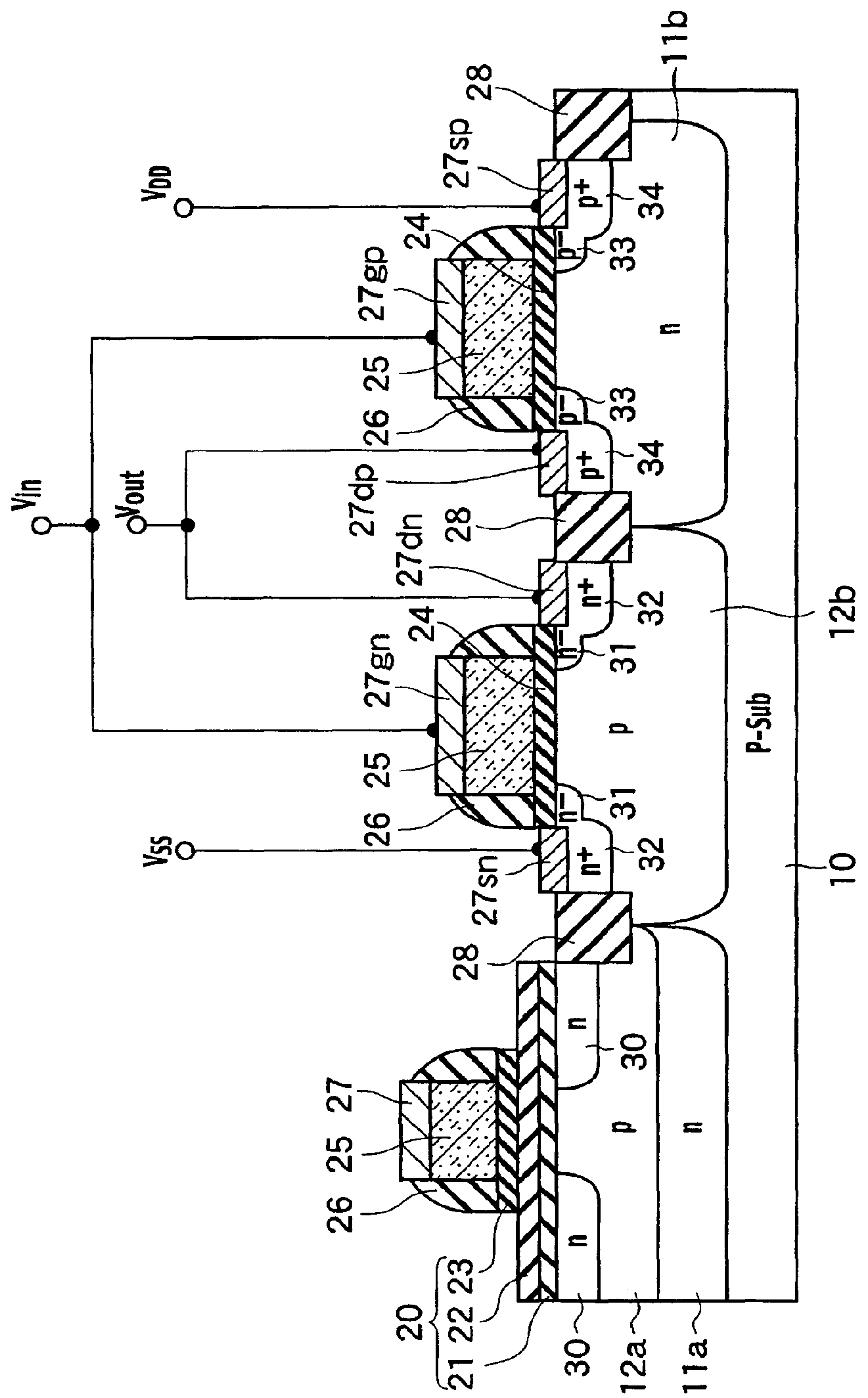
FIG. 2 is a sectional view showing an integrated structure of the MONOS memory cell and a CMOS transistor in the semiconductor integrated circuit of the first embodiment of the present invention.

As shown in FIG. 2, an integrated structure of the MONOS memory cell and the CMOS transistor in the semiconductor integrated circuit of the first embodiment of the present invention provides a MONOS cell region, in which the nMOSFET region and the pMOSFET region are isolated through a shallow trench isolation (STI) region 28. A region of each of the portions of FIG. 2 is similar to that of FIG. 1. The n channel MOSFET is formed in the p well region 12*b*, and the p channel MOSFET is formed in the n well region 11*b*. To constitute a CMOS, a ground potential $V_{SS}$ is applied to a source electrode 27*sn* of the nMOSFET, and a power supply voltage $V_{DD}$ is applied to a source electrode 27*sp* of the pMOSFET. A gate electrode 27*gn* of the nMOSFET and a gate electrode 27*gp* of the pMOSFET are connected in common, and an input signal Vin is provided thereto. Additionally, a drain electrode 27*dn* of the nMOSFET and a drain electrode 27*dp* of the pMOSFET are connected in common to obtain an output signal Vout.

(Fabrication Method)

Description will be made of a specific fabrication method for providing the structure of the semiconductor integrated circuit of the first embodiment of the present invention with reference to FIGS. 3 to 9.

Figure 3:
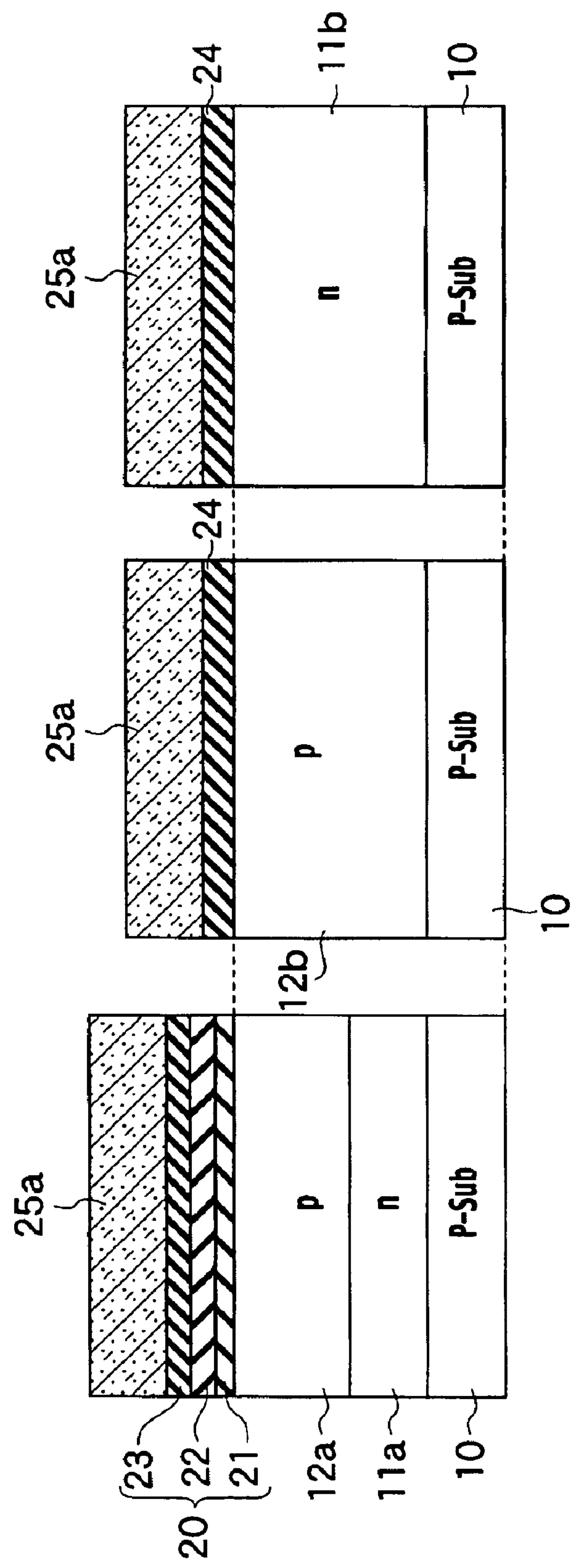
FIG. 3 is a sectional view showing a process up to deposition of a polysilicon layer which includes gate insulating layer formation in a fabrication method of the semiconductor integrated circuit of the first embodiment of the present invention.

(a) As shown in FIG. 3, first, a well necessary for each circuit region is formed on the silicon substrate 10. The silicon substrate 10 is a p type which contains, for example, a $10^{14}$ to $10^{19}$ $cm^{-3}$ concentration of boron. Ions of phosphorus, arsenic, stibium or the like are implanted to the silicon substrate 10 at an acceleration energy of 30 to 1000 keV and with a dosing amount of $1\times10^{11}$ to $1\times10^{15}$ $cm^{-2}$ to form n type wells 11*a* and 11*b*. These n type wells 11*a* and 11*b* may be integrated.

Boron is implanted to the cell array region and the nMOSFET region at an acceleration energy of 100 to 1000 keV and with a dose amount of $1\times10^{11}$ to $1\times10^{15}$ $cm^{-2}$ to form p type wells 12*a* and 12*b*. These p type wells 12*a* and 12*b* are formed to be physically separated by selective ion implantation by use of a resist mask.

Further, when necessary, channel ion implantation is carried out in each circuit region to adjust a threshold value. For example, a resist mask is formed, and channel ion implantation is carried out in the cell array region and the nMOSFET region with a dose amount of $1\times10^{11}$ to $1\times10^{14}$ $cm^{-2}$ of impurities of boron, indium or the like. Similarly, channel ion implantation is carried out in the pMOSFET region with a dose amount of $1\times10^{11}$ to $1\times10^{14}$ $cm^{-2}$ impurities of phosphorus, arsenic or the like.

Subsequently, a gate insulating layer 20 of a stacked structure is formed in the cell array region, and a gate insulating layer 24 of a single layer is formed in the logic circuit region. To explain this process in more detail, first, a silicon oxide layer or an oxynitride layer is formed to a thickness of 0.5 to 10 nm to provide a tunneling insulating layer 21 of the MONOS cell. Then, a silicon nitride layer 22 is formed to a thickness of 3 to 50 nm thereon, and a block insulating layer 23 made of a silicon oxide layer or an oxynitride layer is formed to a thickness of 3 to 30 nm thereon. Thus, a gate insulating layer 20 of an ONO structure is obtained.

Subsequently, the cell array region is covered with a resist, and the gate insulating layer 20 of the logic circuit region is selectively removed. Then, the resist is removed, and a silicon oxide layer or an oxynitride layer is formed to a thickness of 0.5 to 40 nm as a gate insulting layer 24 of each of the nMOSFET and the pMOSFET. The gate insulating layers 24 may be designed equal to each other in thickness in the nMOSFET and the pMOSFET regions. However, different kinds of gate insulating layers may be prepared in accordance with a high-voltage or a low-voltage MOSFET.

Then, a polysilicon layer (or amorphous silicon layer) 25*a*, providing a gate electrode material layer, is deposited to a thickness of 10 to 500 nm on the whole surface. As a result, a structure of FIG. 3 is obtained. Preferably, no impurities are doped to the silicon layer 25*a* for the purpose of simultaneously injecting impurities to the diffused layer and the gate electrode in a subsequent process.

Though not shown, there is a process of forming an element isolation region before or after the formation of the gate insulating layer. For example, by use of STI technology, an element isolation insulating layer made of a silicon oxide layer is buried to a depth of 0.05 to 0.5 $\mu$m in the silicon substrate.

Figure 4:
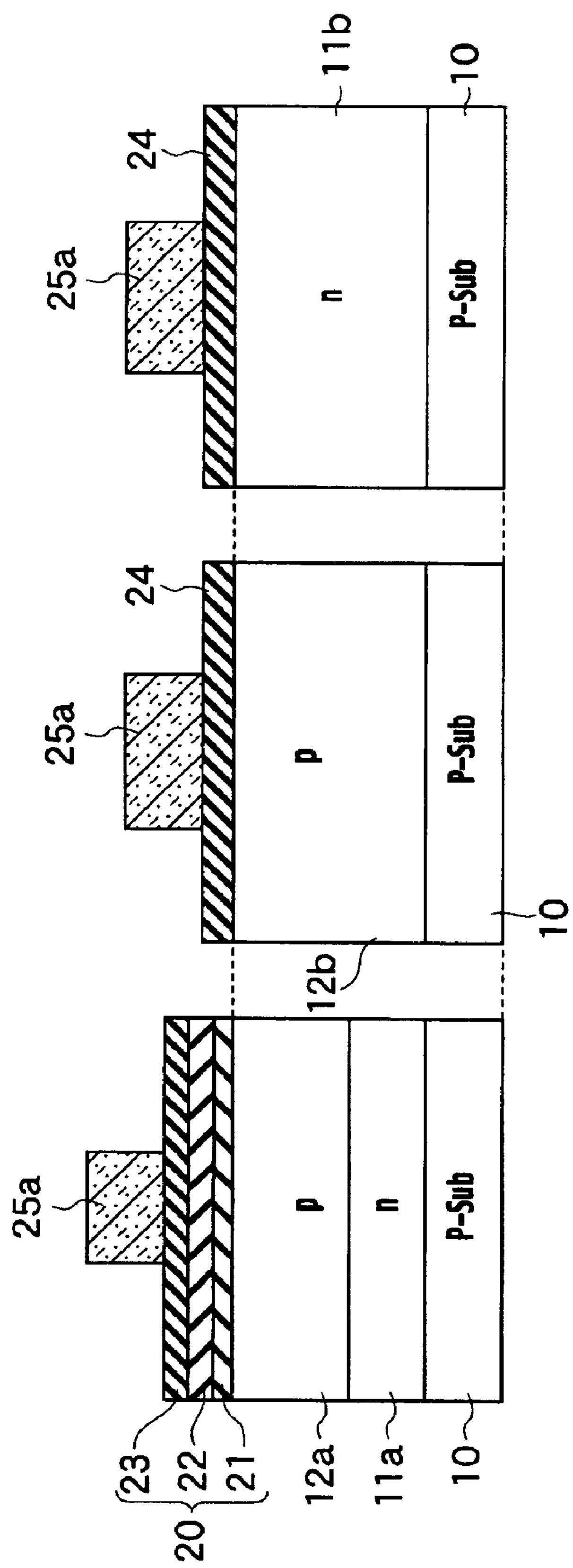
FIG. 4 is a sectional view showing a gate electrode patterning process in the fabrication method of the semiconductor integrated circuit of the first embodiment of the present invention.

(b) As shown in FIG. 4, a gate electrode 25 is patterned in each circuit region by lithography and anisotropic etching (RIE). At this time, the etching is stopped by the block insulting layer 23 of the cell array region and the gate insulating layer 24 of the logic circuit region to achieve a shape of FIG. 4.

Figure 5:
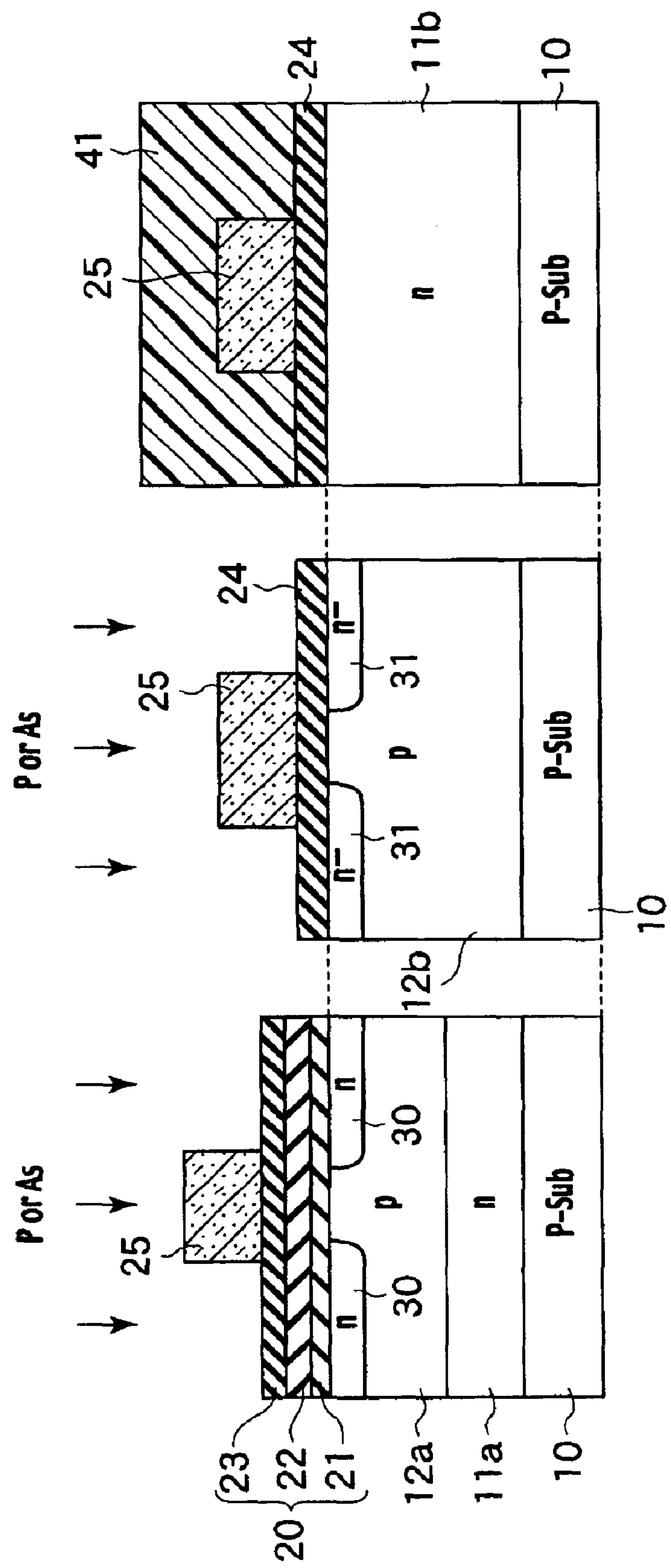
FIG. 5 is a sectional view of an ion implantation process of an n type diffused layer in the fabrication method of the semiconductor integrated circuit of the first embodiment of the present invention.

(c) As shown in FIG. 5, in a state where the pMOSFET region is covered with a resist 41, ions of phosphorus (P) or arsenic (As) are implanted to form source and drain diffused layers 30 and 31 of the MONOS cell and the nMOSFET. At this time, the gate electrode 25 of each of the MONOS cell and the nMOSFET is doped to be an n type. In FIG. 5, to simplify explanation, ions are simultaneously implanted to the source and drain regions of the MONOS cell and the nMOSFET. In an actual process, however, impurities are separately implanted to the cell array region and the nMOSFET region under optimal conditions. An example of FIG. 5 shows that the source and drain diffused layers 31 of the nMOSFET are $n^-$ type layers, and ions are implanted to the layer 31 at a more shallow and lower concentration than those in the case of the n type source and drain diffused layers 30 of the cell array.

Figure 6:
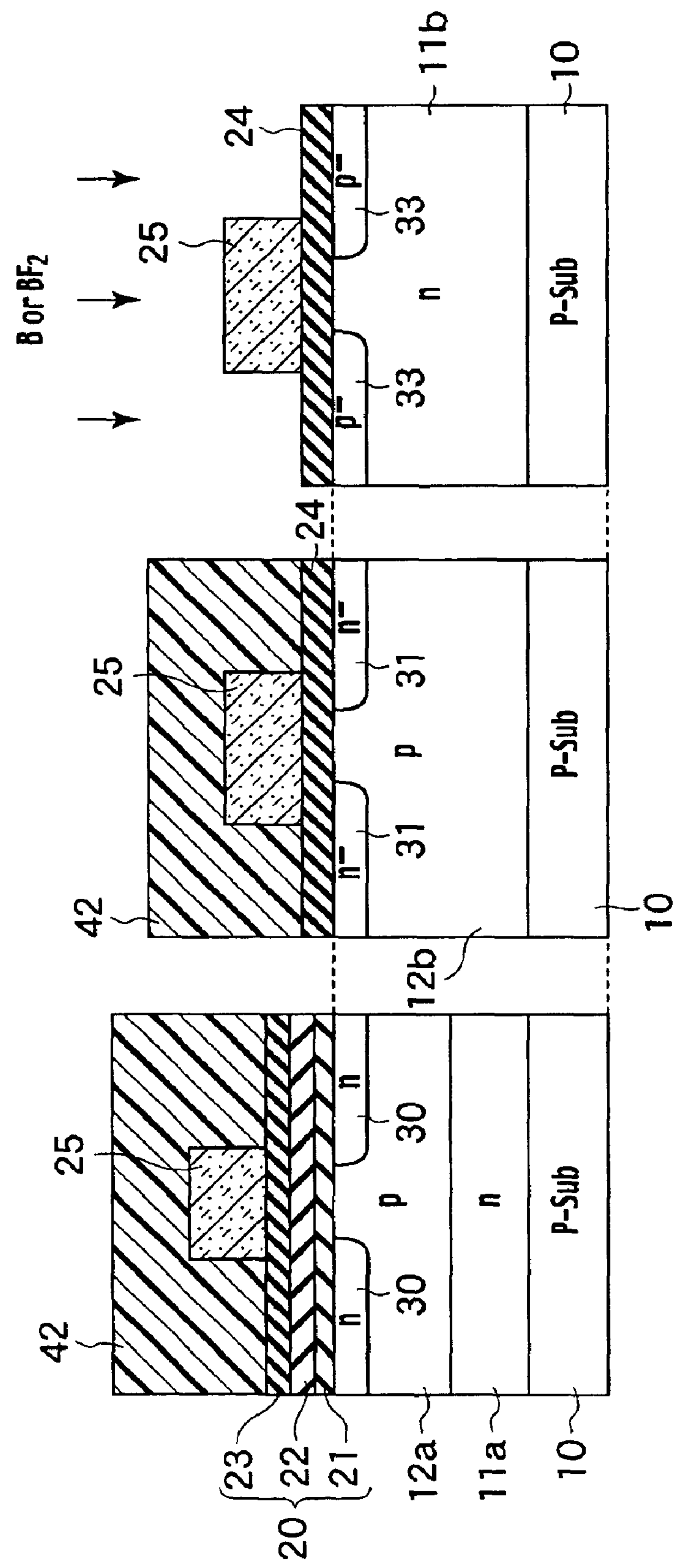
FIG. 6 is a sectional view showing an ion implantation process of a p type diffused layer in the fabrication method of the semiconductor integrated circuit of the first embodiment of the present invention.

(d) As shown in FIG. 6, the cell array region and the nMOSFET region are covered with a resist 42, ions of boron (B) or $BF_2$ are implanted, the gate electrode 25 of the pMOSFET is doped to be a p type gate electrode, and p type source and drain diffused layers 33 of a low concentration are formed.

Figure 7:
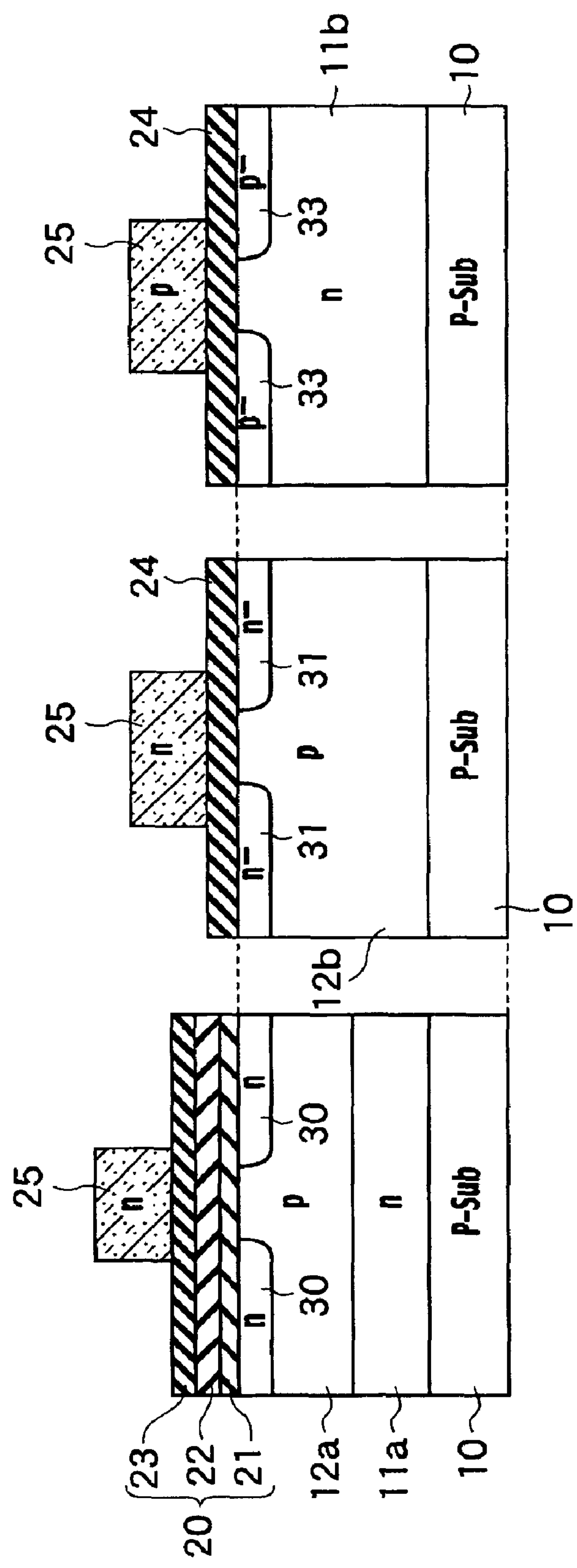
FIG. 7 is a sectional view showing a state after resist removal in the fabrication method of the semiconductor integrated circuit of the first embodiment of the present invention.

(e) The resist 42 is removed to provide the structure of FIG. 7.

Figure 8:
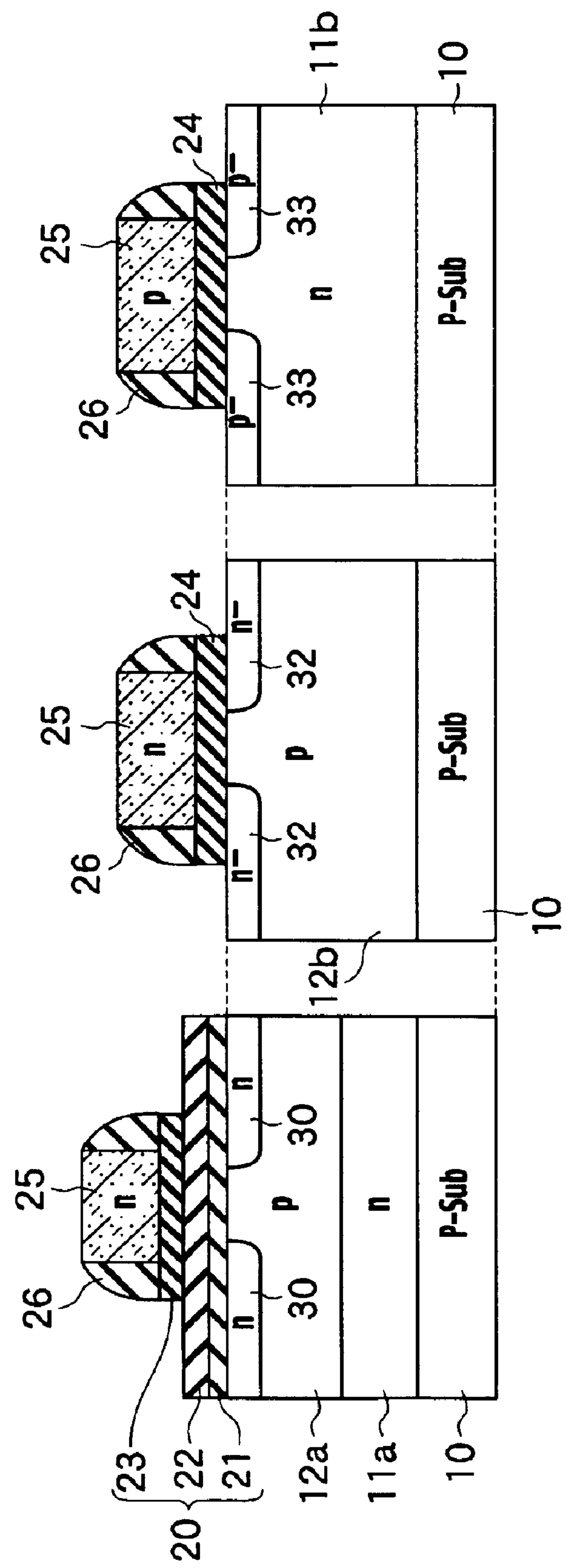
FIG. 8 is a sectional view showing a process of forming a side-wall insulating layer in the fabrication method of the semiconductor integrated circuit of the first embodiment of the present invention.

(f) Subsequently, as shown in FIG. 8, after a silicon oxide layer is deposited to a thickness of 5 to 200 nm, anisotropic etching is carried out to form a side-wall insulating layer 26 on a side surface of each gate electrode 25. At this time, by silicon oxide layer etching, the block insulating layer 23 of the cell array region and the gate insulating layer 24 of the logic circuit region are etched. However, as shown in FIG. 8, at least a silicon nitride layer 22, which is a charge storage layer, remains on the diffused layer 30 of the cell array region.

Figure 9:
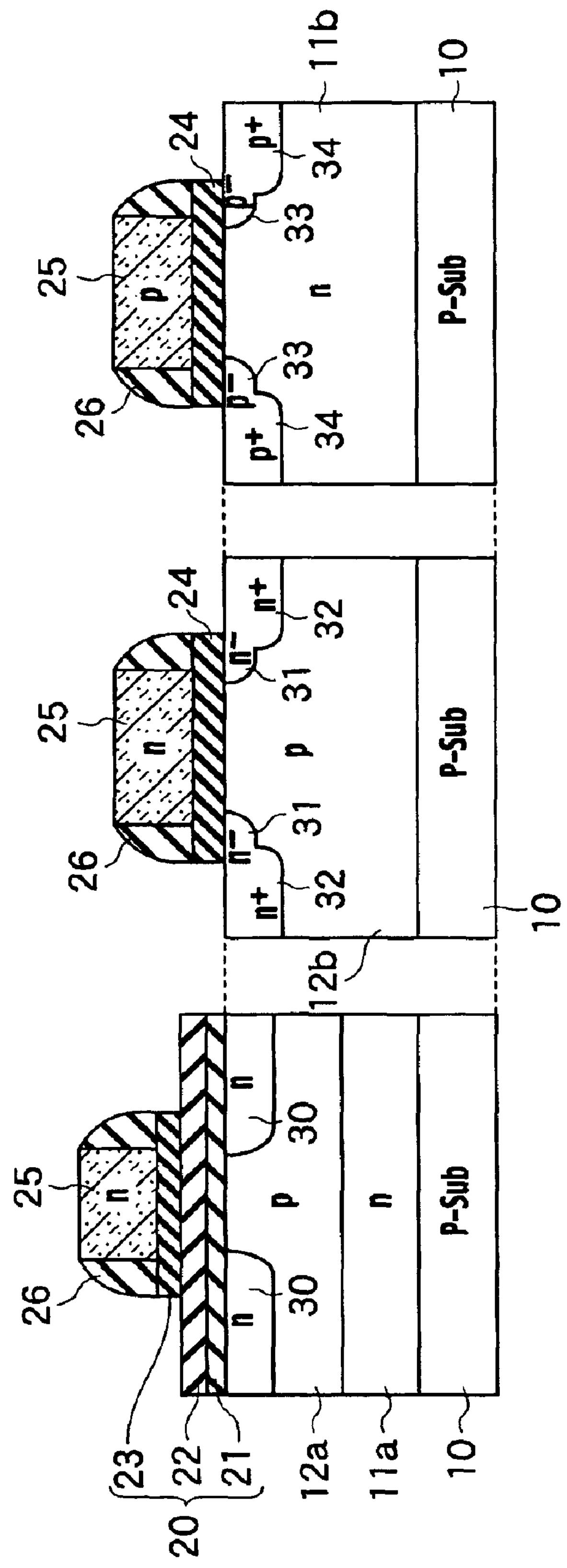
FIG. 9 is a sectional view showing a silicon oxide layer etching process in the fabrication method of the semiconductor integrated circuit of the first embodiment of the present invention.

(g) As shown in FIG. 9, impurity ions are implanted to the pMOSFET and nMOSFET regions of the logic circuit region to form high-concentration $p^+$ type and $n^+$ type source and drain diffused layers 32 and 34. Thus, each of the nMOSFET and the pMOSFET becomes an LDD structure having a shallow and low-concentration layer and a deep and high-concentration layer. The gate electrode 25 is simultaneously doped with higher concentration impurities.

The source and drain diffused layers 30 of the MONOS cell can be provided by forming the side-wall insulating layer 26, and then implanting ions by use of the gate electrode 25 and the side-wall insulating layer 26 as masks.

As a result of the foregoing process, as shown in FIG. 9, the gate electrodes 25 of the MONOS cell, the nMOSFET and the pMOSFET, and the silicon substrates of the diffused layer regions of the nMOSFET and the pMOSFET are exposed, and the diffused layer region of the MONOS cell is covered with the tunneling insulating layer 21 and the silicon nitride layer 22.

Subsequently, after execution of a pretreatment such as hydrofluoric acid etching, a refractory metal such as Ti, Co, Ni or Pd is deposited to a thickness of 1 to 40 nm on the entire surface and then a annealing process of 400 to 1000° C. is applied to form metal silicide layers 27 on the surface of each gate electrode 25 and on the surface of the source and drain diffused layers of the logic circuit region. Unreacted metal is removed by etching with, for example, a sulfuric acid and a peroxide solution. No silicide layers are formed on the diffused layer of the MONOS cell because the silicon nitride layer 22 serves as a salicide block.

When using a memory cell having a floating gate structure for a cell array, the gate structure becomes complex. Typically, therefore, the process of implanting ions to the gate electrode and the process of implanting ions for the formation of the source and drain diffused layers must be carried out separately. On the other hand, in the case of the embodiment which uses the MONOS cell, the signal-layer formation of the gate electrode enables not only simplification of the process but also reduction in the number of steps of the process as a result of simultaneous implantation of impurity ions to the gate electrode and the source and drain diffused layers.

As the gate electrode has a silicide layer, resistance thereof is lowered to enable a high-speed operation. Moreover, as the diffused layers of the pMOSFET and the nMOSFET have low-resistivity silicide layers, an ON-current is increased and ON-resistance is lowered to achieve high speed and high performance of transistor operation. On the other hand, since the diffused layer of the MONOS cell is not silicided, an increase in junction leakage is suppressed to enhance reliability of the memory cell.

Furthermore, according to the embodiment of the present invention, the silicon nitride layer which is a charge storage layer of the MONOS cell is used as a salicide block. Thus, an extra step of selectively forming a silicide layer is unnecessary, and the number of steps in the process can be reduced.

This embodiment is particularly effective for a semiconductor integrated circuit where a CMOS logic circuit and a MONOS cell array are integrated in hybridization on the same semiconductor substrate. Needless to say, however, the embodiment can be applied to a case where the logic circuit is not a CMOS.

(Modified Example of the First Embodiment)

Figure 10:
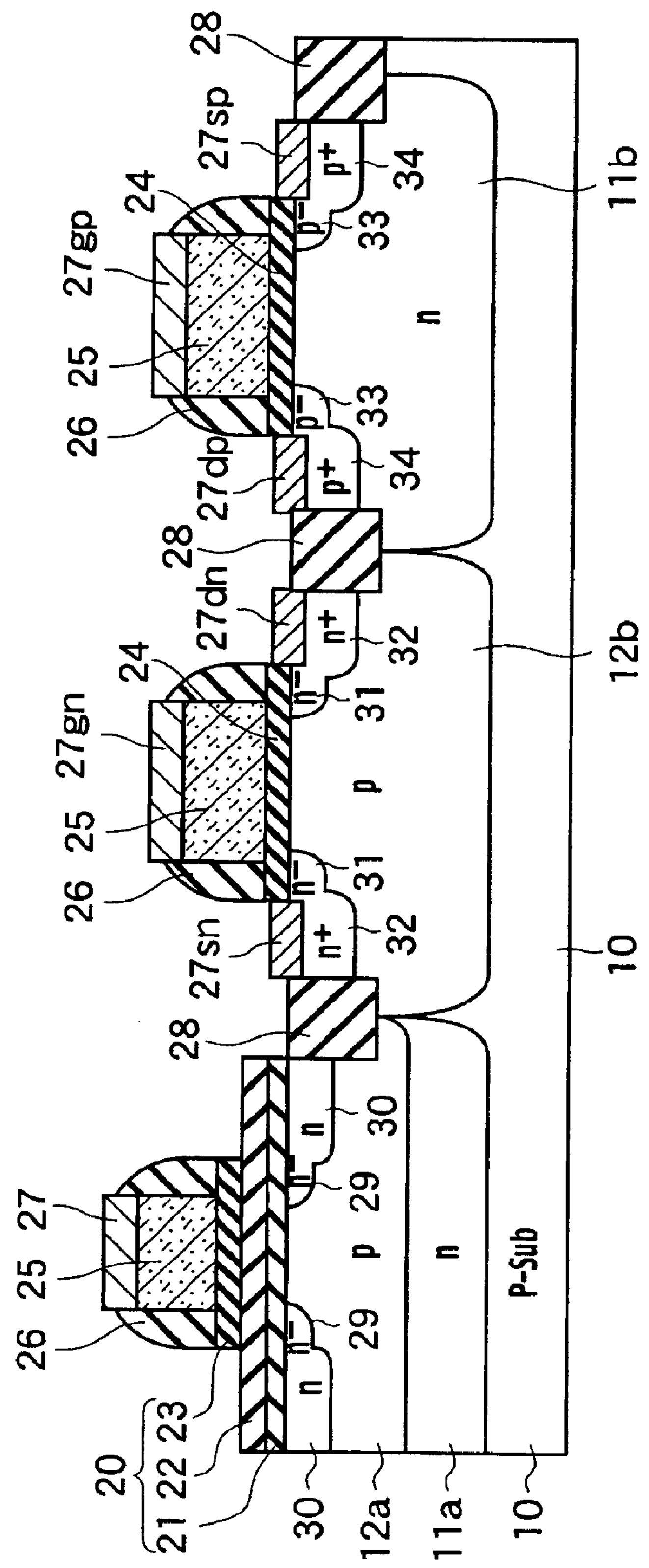
FIG. 10 is a sectional view showing an integrated structure of a CMOS structure constituted of a MONOS memory cell of a LDDMONOS structure, and a CMOS structure formed by a shallow trench isolation (STI) structure in a semiconductor integrated circuit according to a modified example of the first embodiment of the present invention.

In the semiconductor integrated circuit of the first embodiment of the present invention and its fabrication method, the MONOS cell is not formed in a LDD structure. However, the LDD structure can be adopted. As shown in FIG. 10, a semiconductor integrated circuit according to a modified example of the first embodiment of the present invention has an integrated structure of a CMOS structure and an LDDMONOS structure. In the MONOS cell structure, if the LDD structure is adopted, shallow $n^-$ type source and drain diffused layers 29 are formed with respect to n type source and drain diffused layers 30 to provide the LDD structure. Since the adoption of such an LDD structure can reduce an electric field in the vicinity of the source and drain regions of the MONOS memory cell, it is possible to enhance operational reliability of the MONOS memory cell. Moreover, the LDD structure in the MONOS cell has an advantage in that when an LDD structure is provided in an nMOSFET, the LDD structure in the MONOS cell can be formed in the same process as that of the nMOSFET.

(Second Embodiment)

(Element Structure)

Figure 11:
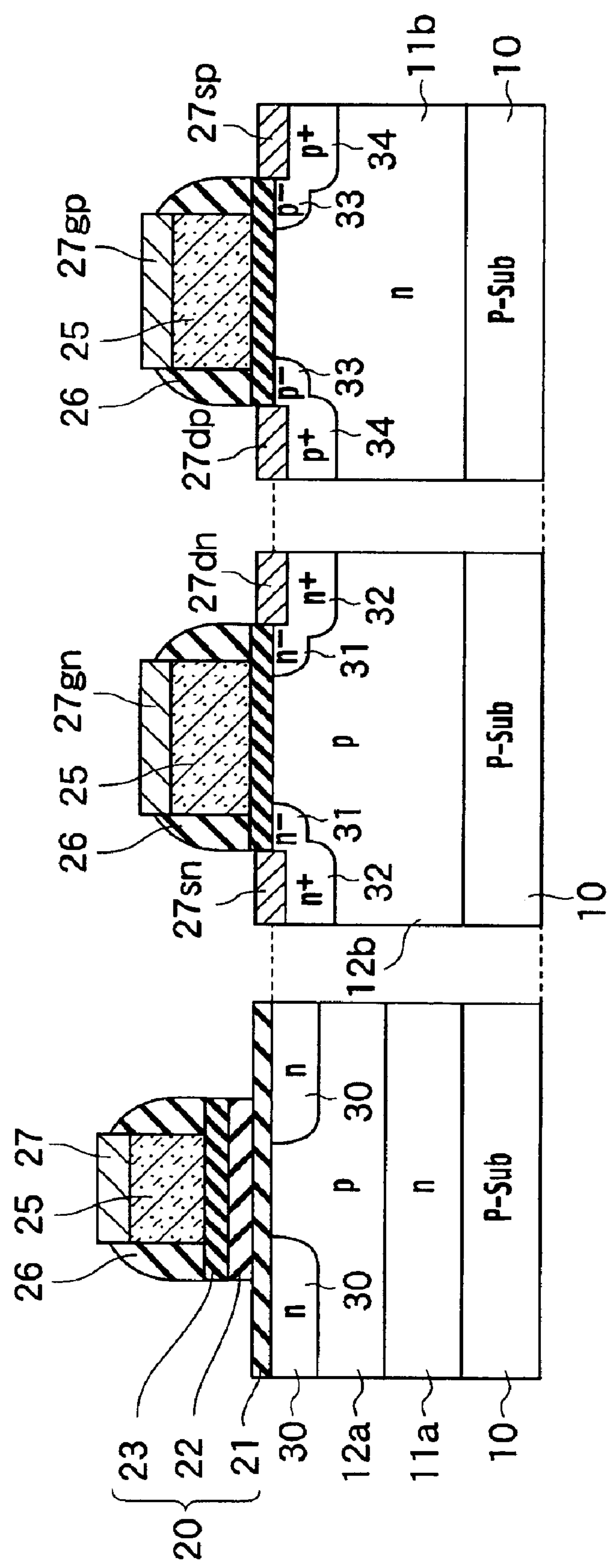
FIG. 11 is a sectional view showing an integrated structure of a MONOS memory cell, an n channel MOS transistor and a p channel MOS transistor in a semiconductor integrated circuit according to a second embodiment of the present invention.

FIG. 11 shows a schematic sectional structure of a semiconductor integrated circuit of a second embodiment of the present invention. Portions corresponding to those of the foregoing embodiment are denoted by similar reference numerals. Different from the previous embodiment of FIG. 1, the silicon nitride layers 22 on the source and drain diffused layers 30 of the MONOS cell are removed, and the source and drain diffused layers are covered with tunneling insulating layers 21, and the gate electrode 25 of the MONOS cell is p type conductive. In a manufacturing process, the source and drain diffused layers 30 of the MONOS cell are formed by carrying out ion implantation through the tunneling insulating layers 21 after forming the silicide layers 27.

(Fabrication Method)

Figure 12:
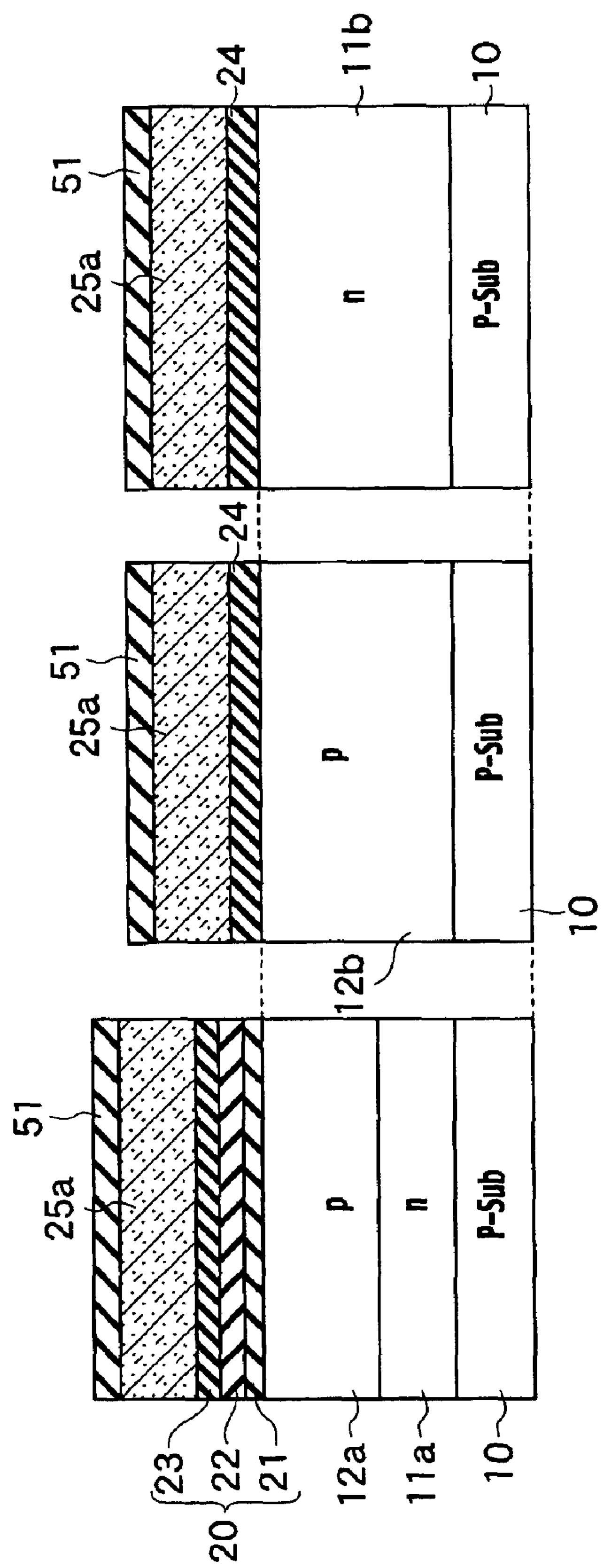
FIG. 12 is a sectional view showing a process from formation of a gate insulating layer to formation of a polysilicon layer and a silicon oxide layer in a fabrication method of the semiconductor integrated circuit of the second embodiment of the present invention.

A fabrication method of the embodiment will be described with reference to FIGS. 12 to 21. In this embodiment, a resist is coated on a p type silicon substrate 10 which contains boron impurities at concentration of $10^{14}$ to $10^{19}$ $cm^{-3}$. As shown in FIG. 12, lithography is carried out, and ions of, for example, phosphorus, arsenic, stibium or the like are implanted, for example, at an acceleration energy of 30 to 100 keV and with a dos amount of $1\times10^{11}$ to $1\times10^{15}$ $cm^{-2}$ to form n type wells 11*a* and 11*b*. Boron is implanted to the cell array region and the nMOS region, for example, at an acceleration energy of 100 to 1000 keV and with a dose amount of $1\times10^{11}$ to $1\times10^{15}$ $cm^{-2}$ to form p type well regions 12*a* and 12*b*.

Further, after the resist coating, lithography is carried out, and impurities of boron, indium or the like are implanted to the cell array region and the nMOSFET region as channel ions with a dose amount of $1\times10^{11}$ to $1\times10^{14}$ $cm^{-2}$. Similarly, after the resist coating, lithography is carried out, and impurities of phosphorus, arsenic or the like are implanted to the pMOSFET region as channel ions with a dose amount of $1\times10^{11}$ to $1\times10^{14}$ $cm^{-2}$.

Subsequently, a silicon oxide layer or an oxynitride layer is formed having a thickness of 0.5 to 10 nm to be a tunneling insulating layer 21 of the MONOS cell on the silicon substrate 10. Then, a silicon nitride layer 22 is formed having a thickness of 3 to 50 nm, and a block insulating layer 23 made of a silicon oxide layer or an oxynitride layer is formed having a thickness of 3 to 30 nm thereon. Thus, an ONO layer is formed to provide a gate insulating layer 20 of the MONOS cell. Subsequently, the cell array region is covered with a resist, and the ONO layers on the nMOSFET and pMOSFET regions are selectively removed. Then, the resist is removed, and a silicon oxide layer or an oxynitride layer is formed having a thickness of 0.5 to 40 nm as a gate insulting layer 24 of each of the nMOSFET and the pMOSFET. In this case, the gate insulating layers may be designed equal in thickness in all the nMOSFET and the pMOSFET regions, or different kinds of gate insulating layers may be prepared.

Then, a polysilicon layer (or amorphous silicon layer) 25*a* is deposited having a thickness of 10 to 500 nm on the entire surface, and a silicon oxide layer 51 is formed having a thickness of 1 to 20 nm thereon to provide a shape of FIG. 12. Though not shown, before or after the formation of the gate insulating layer 20, an element isolation region made of, for example, a silicon oxide layer is formed to a depth of 0.05 to 0.5 $\mu$m in the silicon substrate 10.

Figure 13:
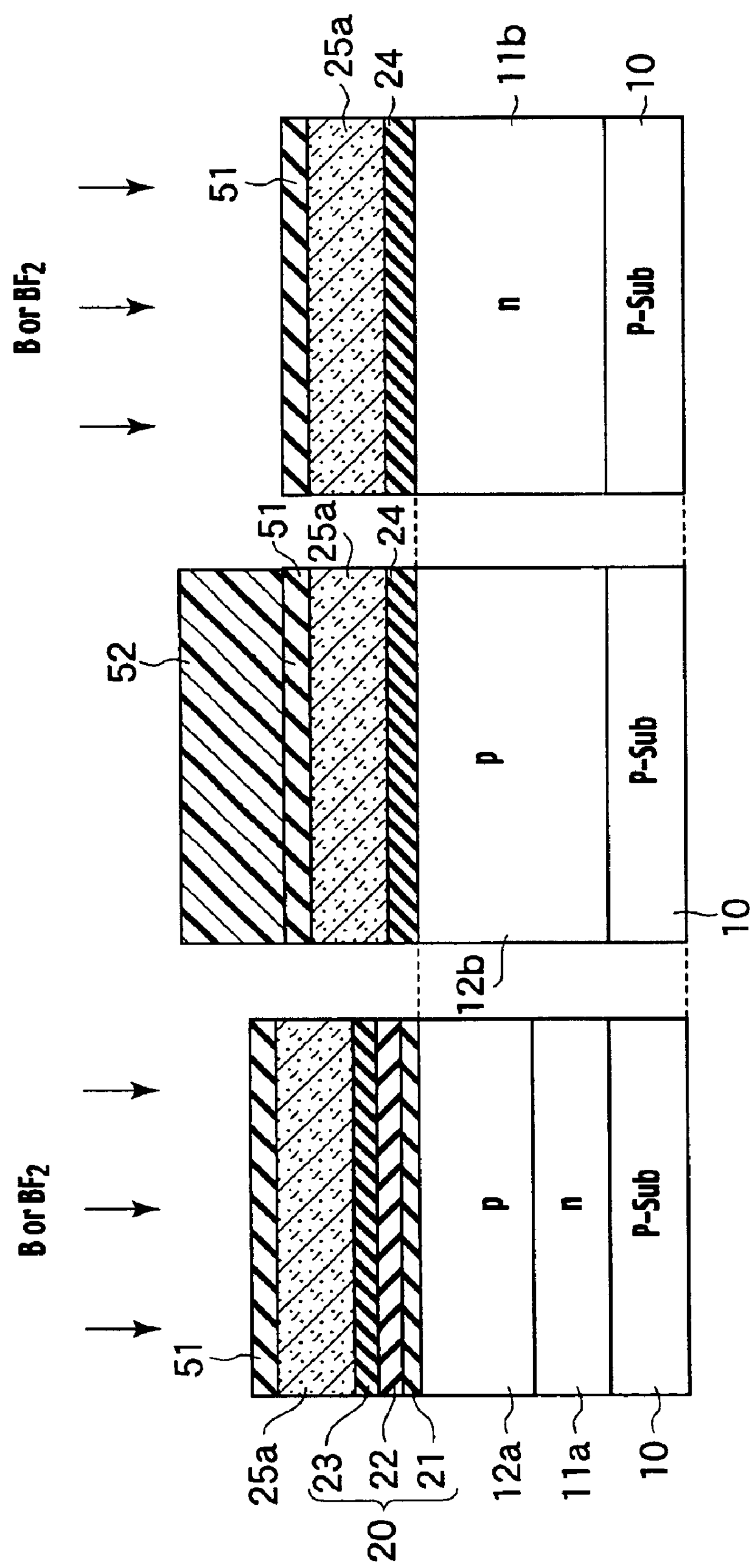
FIG. 13 is a sectional view of an ion implantation process of a gate polysilicon layer of a MONOS memory cell array and of a p channel MOSFET region in the fabrication method of the semiconductor integrated circuit of the second embodiment of the present invention.
Figure 14:
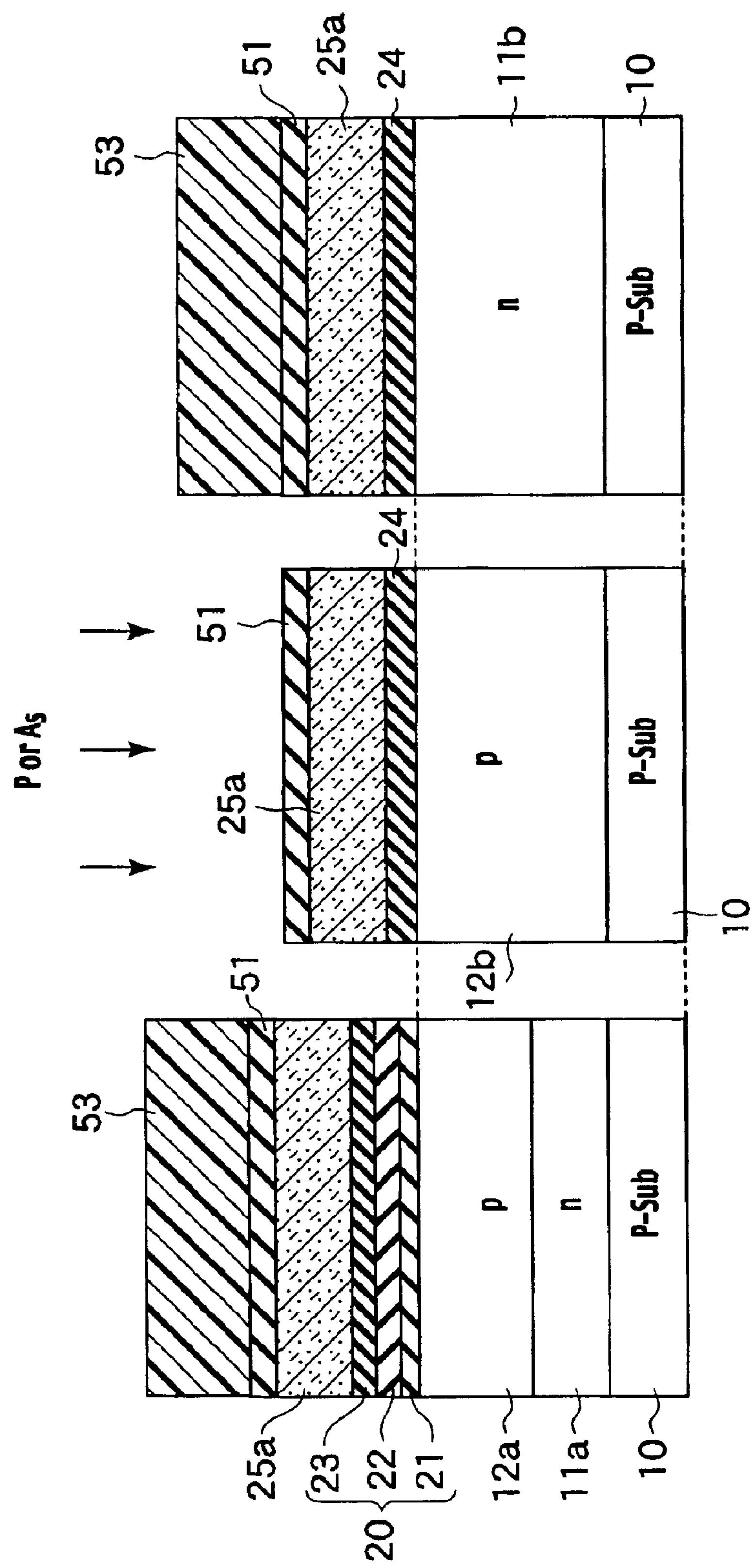
FIG. 14 is a sectional view showing an ion implantation process of a gate polysilicon layer of an n channel MOSFET region in the fabrication method of the semiconductor integrated circuit of the second embodiment of the present invention.
Figure 15:
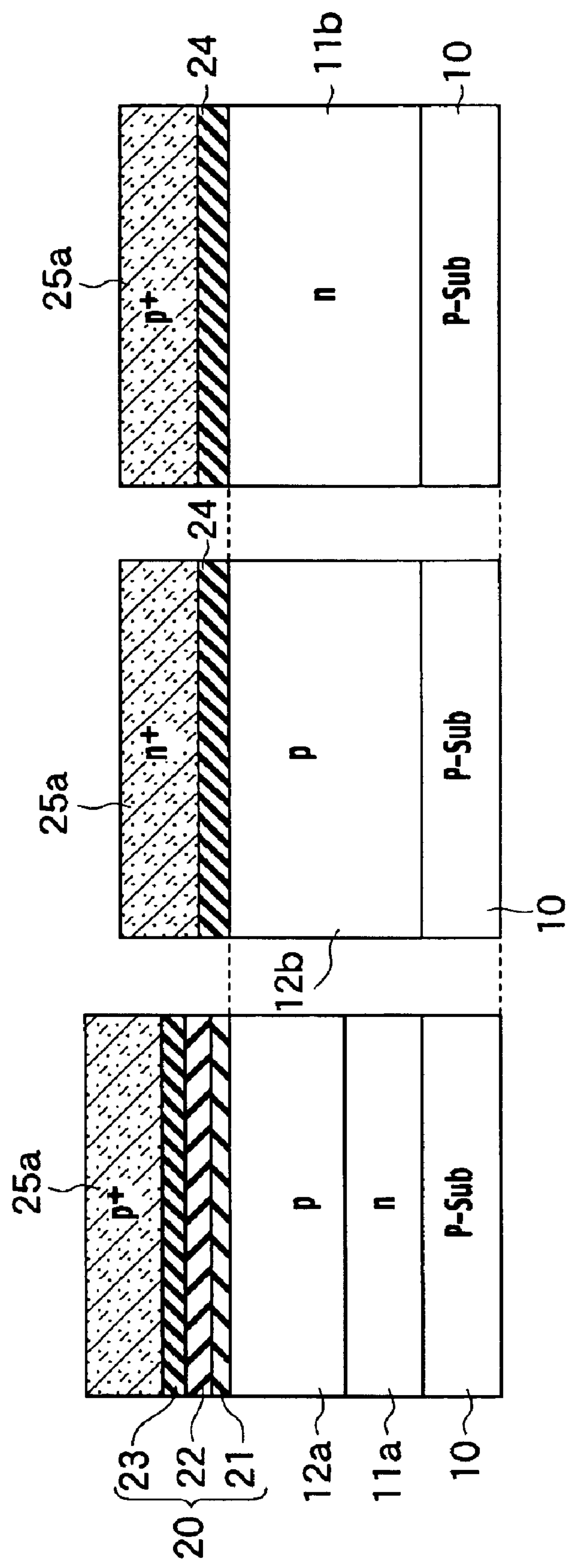
FIG. 15 is a sectional view showing a conductive distribution of the gate polysilicon layer in the fabrication method of the semiconductor integrated circuit of the second embodiment of the present invention.
Figure 16:
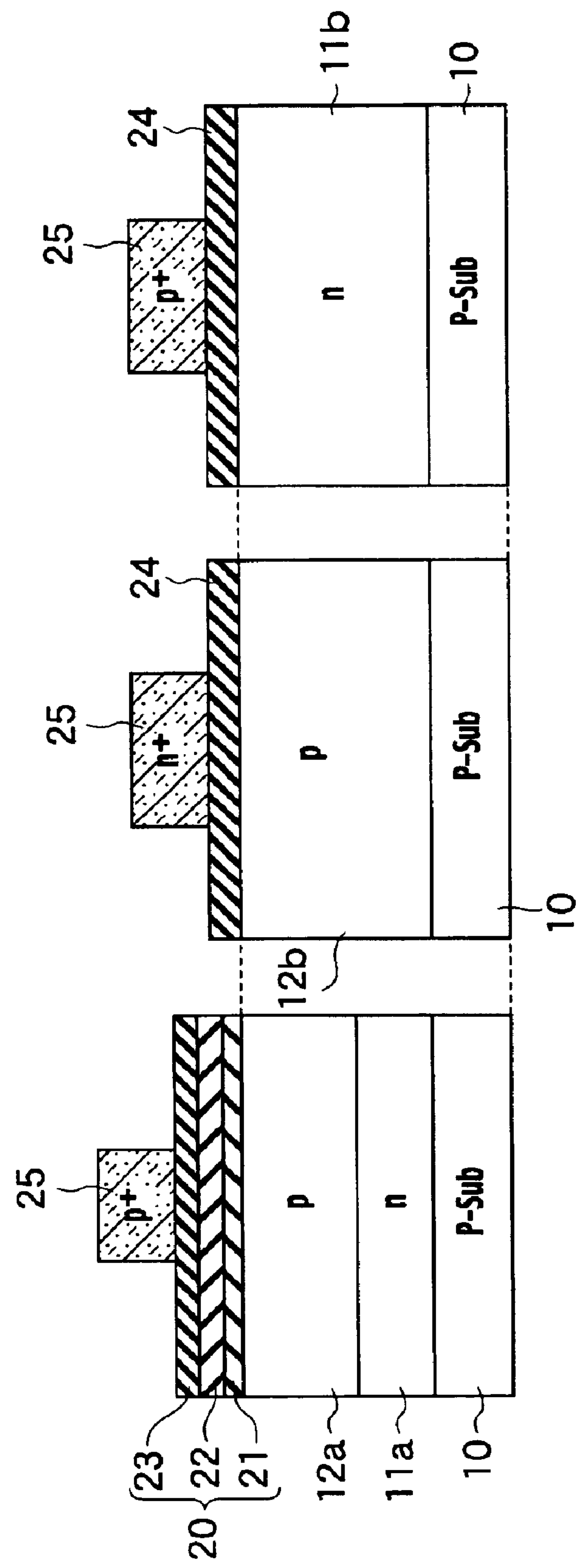
FIG. 16 is a sectional view showing a gate electrode patterning process in the fabrication method of the semiconductor integrated circuit of the second embodiment of the present invention.

As shown in FIG. 13, after the resist coating, lithography is carried out to cover the nMOSFET region with a resist mask 52, and impurity ions are implanted so that the gate polysilicon layer 25*a* of each of the MONOS cell and the pMOSFET will be a p type gate layer. Subsequently, as shown in FIG. 14, the cell array region and the pMOSFET region are covered with a resist mask 53, and impurity ions are implanted to dope the gate polysilicon layer 25*a* of the nMOSFET region so as to provide an n type gate layer. Then, the resist is removed, and the silicon oxide layer 51 is etched and removed, whereby the shape of FIG. 15 is obtained.

Figure 17:
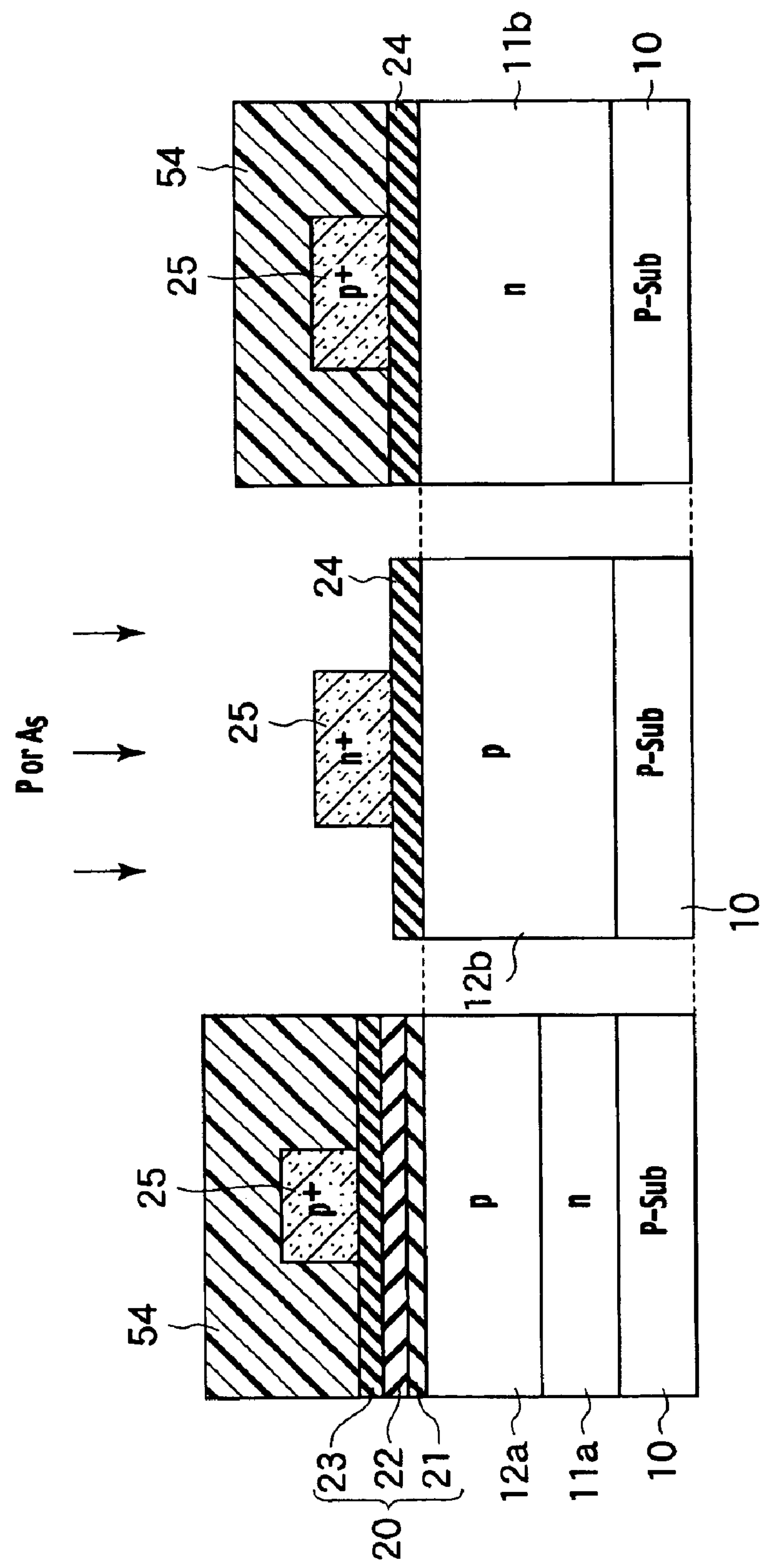
FIG. 17 is a sectional view showing an ion implantation process of an n type diffused layer of the n channel MOSFET region in the fabrication method of the semiconductor integrated circuit of the second embodiment of the present invention.

The gate electrode 25*a* of each element region is patterned by lithography and anisotropic etching. The etching is stopped by the block insulting layer 23 of the MONOS cell and the gate insulating layer 24 of the MOSFET to provide the shape of FIG. 16. Further, as shown in FIG. 17, in a state where the pMOSFET and MONOS cell regions are covered with a resist 54, impurities of phosphorus or arsenic ions are implanted to the nMOSFET region to form n type source and drain diffused layers 31.

Figure 18:
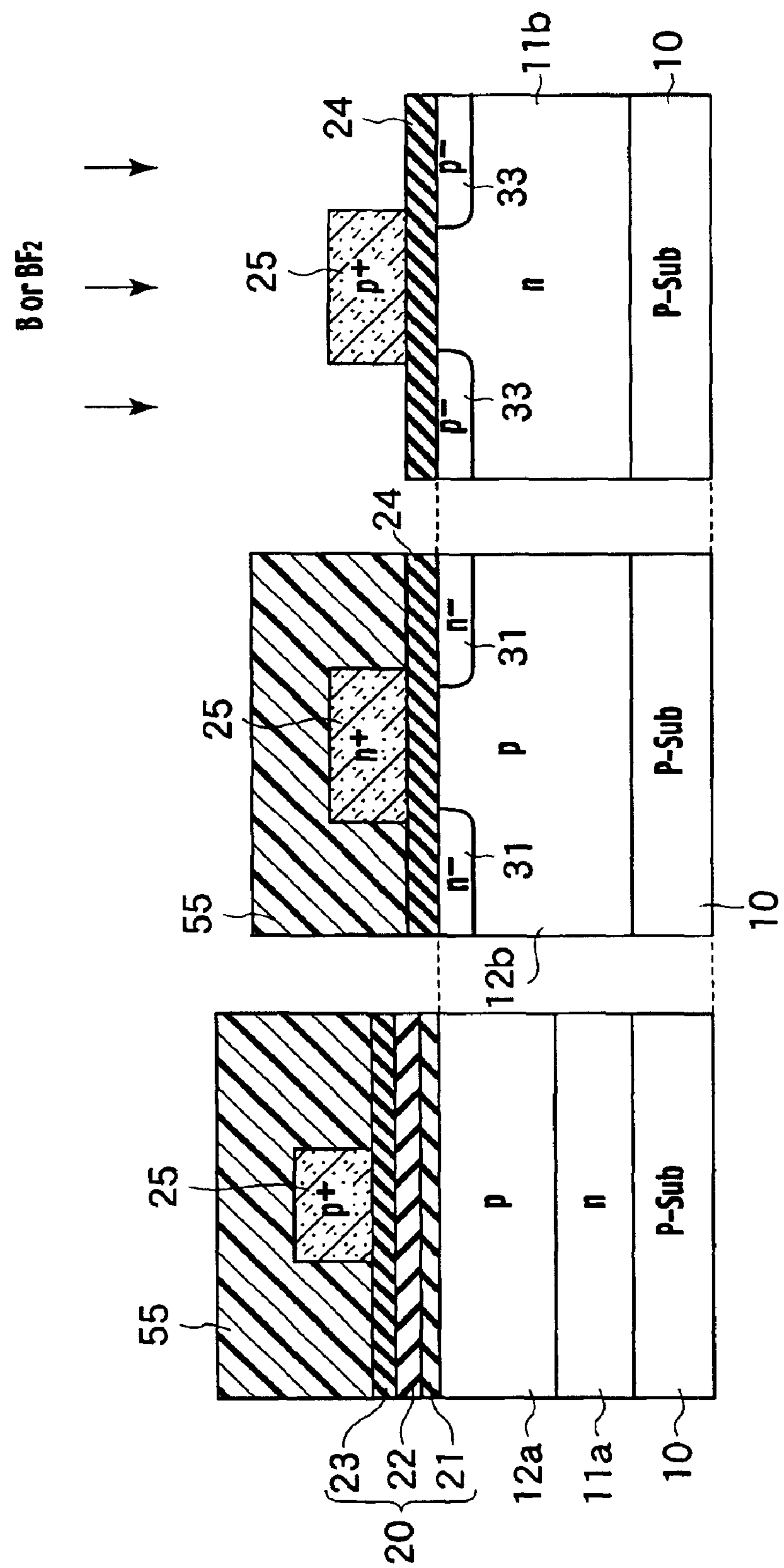
FIG. 18 is a sectional view showing an ion implantation process of a p type diffused layer of the p channel MOSFET region in the fabrication method of the semiconductor integrated circuit of the second embodiment of the present invention.
Figure 19:
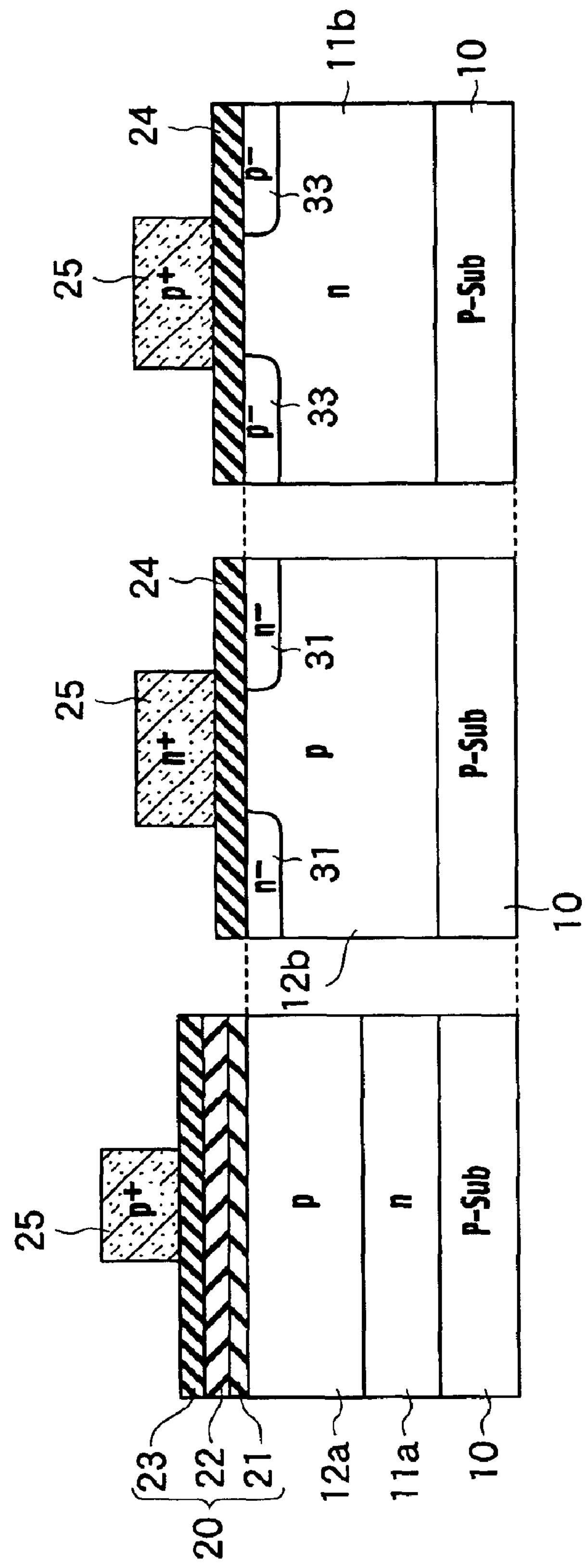
FIG. 19 is a sectional view showing a state after resist removal in the fabrication method of the semiconductor integrated circuit of the second embodiment of the present invention.

Similarly, as shown in FIG. 18, the MONOS cell and nMOSFET regions are covered with a resist 55, and impurities of boron or BF2 are implanted to the pMOSFET region to form p type source and drain diffused layers 33. Impurities are implanted to the nMOSFET to form p type source and drain diffused layers 33. The impurity implantation to the nMOSFET and the pMOSFET may be carried out a plurality of times depending on the types of transistors. Through the aforementioned process, as shown in FIG. 19, the source and drain diffused layers 31 and 33 of the nMOSFET and the pMOSFET are formed.

Figure 20:
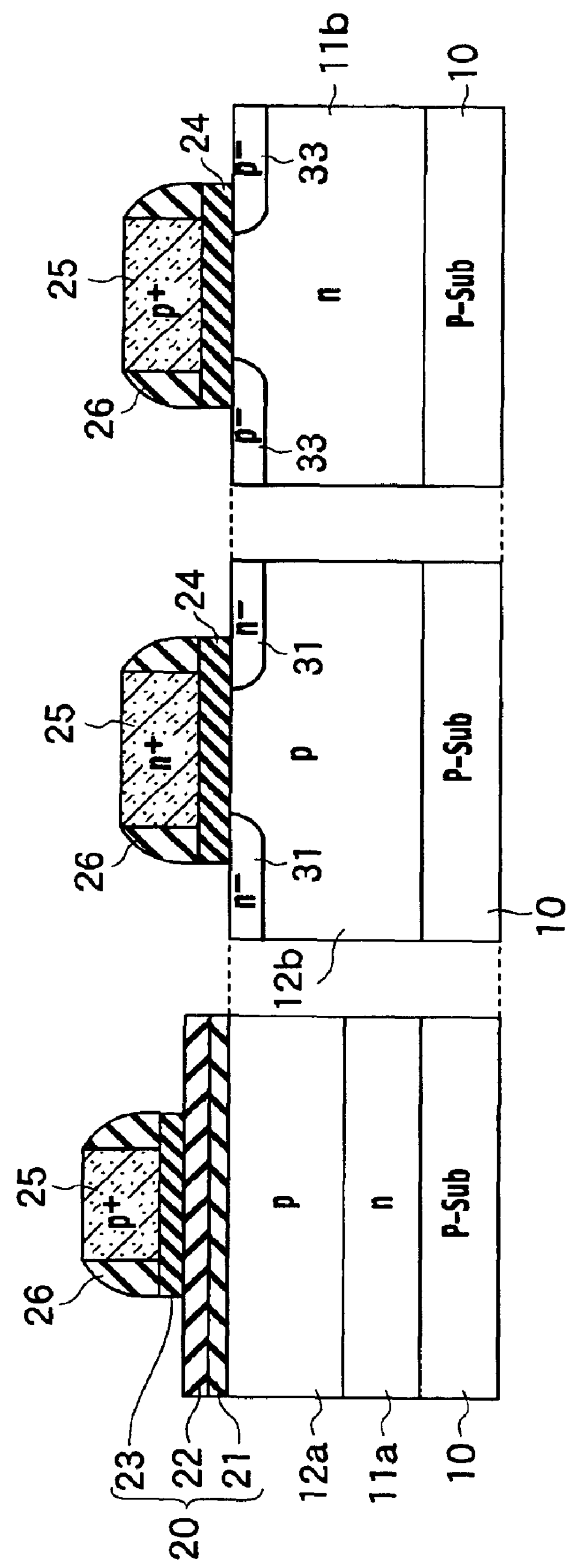
FIG. 20 is a sectional view showing a process of forming a side-wall insulating layer in the fabrication method of the semiconductor integrated circuit of the second embodiment of the present invention.

Subsequently, as shown in FIG. 20, after a silicon oxide layer 26 is deposited having a thickness of 5 to 200 nm, anisotropic etching is carried out to form a side-wall insulating layer 26. At this time, at least a silicon nitride layer 22, which is a charge storage layer, remains on the diffused layer 30 of the MONOS region.

Figure 21:
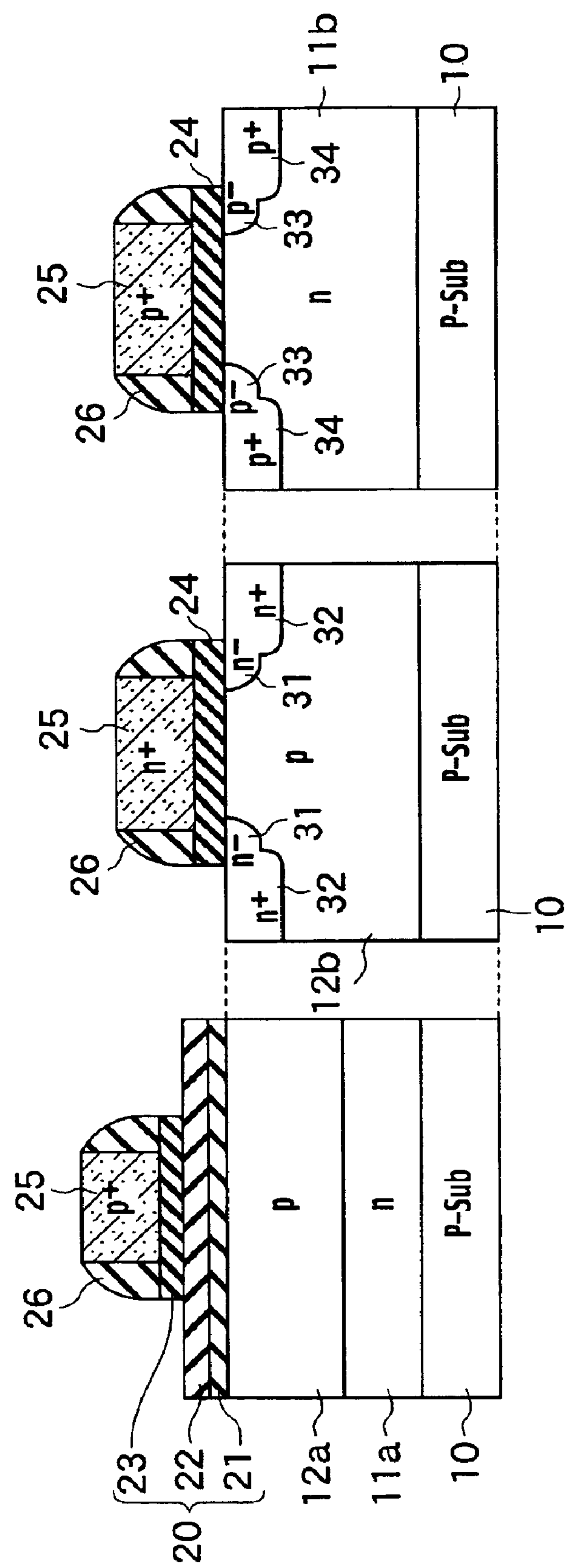
FIG. 21 is a sectional view showing a silicon oxide layer etching process in the fabrication method of the semiconductor integrated circuit of the second embodiment of the present invention.

By a method similar to that described above for implanting the impurities to the diffused layers, as shown in FIG. 21, impurity ions are implanted to the nMOSFET and pMOSFET regions to form high concentration deep n type source and drain diffused layers 32 and high concentration deep p type source and drain diffused layers 34. In the same process, impurities are simultaneously implanted to the gate electrode to provide an LDD structure. As a result of the foregoing process, the gate electrodes 25 of the MONOS cell, the nMOSFET and the pMOSFET, and the silicon substrate of the diffused layer region of the nMOSFET and the pMOSFET are exposed, and the silicon substrate of the diffused layer regions of the MONOS cell is covered with the tunneling insulating layer 21 and the silicon nitride layer 22.

Figure 22:
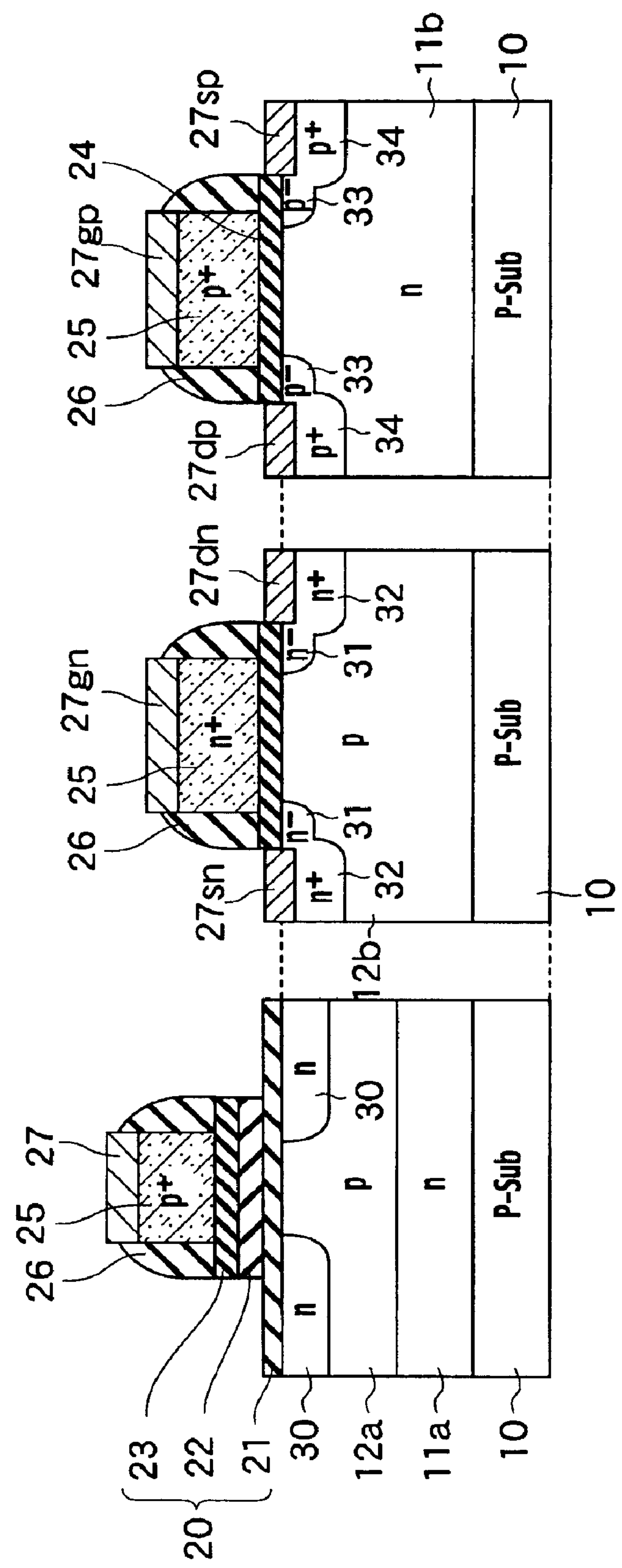
FIG. 22 is a sectional view showing a silicide layer forming process in the fabrication method of the semiconductor integrated circuit of the second embodiment of the present invention.

Subsequently, after execution of a pretreatment such as hydrofluoric acid etching, a metal such as Ti, Co, Ni or Pd for forming a silicide is deposited having a thickness of 1 to 40 nm on the entire surface and, as shown in FIG. 22, a annealing process of 400 to 1000° C. is applied to form metal silicide layers 27 on the source and drain diffused layers and the gate electrode. Unreacted and unnecessary metal is removed by etching with, for example, a sulfuric acid and a peroxide solution, to provide a silicide structure. No silicide layers are formed in the source and drain regions of the MONOS cell because the silicon nitride layer serves as a salicide block.

As shown in FIG. 22, the silicon nitride layer 22 remaining above the diffused layer formation region of the MONOS cell is removed by anisotropic etching. At this time, the pMOSFET and nMOSFET regions are covered with an insulating layer such as a silicon oxide layer or a resist to prevent etching of the silicide layer 27. Further, where the pMOSFET and nMOSFET regions are covered with an insulating layer such as a silicon oxide layer and a resist, impurity ions of phosphorus or arsenic are implanted through the tunneling oxide layer 21 to the MONOS cell region to form n type source and drain diffused layers 30 of a memory cell.

This embodiment provides the following advantages in addition to those of the previous embodiment. Since the gate electrode 25 of the MONOS cell is formed as a p type, an erasing operation can be performed at a high speed. Moreover, since the diffused layer impurity ion implantation to the MONOS cell is carried out through the thin tunneling oxide layer 21, ion implantation is possible at low energy. Since the side-wall insulating layer 26 is formed during the implantation process, overlapping between the diffused layer 30 and the gate electrode 25 can be reduced. Thus, it is possible to prevent a reduction in performance of the memory cell transistor due to a short channel property.

In the second embodiment, the gate electrode 25 of the MONOS cell may be doped as an n type. In the first embodiment, the gate electrode 25 of the MONOS cell may be doped as a p type.

(Third Embodiment)

(Element Structure)

Figure 23:
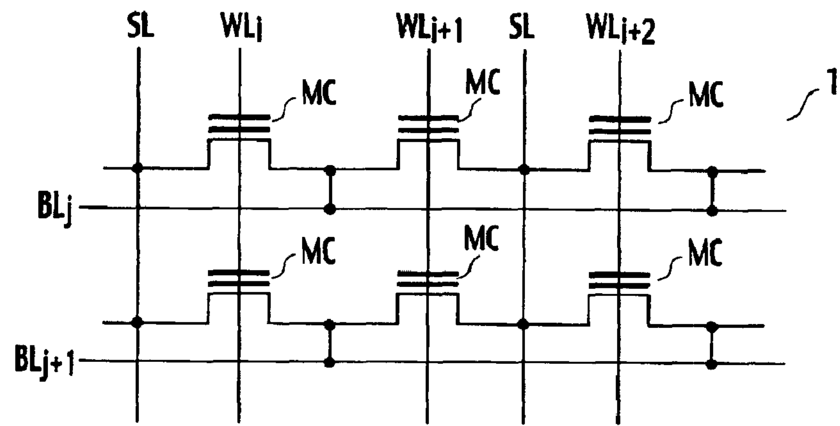
FIG. 23 is an equivalent circuit diagram of a MONOS memory cell array in a semiconductor integrated circuit according to a third embodiment of the present invention.

A semiconductor integrated circuit according to a third embodiment of the present invention is equivalent to an embodiment applied to a NOR type EEPROM, as shown in FIG. 23, which shows an equivalent circuit of a cell array 1 where a MONOS cell MC is connected to a NOR type. One of either the source and drain diffused layers of the MONOS cell is connected to bit lines BL, BLj and BLj+1, the other is connected to a common source line SL, and a gate electrode is connected to word lines WL, WLi, WLi+1 and WLi+2.

Figure 24:
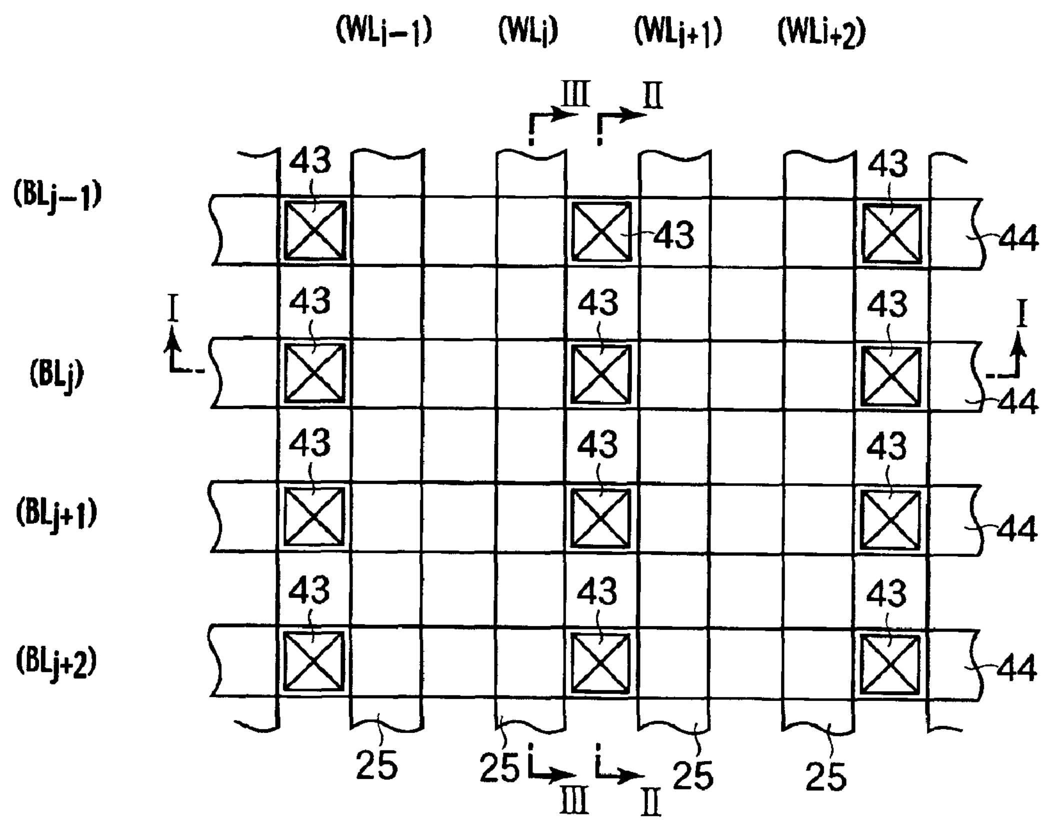
FIG. 24 is a plan view of the MONOS memory cell array in the semiconductor integrated circuit of the third embodiment of the present invention.
Figure 25:
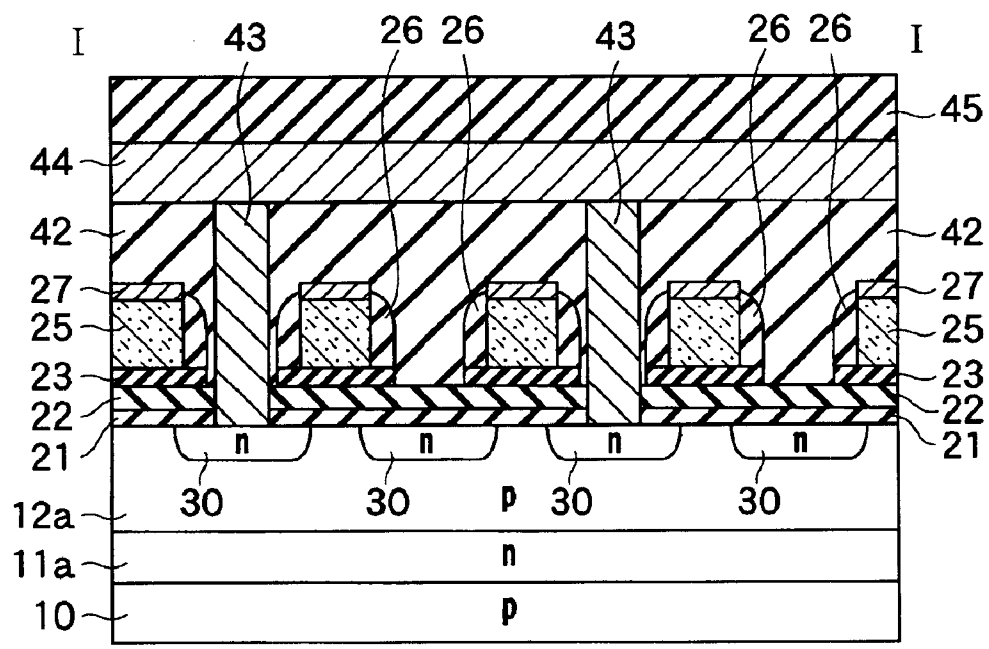
FIG. 25 is a sectional view cut along the line I—I of FIG. 24.
Figure 26:
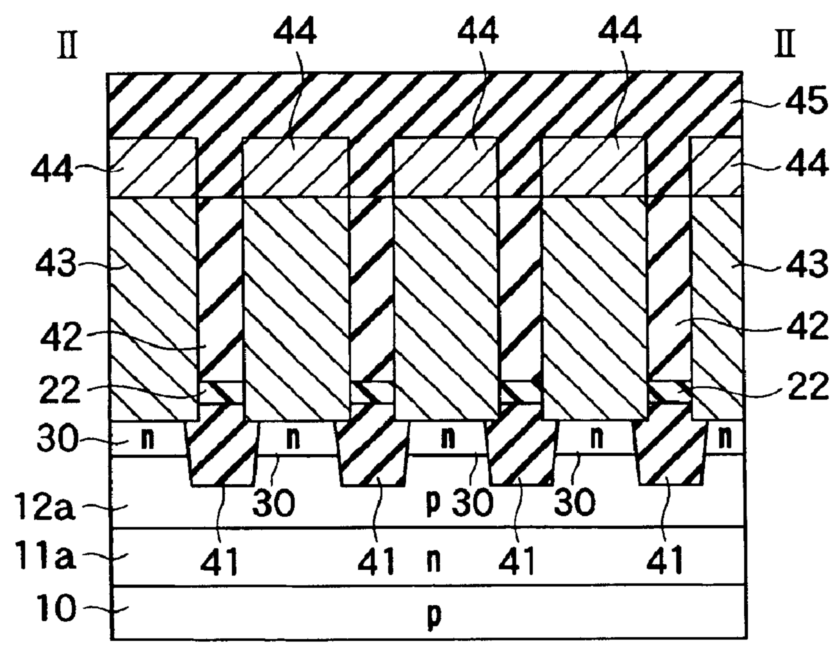
FIG. 26 is a sectional view cut along the line II—II of FIG. 24.
Figure 27:
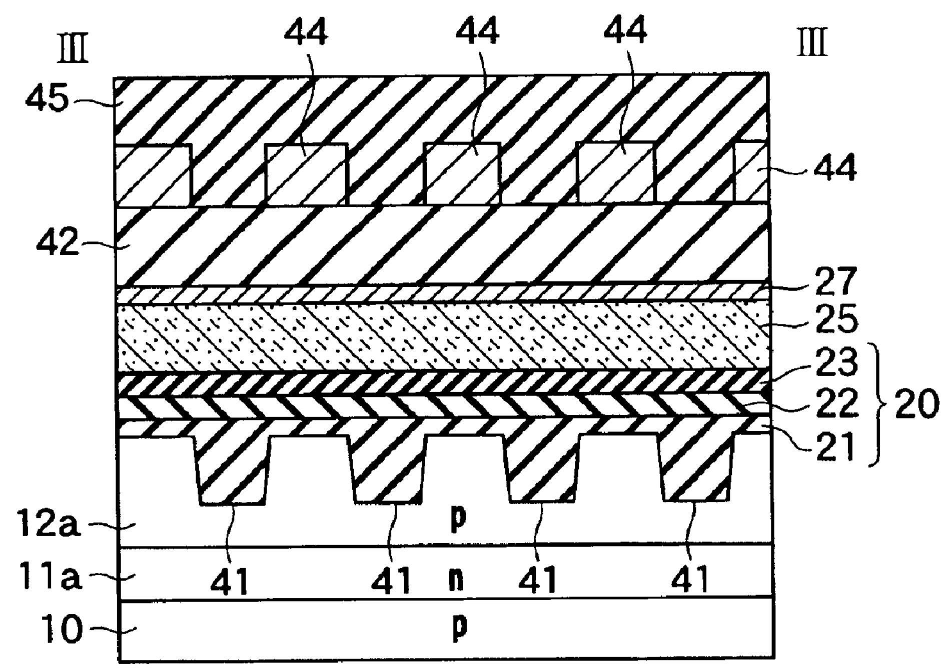
FIG. 27 is a sectional view cut along the line III—III of FIG. 24.

FIG. 24 is a plan view of the NOR type cell array 1, and I—I, II—II and III—III sections of FIG. 24 are respectively shown in FIGS. 25, 26 and 27. Portions corresponding to those of the foregoing embodiments are denoted by similar reference numerals. The gate electrodes 25 of the MONOS cell are continuously patterned in one direction to be word lines WL, WLi−1, WL1, WLi+1 and WLi+2. A substrate surface on which the MONOS cell is formed is covered with an inter-layer insulating layer 42, and bit lines BLj−1, BLj, BLj+1, and BLj+2 (44) are formed thereon. The bit line 44 is connected through a contact plug 43 buried in the inter-layer insulating layer 42 to one side diffused layer of the cell. The other side diffused layer is continuously formed to constitute a common source line SL.

As shown in FIGS. 25 and 26, a contact of the bit line (BL) employs a self-alignment structure which has no lithography alignment margins with respect to an element isolation region, and thus chip area can be reduced. A silicon nitride layer 22 which is a charge insulating layer of the MONOS cell is arranged above the element isolation region to function as an etching stopper for preventing the bit line contact connecting to and falling on the element isolation region.

The width of the silicon nitride layer 22 formed above the element isolation insulating layer 41 is self-aligned to the contact plug 43. The silicon nitride layer 22 formed above the element isolation insulating layer 41 and the silicon nitride layer 22 formed on the tunneling insulating layer 21 in the MONOS cell area are substantially formed by the same material having the same layer thickness.

An nMOSFET or a pMOSFET constituting a logic circuit is similar to that of each of the foregoing embodiments, and thus is not shown.

(Fabrication Method)

A specific fabrication method for obtaining such a cell array will be described by focusing attention on the I—I and II—II sections of FIG. 24. The fabrication method of the embodiment will be described with reference to FIGS. 28 to 41.

Figure 28:
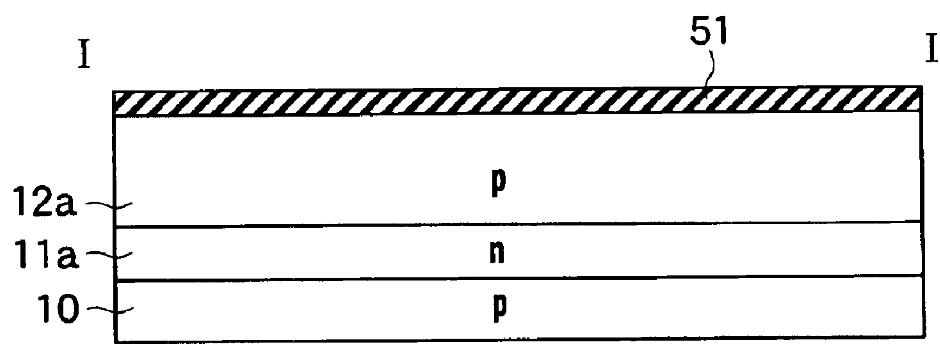
FIG. 28 is a sectional view cut along the line I—I, showing a process of forming a sacrificial oxide layer and an element isolation oxide layer in a fabrication method of the semiconductor integrated circuit of the third embodiment of the present invention.
Figure 29:
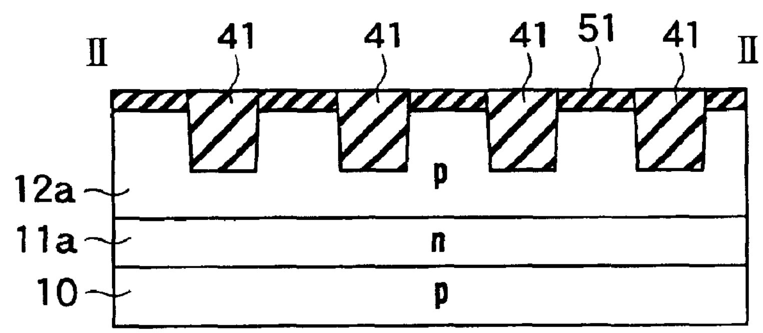
FIG. 29 is a sectional view cut along the line II—II of the same process in the fabrication method of the semiconductor integrated circuit of the third embodiment of the present invention.

(a) As shown in FIGS. 28 and 29, previously, a sacrificial oxide layer 51 is formed having a thickness of about 10 nm on a p type silicon substrate 10 which contains boron impurities at a concentration of $10^{14}$ to $10^{19}$ $cm^{-3}$. A trench is formed having a depth of 0.05 to 0.5 $\mu$m in an element isolation region, and an element isolation insulating layer 41 made of a silicon oxide layer is buried. Then, by a method similar to that of each of the foregoing embodiments, impurity ion implantation is carried out to form a necessary well and to adjust a threshold value.

Subsequently, a silicon oxide layer or an oxynitride layer, which will be a tunneling insulating layer 21 of the MONOS cell, is formed having a thickness of 0.5 to 10 nm on the substrate 10. Then, a silicon nitride layer 22 is formed having a thickness of 3 to 50 nm, and a block insulating layer 23 made of a silicon oxide layer or an oxynitride layer is formed having a thickness of 3 to 30 nm thereon. Thus, an ONO layer is formed, which will be a gate insulating layer 20 of a MONOS cell. Subsequently, though not shown, the cell array region is covered with a resist, and the ONO layer 20 on the MOSFET region is selectively removed. Then, the resist is removed, and a silicon oxide layer or an oxynitride layer, which will be a gate insulting layer 24 of the MOS transistor, is formed having a thickness of 0.5 to 40 nm.

Figure 30:
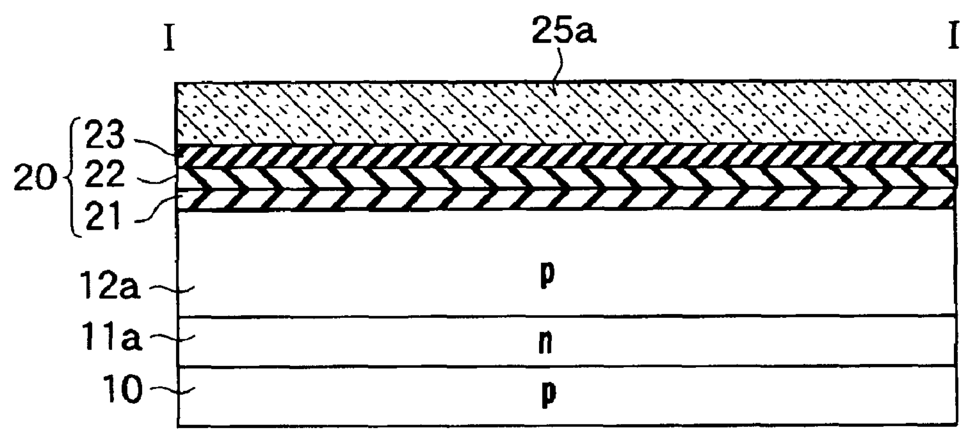
FIG. 30 is a sectional view cut along the line I—I, showing a process from gate insulating layer formation to polysilicon layer deposition in the fabrication method of the semiconductor integrated circuit of the third embodiment of the present invention.
Figure 31:
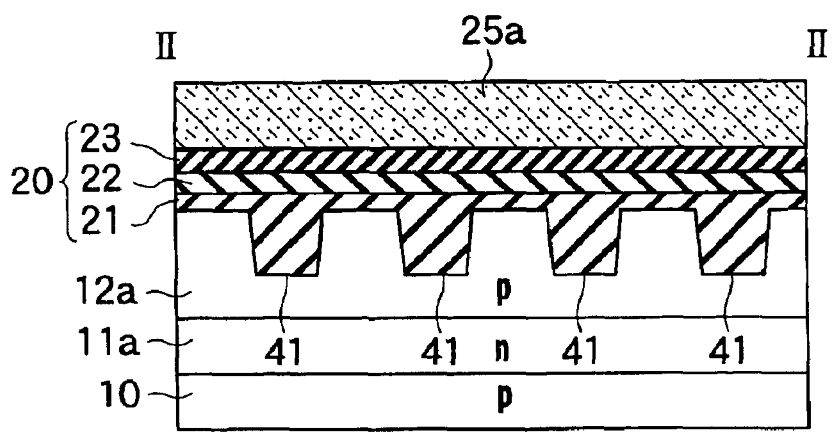
FIG. 31 is a sectional view cut along the line II—II of the same process in the fabrication method of the semiconductor integrated circuit of the third embodiment of the present invention.

(b) A layer (or amorphous silicon layer) 25*a* is deposited having a thickness of 10 to 500 nm on the entire surface to provide a shape shown in FIGS. 30 and 31.

Figure 32:
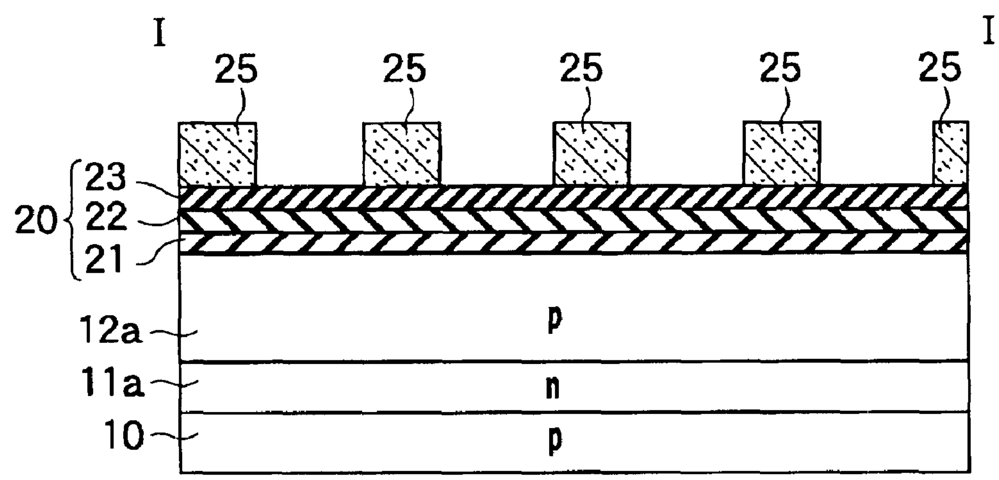
FIG. 32 is a sectional view cut along the line I—I, showing a gate electrode patterning process in the fabrication method of the semiconductor integrated circuit of the third embodiment of the present invention.
Figure 33:
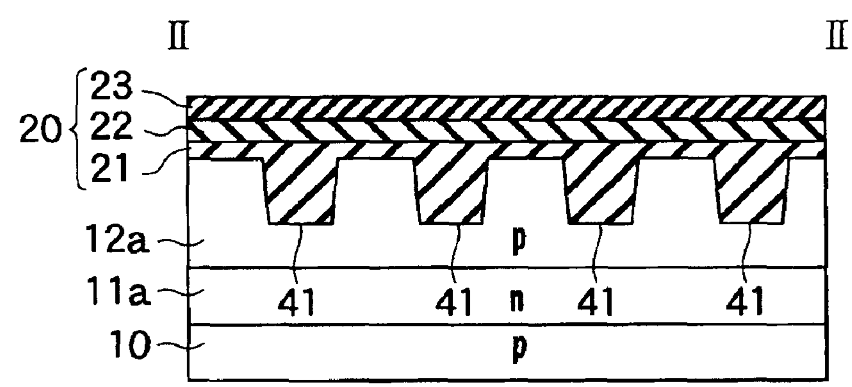
FIG. 33 is a sectional view cut along the line II—II of the same process in the fabrication method of the semiconductor integrated circuit of the third embodiment of the present invention.

(c) As shown in FIGS. 32 and 33, by lithography and anisotropic etching of the polysilicon layer, the electrode 25 is processed. At this time, the etching is stopped at the silicon oxide layer which is the block insulating layer 23. As a result, the silicon nitride layer 22 remains in a region where a bit line contact is formed.

Figure 34:
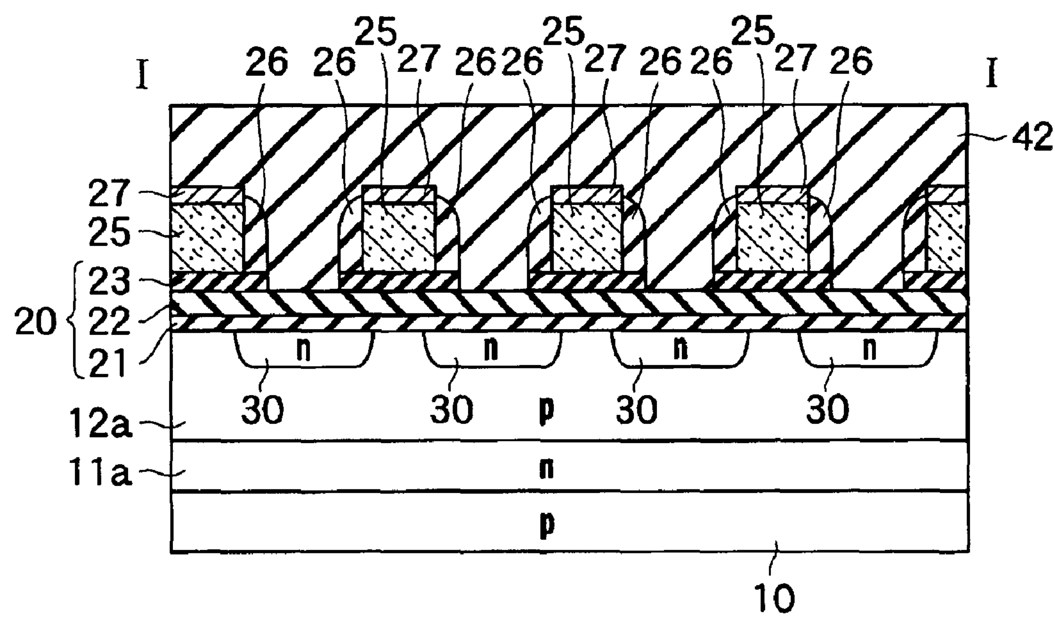
FIG. 34 is a sectional view cut along the line I—I, showing a process from silicide layer formation to interlayer insulating layer deposition in the fabrication method of the semiconductor integrated circuit of the third embodiment of the present invention.
Figure 35:
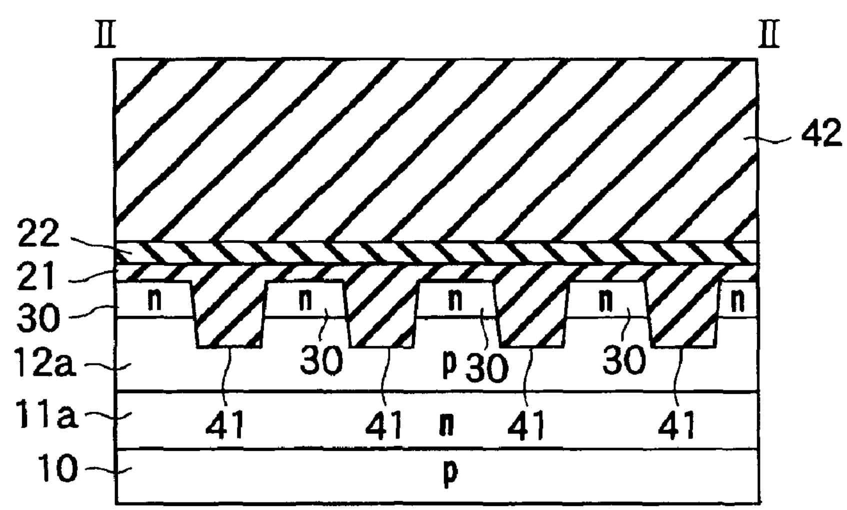
FIG. 35 is a sectional view cut along the line II—II of the same process in the fabrication method of the semiconductor integrated circuit of the third embodiment of the present invention.

(d) By the method of each of the foregoing embodiments, as shown in FIGS. 34 and 35, a side-wall insulating layer 26 is formed, and source and drain diffused layers 30 and a silicide layer 27 are formed. Further, an inter-layer insulating layer 42 made of a silicon oxide layer is deposited having a thickness of 50 to 1000 nm, and made flat to provide a shape shown in FIGS. 34 and 35.

Figure 36:
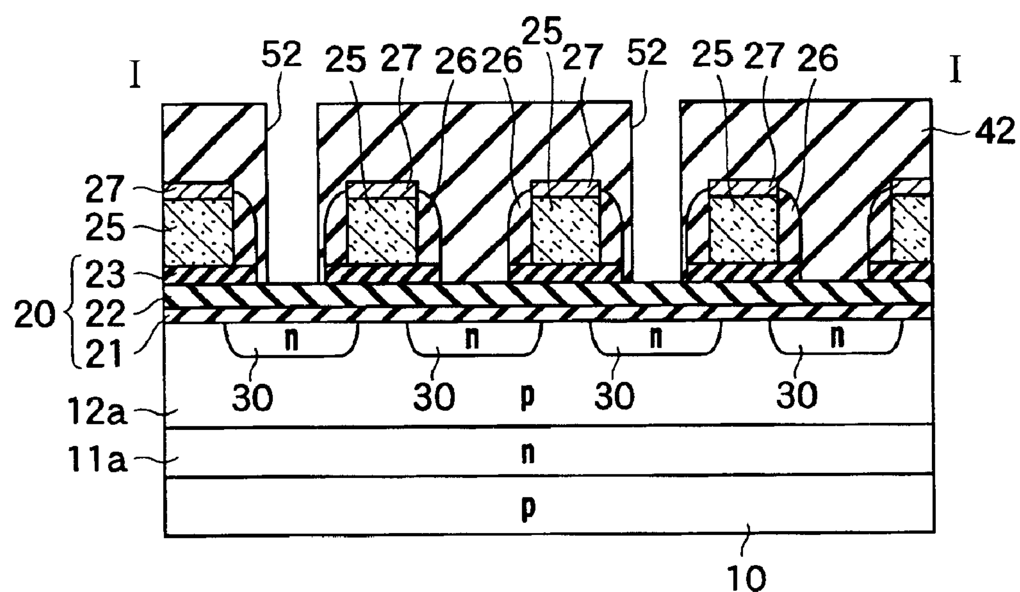
FIG. 36 is a sectional view cut along the line I—I (under processing) showing a process of forming a bit line contact hole in the fabrication method of the semiconductor integrated circuit of the third embodiment of the present invention.
Figure 37:
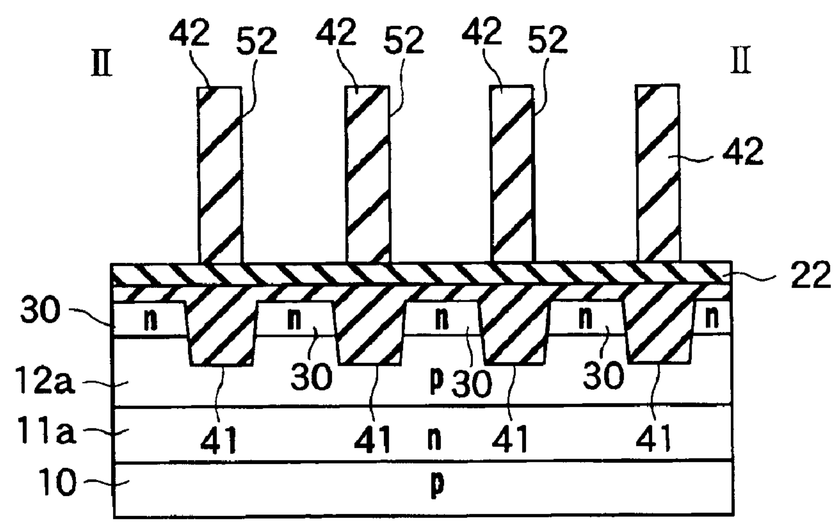
FIG. 37 is a sectional view cut along the line II—II of the same process in the fabrication method of the semiconductor integrated circuit of the third embodiment of the present invention.

(e) By lithography and anisotropic etching, the inter-layer insulating layer 42 is etched to form a bit line contact hole 52. At this time, by use of etching conditions where the silicon nitride layer 22 is an etching stopper, as shown in FIGS. 36 and 37, the etching can be stopped by the silicon nitride layer 22. Thus, etching of the element isolation insulating layer 41 is prevented.

Figure 38:
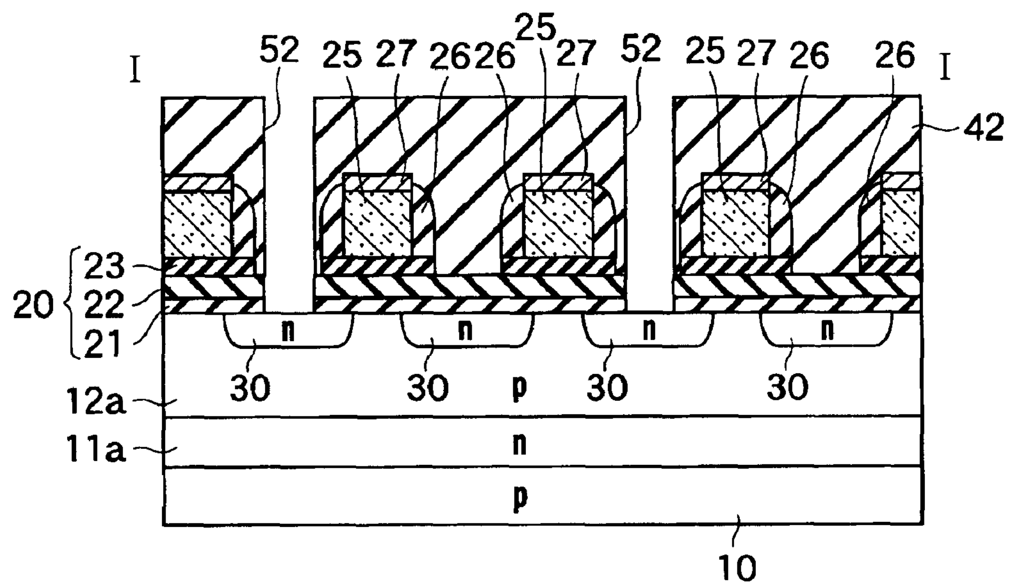
FIG. 38 is a sectional view cut along the line I—I, showing the process of forming the bit line contact hole (completion) in the fabrication method of the semiconductor integrated circuit of the third embodiment of the present invention.
Figure 39:
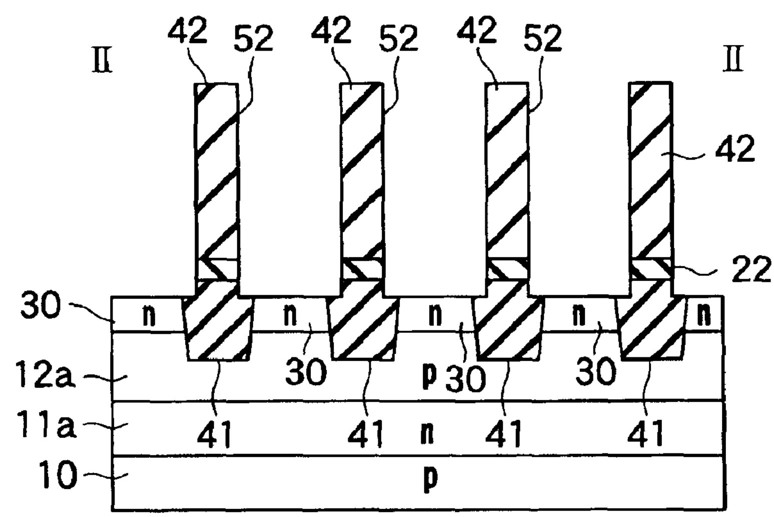
FIG. 39 is a sectional view cut along the line II—II of the same process in the fabrication method of the semiconductor integrated circuit of the third embodiment of the present invention.

(f) Further, by switching the etching conditions, the tunneling insulating layer 21 and the silicon nitride layer 22 on the silicon substrate 10 are removed, and as shown in FIGS. 38 and 39, the diffused layers 30 are exposed in the contact hole 52.

(g) Subsequently, as shown in FIGS. 25 and 26, the bit line contact hole is buried by a contact plug 43 made of polysilicon doped with impurities, a barrier metal or a metal such as W or Al, and further, a bit line 44 is formed. Then, when necessary, an inter-layer insulating layer 45 is deposited, and other contacts or metal wiring layers are formed, whereby a semiconductor integrated circuit having a MONOS cell array is obtained.

According to the third embodiment of the present invention, the bit line contact can be formed without alignment margins with respect to the element isolation region, elements are highly integrated, and the chip area is reduced to enable a reduction of manufacturing costs. If the position of the bit line contact is misaligned from the element region to enter the element isolation region, the buried contact plug is partially overlapped with the element isolation region. In this case, however, as a result of using the silicon nitride layer 22 as the etching stopper of the bit line contact, the element isolation insulating layer 41 is not etched, and the contact plug is self-aligned with the element isolation insulating layer 41 to be in contact with the diffused layers 30.

Additionally, since the silicon nitride layer 22, which is a charge storage layer, is used as the etching stopper layer with respect to the element isolation region, a redundant step of forming an etching stopper layer is unnecessary, so as to eliminate the number of steps. Since the etching stopper layer can be uniformly formed on the silicon substrate 10, a processing margin of the contact formation is increased to enable yield improvement. Moreover, since deposition of an etching stopper layer is not necessary, no etching stopper layer is formed on the side-wall of the transistor. As a result, a wide space is maintained between the transistors, and a burying aspect of the inter-layer insulating layer 42 is reduced, whereby a burying property is improved, and manufacturing yield is improved.

Figure 40:
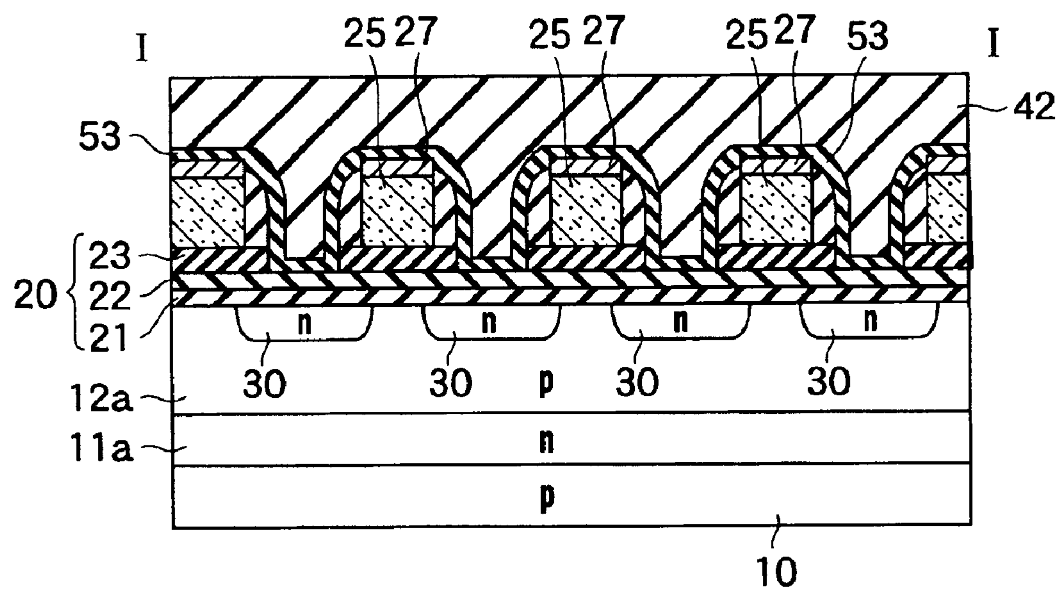
FIG. 40 is a sectional view cut along the line I—I corresponding to FIG. 34 when a subsequent attaching process of an etching stopper layer is added in the fabrication method of the semiconductor integrated circuit of the third embodiment of the present invention.
Figure 41:
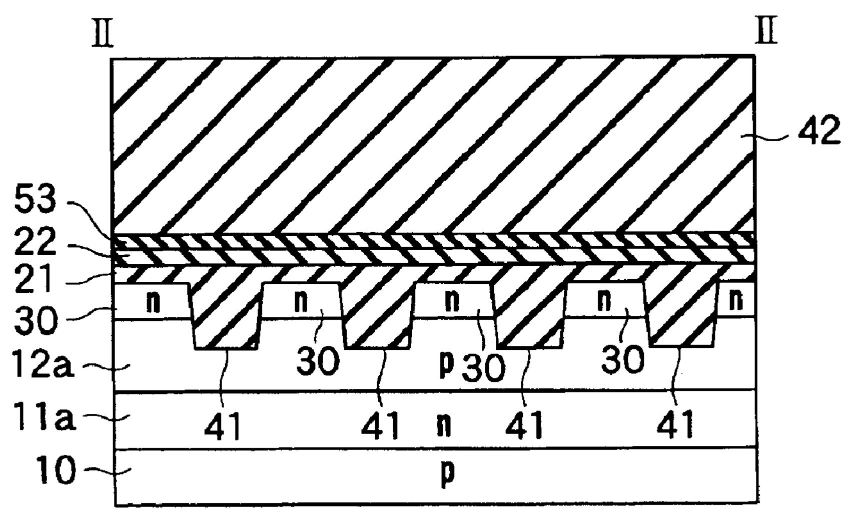
FIG. 41 is a sectional view cut along the line II—II of the same process corresponding to FIG. 35 in the fabrication method of the third embodiment of the present invention.
Figure 44:
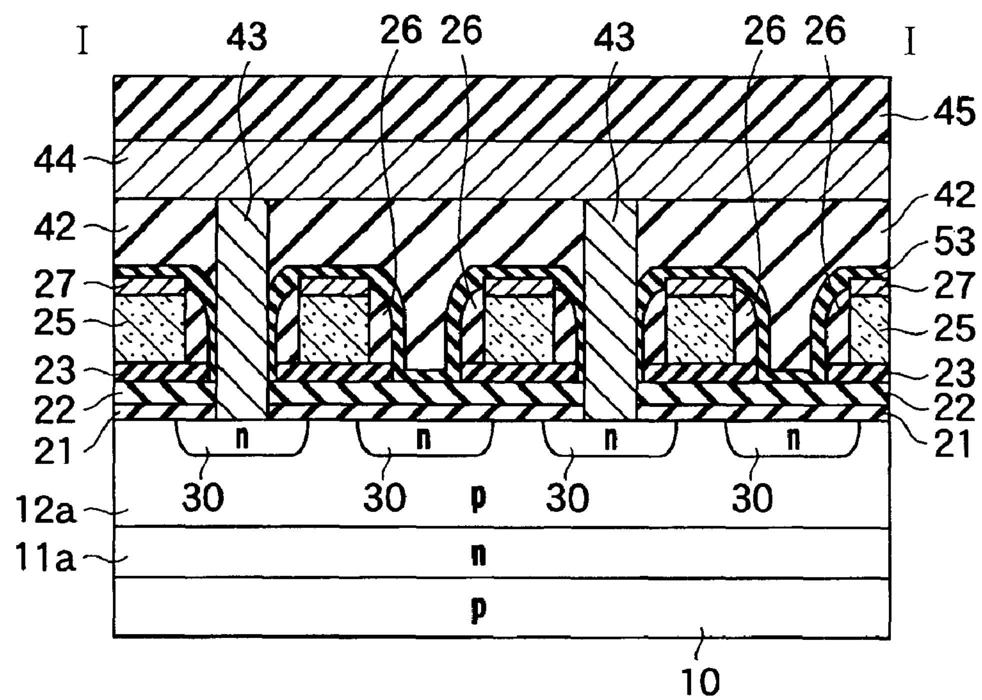
FIG. 44 is a sectional view cut along the line I—I corresponding to FIG. 25 when the subsequent attaching process of an etching stopper layer is added in the fabrication method of the semiconductor integrated circuit of the third embodiment of the present invention.
Figure 45:
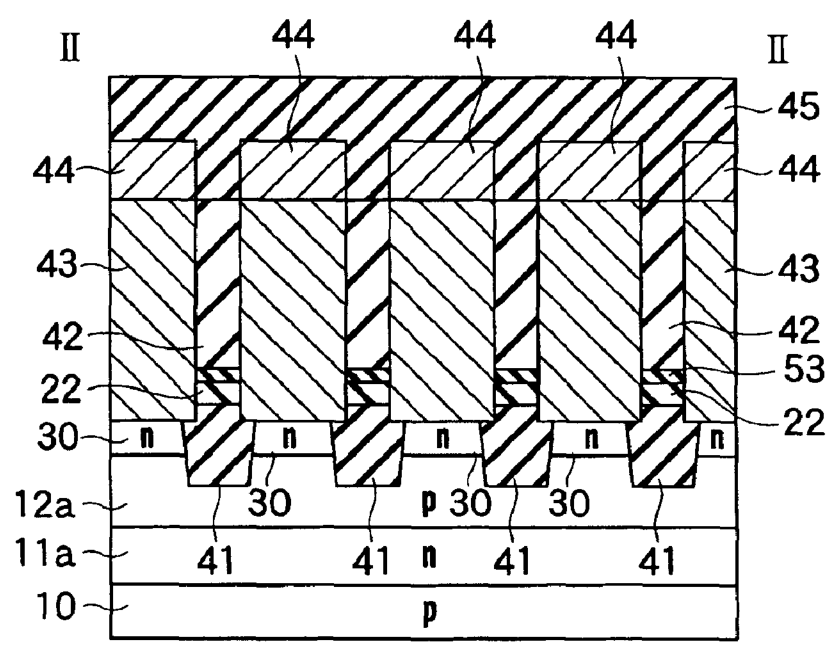
FIG. 45 is a sectional view cut along the line II—II of the same process corresponding to FIG. 26 in the fabrication method of the semiconductor integrated circuit of the third embodiment of the present invention.

However, if the silicon nitride layer 22 used for the gate insulating layer 20 of the MONOS cell is thinner and is not sufficient for an etching stopper layer for the duration of the contact hole formation, it is effective to add a step of forming an etching stopper layer after the gate electrode formation. A structure of this case is as shown in FIGS. 40 and 41 corresponding to FIGS. 34 and 35. After the formation of the silicide layer 27, a silicon nitride layer 53, which will be a barrier insulating layer to cover the memory cell and the element isolation region, is thinly deposited. A stacked structure of the silicon nitride layers 22 and 53 is formed on the source and drain diffused layers 30 and the element isolation region. In this case, a final structure corresponding to FIGS. 25 and 26 is as shown in FIGS. 44 and 45.

Figure 42:
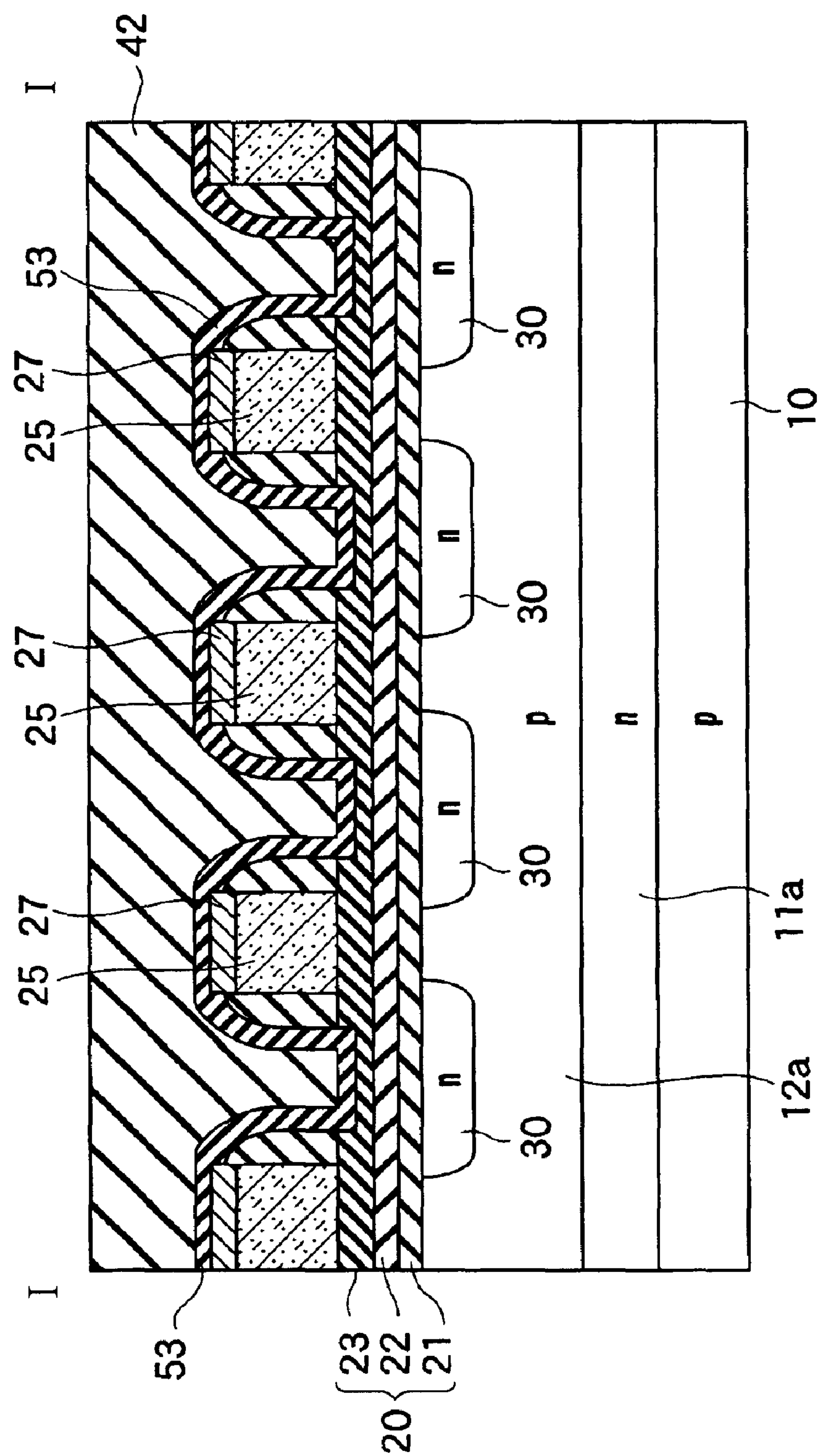
FIG. 42 is a sectional view cut along the line I—I corresponding to FIG. 40 when the subsequent attaching process of an etching stopper layer is added in the fabrication method of the semiconductor integrated circuit of the third embodiment of the present invention, that is, a modified example having a structure where part of a layer 23 is formed thinner.

FIG. 42 is a sectional view cut along the line I—I of FIG. 40 when a subsequent attaching process of an etching stopper layer is added in the fabrication method of the semiconductor integrated circuit of the third embodiment of the present invention. This process corresponds to a modified example having a structure where a part of a layer 23 is formed thinner.

Figure 43:
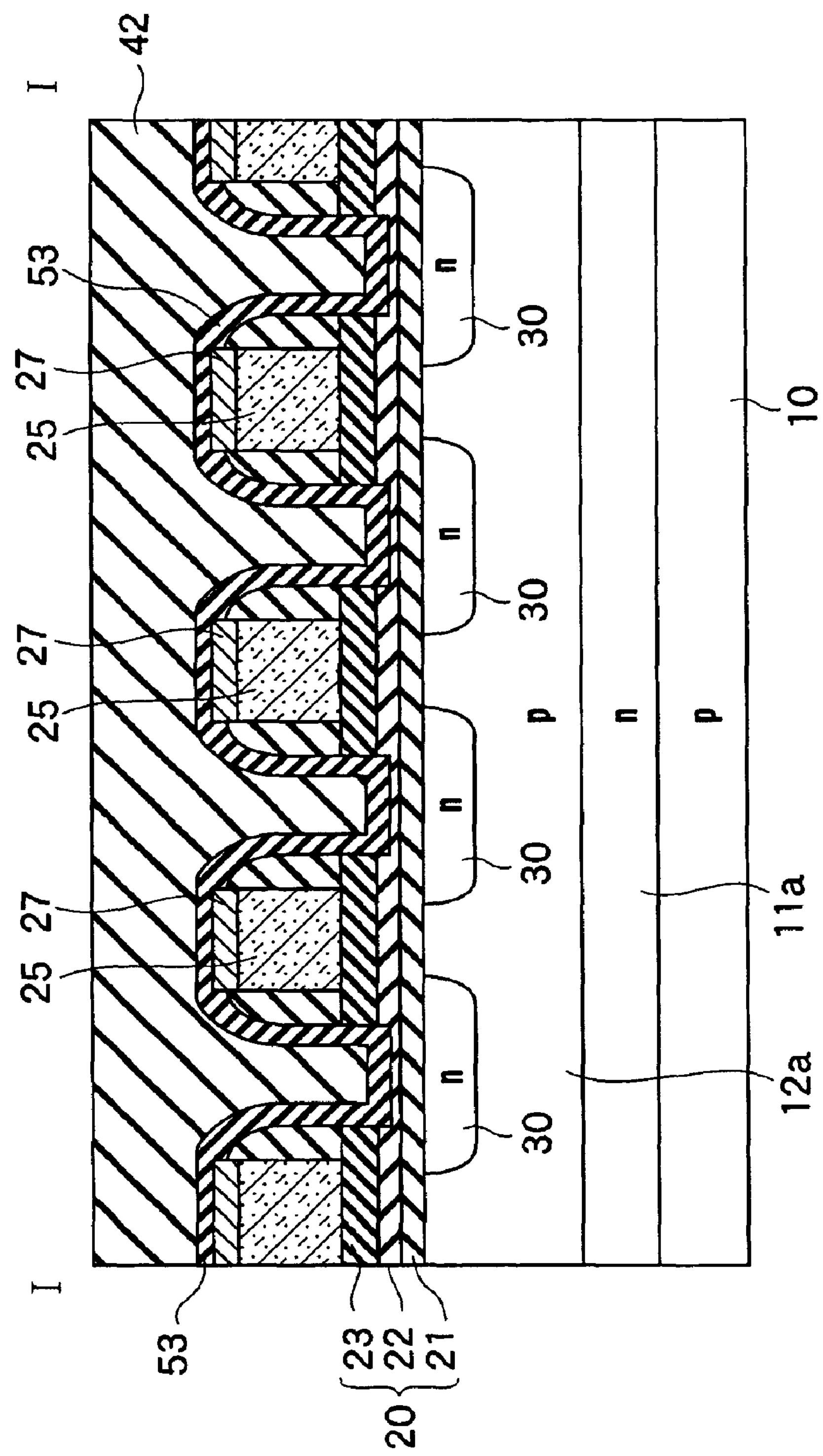
FIG. 43 is a sectional view cut along the line I—I corresponding to FIG. 40 when the subsequent attaching process of an etching stopper layer is added in the fabrication method of the semiconductor integrated circuit of the third embodiment of the present invention, that is, a modified example having a structure where a part of a layer 22 is formed thinner.

FIG. 43 is a sectional view cut along the line I—I of FIG. 40 when a subsequent attaching process of an etching stopper layer is added in the fabrication method of the semiconductor integrated circuit of the third embodiment of the present invention. This process corresponds to a modified example having a structure where a part of a layer 22 is formed thinner.

Above the element isolation region 41 and the source and drain diffused layers 30, a natural oxide layer may be formed having a thickness of 2 nm or less between the silicon nitride layers 22 and 53. Substantially, however, the two layers are stacked in contact to serve as a good etching stopper. Since the silicon nitride layer used for the gate insulating layer of the MONOS cell is used as a part of the etching stopper, the silicon nitride layer 53 can be thinly formed after the gate electrode formation, and advantages similar to those of the structure described above with reference to FIGS. 25 and 26 can be obtained.

It is effective that the structure described above with reference to FIGS. 40, 41, 44 and 45 is combined with the foregoing embodiment where the silicide layers are formed on the diffused layers and the gate electrode of the MOS transistor. However, although such a silicide layer is not used, this structure is significant. Specifically, by leaving the silicon nitride layer 22 used for the gate insulating layer of the MONOS cell above the element isolation region 41 in contact with the contact plug 43 to use the silicon nitride layer 22 as an etching stopper, it is possible to improve the reliability of an EEPROM using the MONOS cell, and to achieve high integration.

Figure 46:
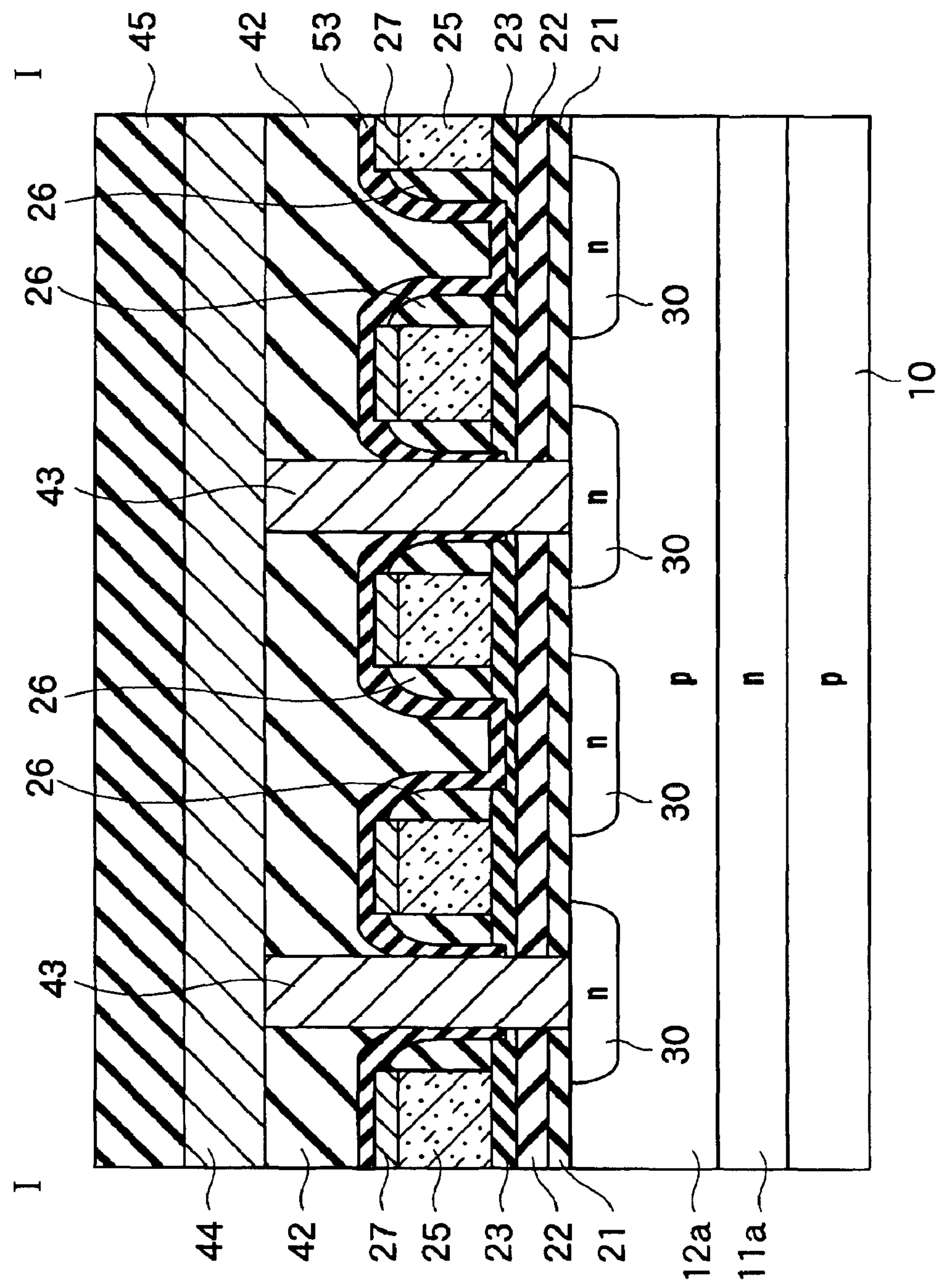
FIG. 46 is a sectional view cut along the line I—I corresponding to FIG. 44 when the subsequent attaching process of an etching stopper layer is added in the fabrication method of the semiconductor integrated circuit of the third embodiment of the present invention, that is, a modified example having a structure where a part of the layer 23 is formed thinner.

FIG. 46 is a sectional view cut along the line I—I of FIG. 24, which is corresponding to FIG. 44, when a subsequent attaching process of the etching stopper layer is added to the fabrication method of the semiconductor integrated circuit of the third embodiment of the present invention. This process corresponds to a modified example having a structure where a part of the layer 23 is thinly formed.

Figure 47:
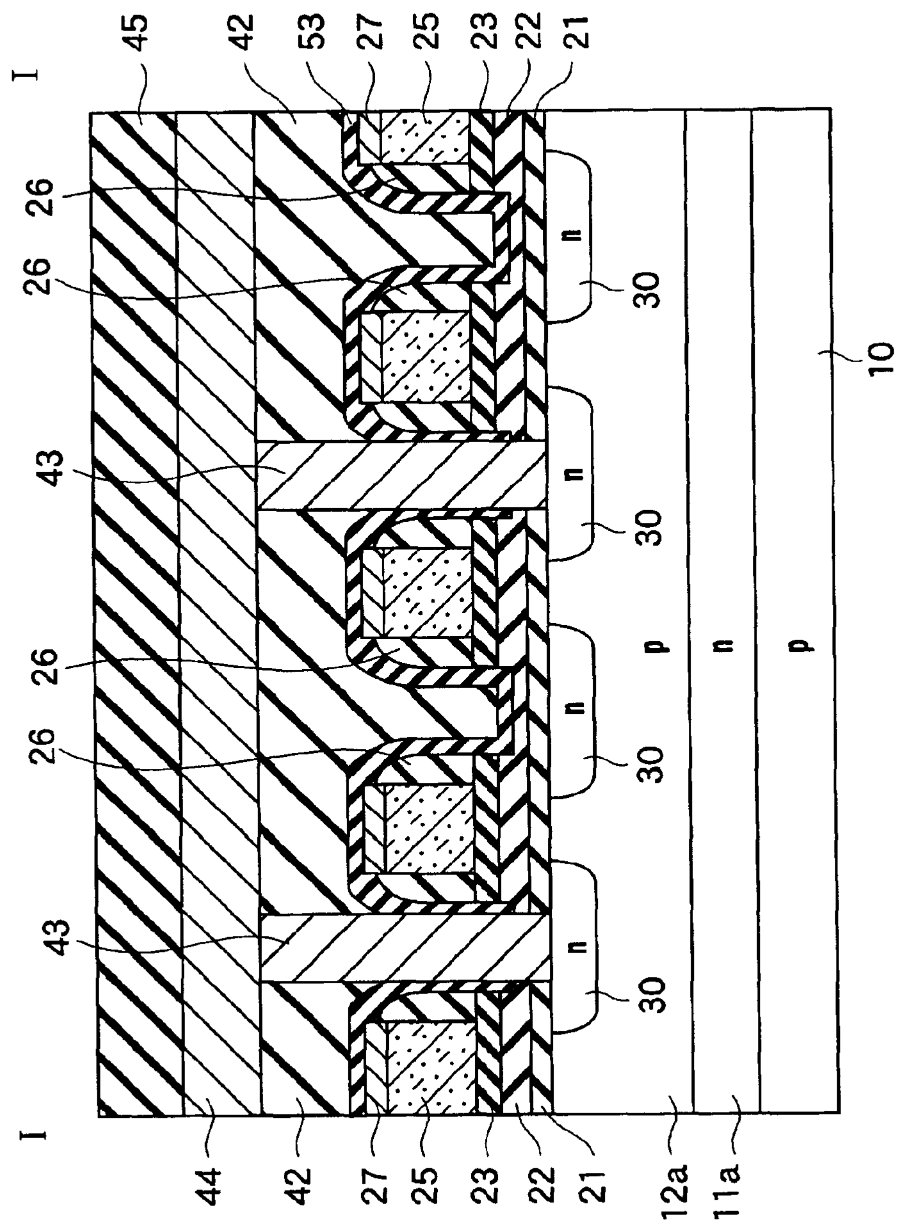
FIG. 47 is a sectional view cut along the line I—I corresponding to FIG. 44 when the subsequent attaching process of an etching stopper layer is added in the fabrication method of the semiconductor integrated circuit of the third embodiment of the present invention, that is, a modified example having a structure where a part of the layer 22 is formed thinner.

FIG. 47 is a sectional view cut along the line I—I of FIG. 24, which is corresponding to FIG. 44, when a subsequent attaching process of the etching stopper layer is added in the fabrication method of the semiconductor integrated circuit of the third embodiment of the present invention. This process corresponds to a modified example having a structure where a part of the layer 22 is thinly formed.

The embodiment has been described by an example of the NOR type EEPROM. However, the invention can be applied to a NAND type, an AND type, and a virtual ground array type EEPROM.

As described above, according to the embodiment of the present invention, it is possible to provide a high-performance semiconductor integrated circuit where a MONOS cell is formed on the semiconductor substrate.

(Fourth Embodiment)

Figure 48:
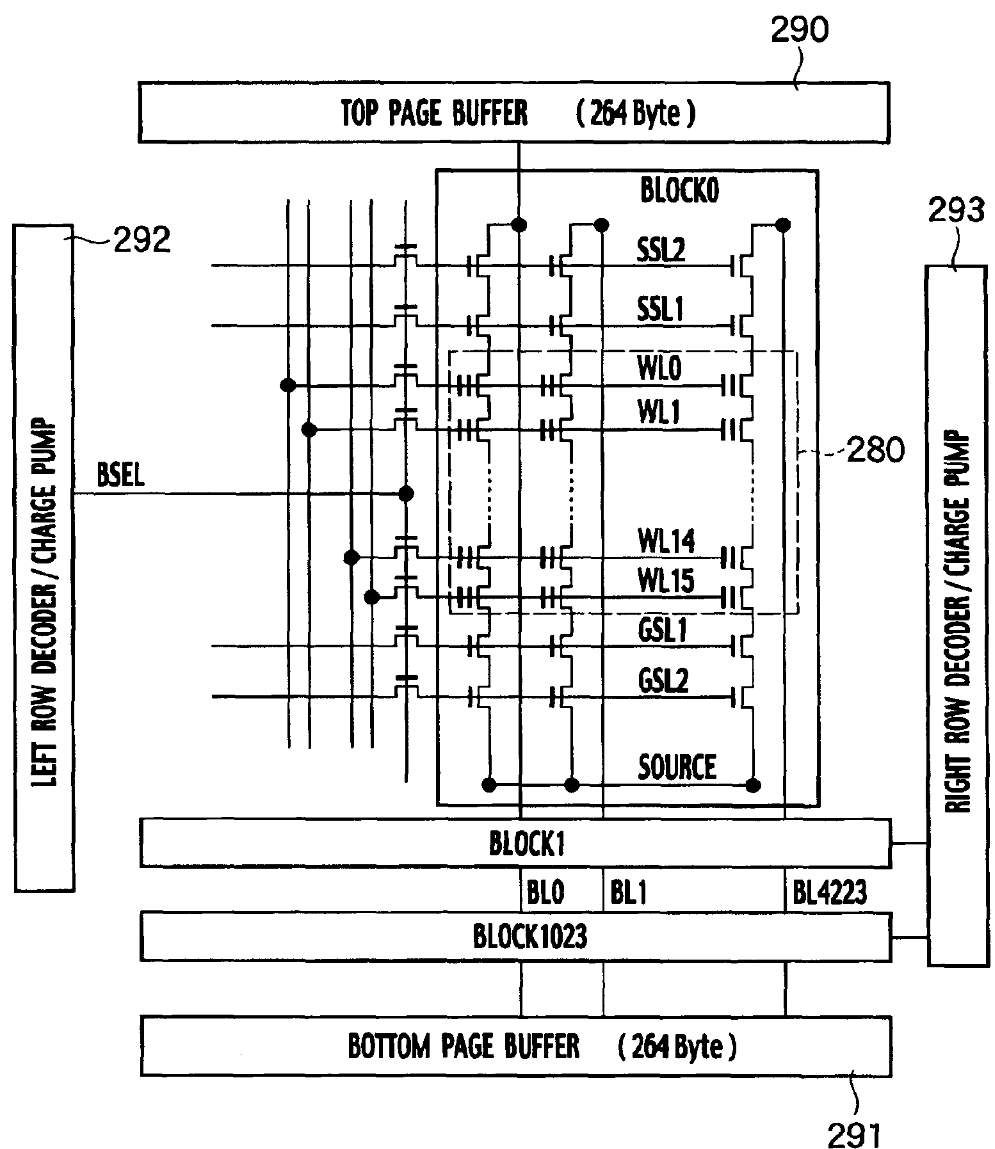
FIG. 48 is a schematic circuitry view of an example of a 64 Mbit NAND flash memory in a semiconductor integrated circuit according to a fourth embodiment of the present invention.

As a semiconductor integrated circuit of a fourth embodiment of the present invention, as shown in FIG. 48, a schematic circuitry of a 64 Mbit NAND type flash memory includes two select gate lines SSL1 and SSL2 on the bit line side of a NAND string, and two selection gate lines GSL1 and GSL2 on the source side. In FIG. 48, a block 0, a block 1, . . . and a block 1023 constituting a NAND type MONOS memory cell array 280 are arranged, and a top page buffer 290, a bottom page buffer 291, a left row decoder/charge pump 292, and a right row decoder/charge pump 293 are arranged on the periphery of these blocks. Additionally, in FIG. 48, word lines WL0, WL1, . . . , WL14 and WL15 are arranged in parallel with the select gate lines SSL1, SSL2, GSL1 and GSL2, and bit lines BL0, BL1, . . . and BL4223 are arranged perpendicular to the word lines.

(Fifth Embodiment)

Figure 49:
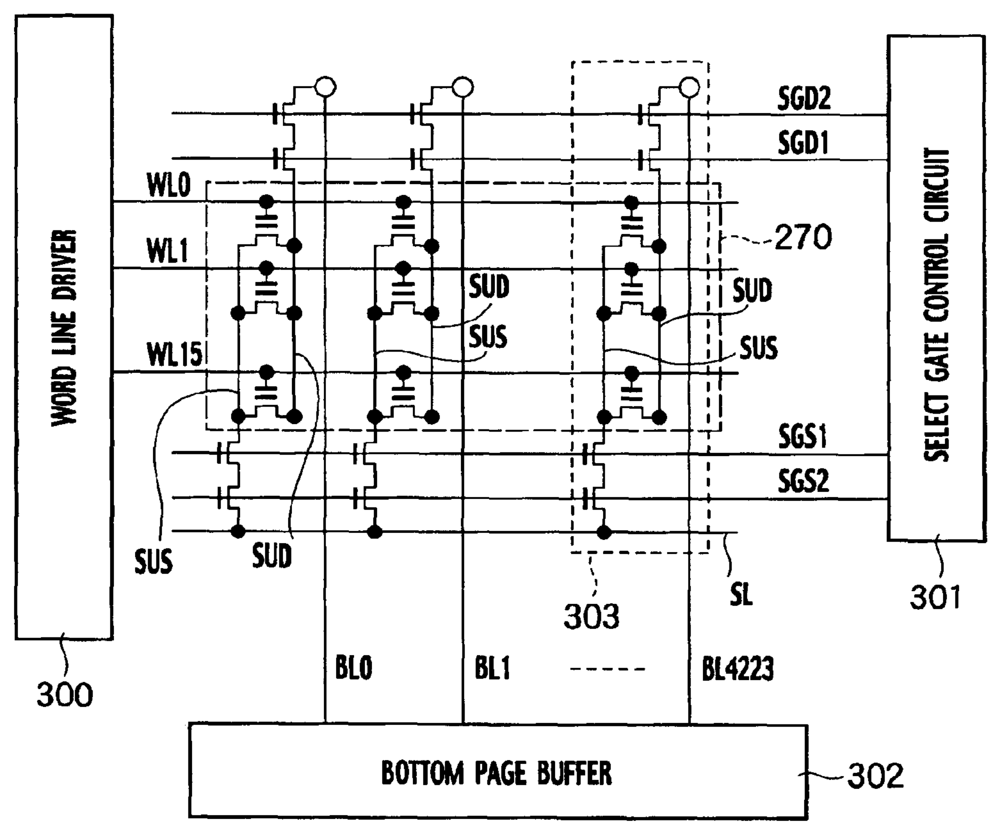
FIG. 49 is a schematic circuitry view of an example of an AND flash memory in a semiconductor integrated circuit according to a fifth embodiment of the present invention.

As a semiconductor integrated circuit of a fifth embodiment of the present invention, as shown in FIG. 49, schematic circuitry of an AND type flash memory includes two select gate lines SGS1 and SGS2 on the source side of an AND type MONOS memory cell array, and two select gate lines SGD1 and SGD2 on the bit line side thereof. In FIG. 49, a bottom page buffer 302, a word line driver 300, and a select gate control circuit 301 are arranged on the periphery of the AND type MONOS memory cell array 270. Additionally, in the AND type MONOS memory cell array, word lines WL0, WL1, . . . and WL15 are arranged perpendicular to bit lines BL0, BL1, . . . and BL4223, and a MONOS memory cell is connected to each word line. In FIG. 49, a region 303 indicated by a dotted line represents an AND type MONOS memory cell unit.

The name of the AND type flash memory is derived from the fact that a connection scheme thereof is a parallel connection similar to that of the NOR type, and a logic scheme thereof is an inversion of that of the NOR type. For example, in the case of a 64 Mbit AND type MONOS flash memory inserted in parallel between a sub bit line SUD and a sub source line SUS, the AND type MONOS flash memory unit includes 128 unit cells, two bit line side select gate transistors, having select gate lines SGD1 and SGD2, respectively, for connecting the sub bit line SUD to the bit line, and two source side select gate transistors, having select gate lines SGS1 and SGS2, respectively, for connecting the sub source line SUS to the source line SL. The MONOS memory cell array is characterized by having a pseudo contactless structure whereby the wiring metal layer of the bit lines BL0, BL1, . . . and BL4223, and the source line SL are hierarchized, and the sub bit line SUD and the sub source line SUS are constituted of diffused layers.

(Sixth Embodiment)

A divided bit line (DI) NOR type flash memory has a feature of a single power supply operation, a high rewriting speed, a small memory size as in the case of the NAND type flash memory, and rapid random access to the NOR type flash memory. The bit line and the sub bit line SUD in the memory array are in a hierarchical structure, and a DINOR type flash memory unit is approximately equal to the AND type memory cell unit. The memory cell is a stacked gate type as in the case of the NOR or NAND type memory cell unit, and drains of the memory cells are connected in parallel to the sub bit line SUD made of a polysilicon. For example, in the case of 16 Mbit DINOR type flash memory, 64 memory cells are connected to the sub bit lines SUD. The connection with the memory cell is made by a buried contact of the polysilicon and the diffused layer to reduce memory cell size. A mechanism of writing/erasing to the memory cell is similar to that of the AND type flash memory, and an operation is carried out by means of a Flowler-Nordheim (FN) tunneling current. Writing to the memory cell is carried out by drawing trapped electrons in the silicon nitride layer to the drain side by use of the FN tunneling current. Erasing is carried out by injecting electrons from the substrate to the silicon nitride layer by means of the FN tunneling current of an entire channel surface.

Figure 50:
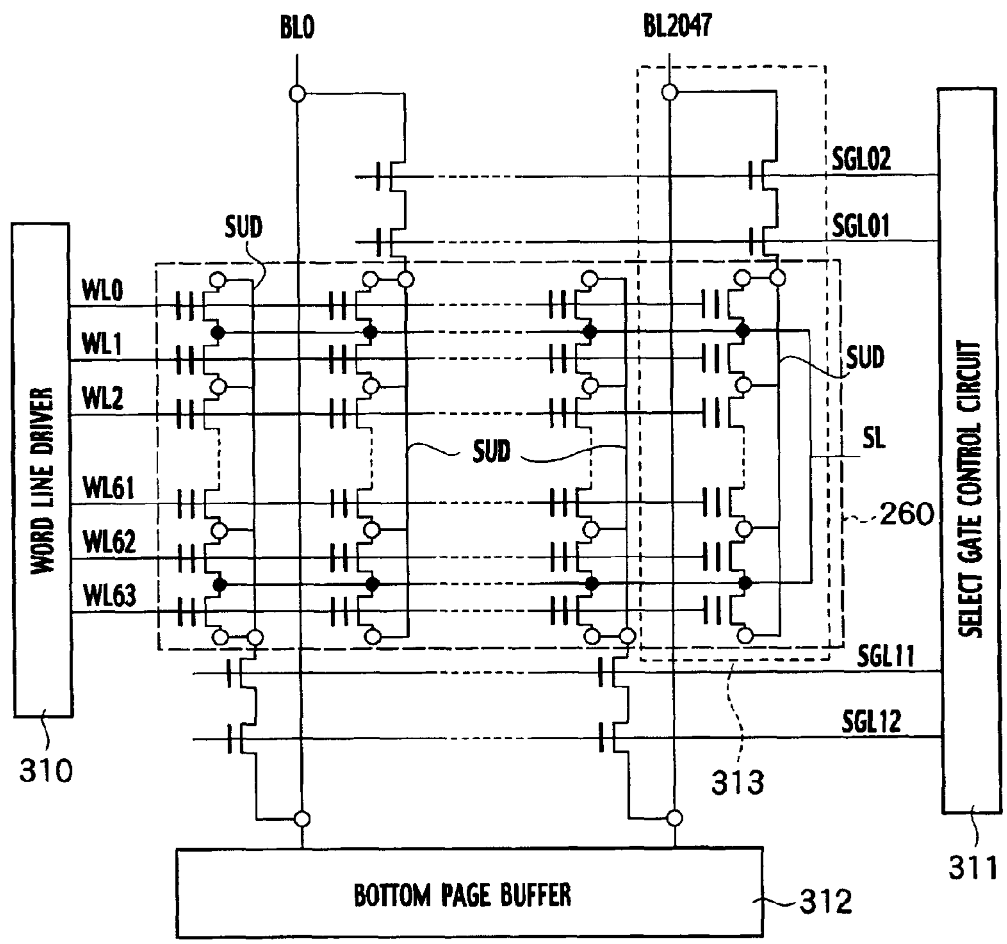
FIG. 50 is a circuitry diagram of an example of a divided bit line NOR type flash memory in a semiconductor integrated circuit according to a sixth embodiment of the present invention.

As a semiconductor integrated circuit of a sixth embodiment of the present invention, as shown in FIG. 50, schematic circuitry of a DINOR type flash memory is such that in a DINOR type MONOS memory cell array 260. Bit lines BL0, BL1, . . . and BL2047, and a sub bit line SUD are formed in hierarchical structure, and the bit lines and the sub bit lines SUD are connected through select gate lines SGL01 and SGL02, and select gate lines SGL11 and SGL12. Specifically, the two select gate lines SGL11 and SGL12 are disposed on the bottom page side, and the two selection gate lines SGL01 and SGL02 are disposed on the top page side. In FIG. 50, a bottom page buffer 312, a word line driver 310, and a select gate control circuit 311 are arranged on the periphery of the DINOR type MONOS memory cell array 260. In the DINOR type MONOS memory cell array, word lines WL0, WL1, . . . and WL63 are arranged perpendicular to the bit lines BL0, BL1, . . . and BL2047, and the MONOS memory cell is connected to each word line. Source regions of the memory cells are electrically connected in common to a source line SL. In FIG. 50, a region 313 surrounded by a dotted line represents a DINOR type MONOS memory cell unit. In FIG. 50, a black circle ● represents a diffused layer region, and a white circle ○ represents a contact region.

(Seventh Embodiment)

An operational mode of a nonvolatile semiconductor memory device constituting a semiconductor integrated circuit of the first through sixth embodiment of the present invention is largely classified into three modes. These three modes are a page mode, a byte mode and an EEPROM mode having a ROM region.

Figure 51:
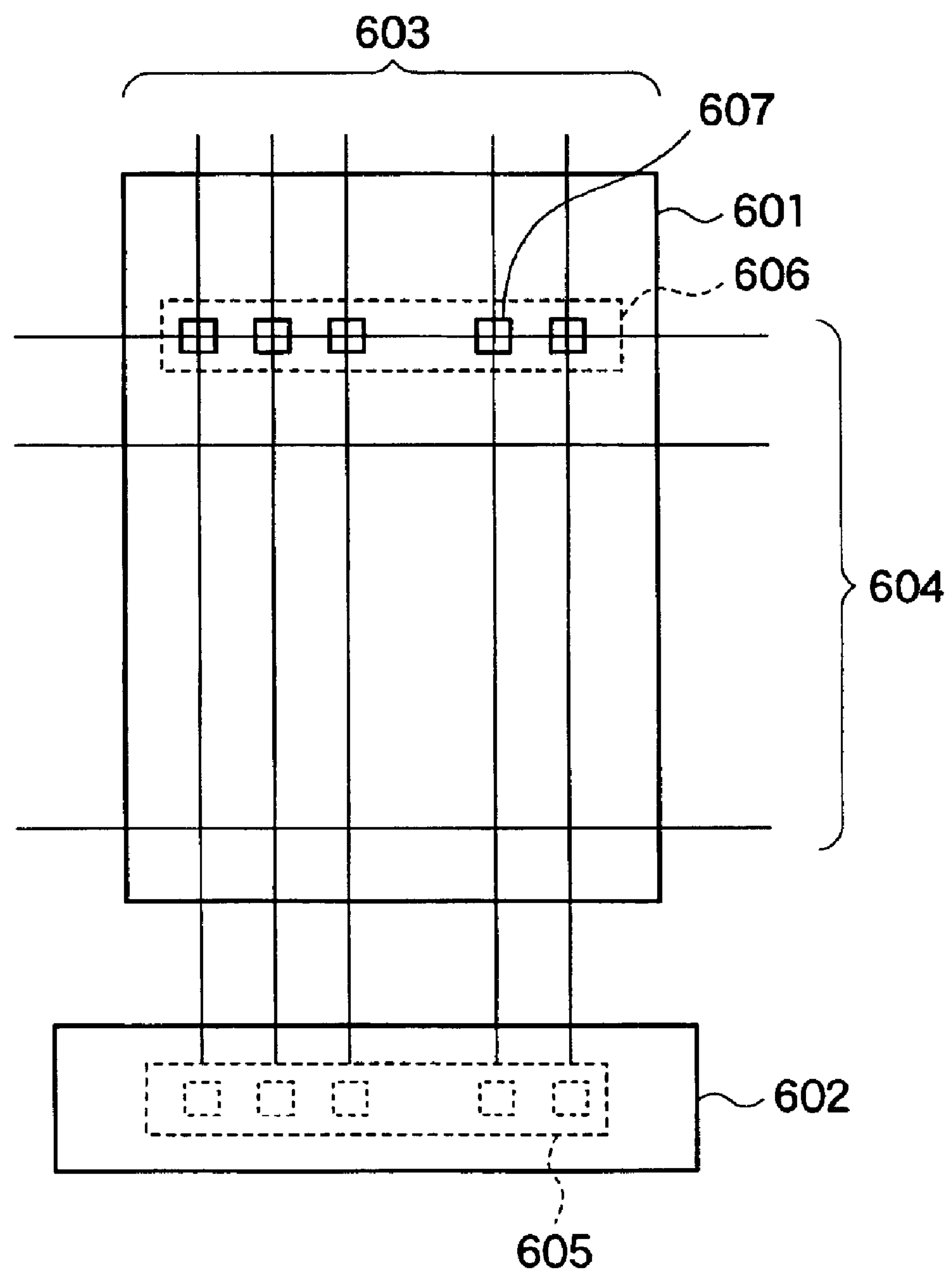
FIG. 51 is a schematic block diagram of a flash memory in a page mode used in a semiconductor integrated circuit system according to a seventh embodiment of the present invention.

In the page mode, as shown in FIG. 51, an operation is carried out to entirely r ad stored memory data in a row of memory cells 606 present on a word line 604 in a MONOS flash memory cell array 601 as a memory cell row 605 through a bit line 603 in a sense amplifier 602, or to entirely write memory data from the memory cell row 605 in the sense amplifier 602. Specifically, reading or writing is carried out by a page unit. In FIG. 51, a MONOS memory cell 607 is arranged at an intersection between the word line 604 and the bit line 603.

Figure 52:
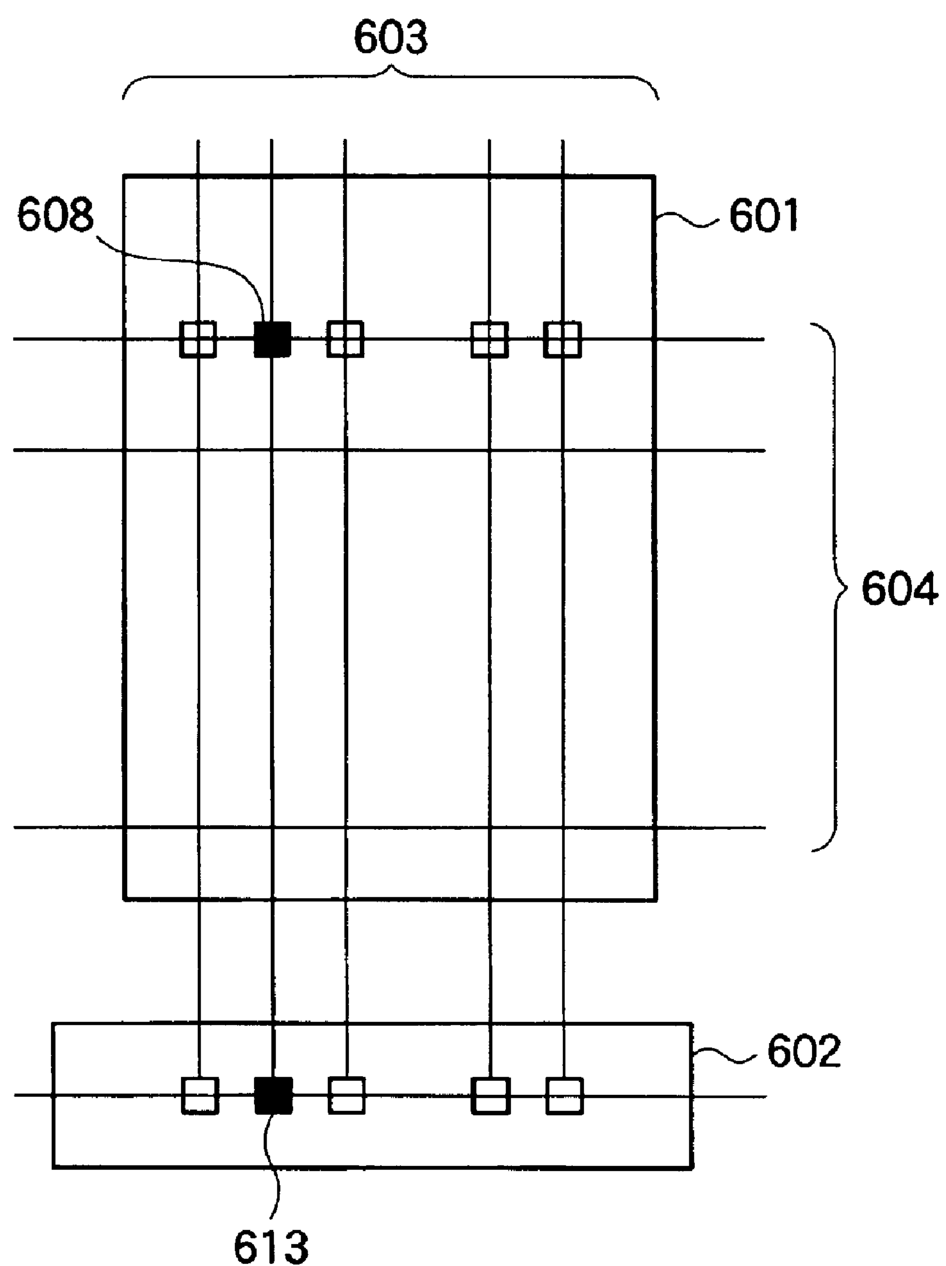
FIG. 52 is a schematic block diagram showing a flash memory in a byte mode used in the semiconductor integrated circuit system of the seventh embodiment of the present invention.

On the other hand, in the byte mode, as shown in FIG. 52, an operation is carried out to read a MONOS memory cell 608 present on the word line 604 in the MONOS flash memory cell array 601 by a byte unit as a memory cell 613 in the sense amplifier 602, or write data in the memory cell 608 from the memory cell 613 in the sense amplifier 602 by a byte unit. Specifically, it is different from the page mode in that reading or writing is carried out by a byte unit.

Figure 53:
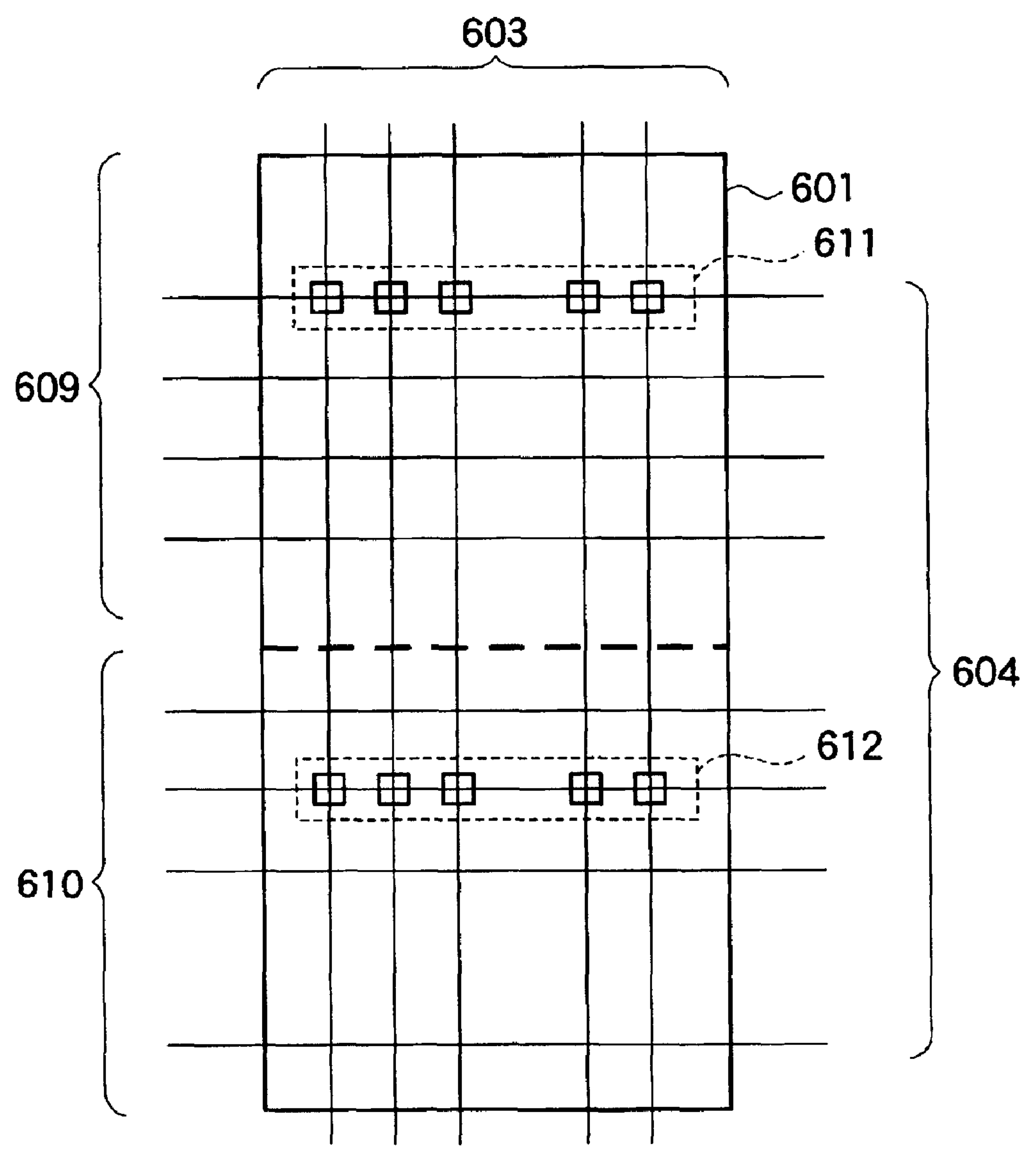
FIG. 53 is a schematic block diagram of a flash memory in an EEPROM mode having a ROM region used in the semiconductor integrated circuit system of the seventh embodiment of the present invention.

On the other hand, in the EEPROM mode having a ROM region, as shown in FIG. 53, the MONOS flash memory cell array 601 is divided into a MONOS flash memory portion 609 and an EEPROM 610 having a ROM region, the EEPROM 610 portion having a ROM region is systematically switched to operate, and information in the MONOS flash memory cell array 601 is read or rewritten by a page unit or a byte unit. FIG. 53 shows an example where a memory cell row 611 on the same word line in the MONOS flash memory 609 is read, or written by a page unit as a memory cell row 612 in the EEPROM 610 having a ROM region.

Figure 54:
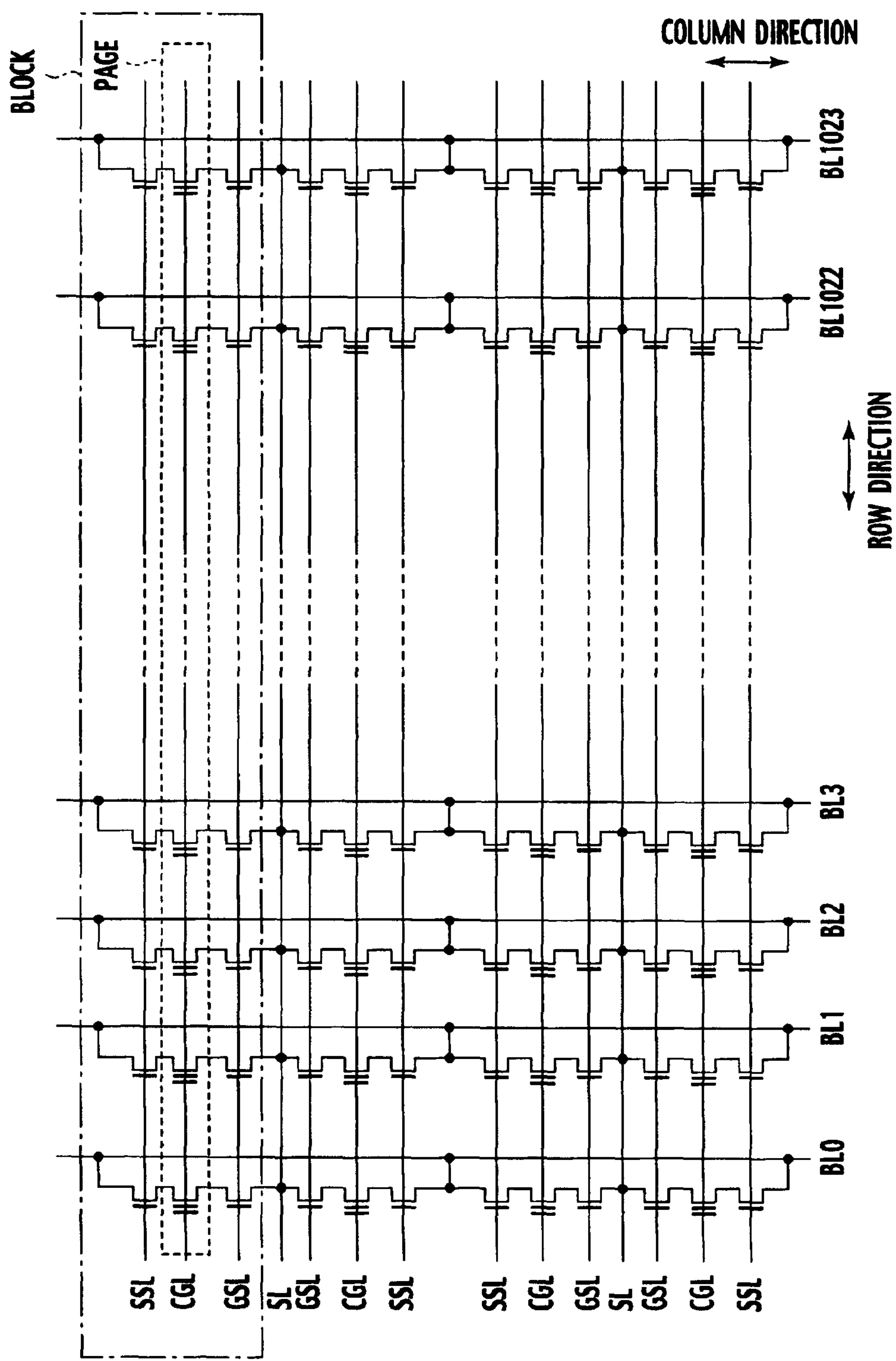
FIG. 54 is a schematic circuitry diagram of a flash memory in an EEPROM mode having a ROM region used in the semiconductor integrated circuit system of the seventh embodiment of the present invention.

FIG. 54 is a schematic circuitry view of an EEPROM mode flash memory having a ROM region used for the semiconductor integrated circuit system of the seventh embodiment of the present invention shown in FIG. 53. A circuit example shown in FIG. 54 is characterized by having a 3-transistor NAND cell arrangement. Specifically, two switching transistors are arranged for one NAND memory cell to provide a NAND type MONOS memory cell array of a 3-transistor/cell system. CGL denotes a control gate line, SSL denotes a gate line for a source side switching transistor, and GSL denotes a gate line for a drain side switching transistor. In one block in a row direction, a NAND type memory cell on the same CGL line constitutes one page. Bit lines BL0, BL1, BL2, BL3, . . . , BL1022 and BL1023 are arranged in a column direction. By use of such a NAND type MONOS memory cell of the 3-transistor/cell system, the flash memory cell array 601 in the EEPROM mode having a ROM region shown in FIG. 53 can be realized.

Needless to say, the semiconductor integrated circuit of each of the foregoing first to sixth embodiments of the present invention can operate in the page mode, the byte mode, and the EEPROM mode having a ROM region. The semiconductor integrated circuits of the foregoing fourth to sixth embodiments have been described by way of examples of the NAND type MONOS flash memory, the AND type MONOS flash memory, and the DINOR type MONOS flash memory. In these three types of flash memories, the operational modes of the page mode, the byte mode and the EEPROM mode having a ROM region can be realized. As described later, if the flash memory is used in a memory card or an IC card, to constitute a system LSI and to promote formation of a single chip, the EEPROM mode having a ROM region which can systematically operate the flash memory is important.

(Eighth Embodiment)

(System LSI)

Various application examples are possible for the semiconductor integrated circuits of the first to seventh embodiments of the present invention. Some application examples are shown in FIGS. 55 to 68.

APPLICATION EXAMPLE 1

Figure 55:
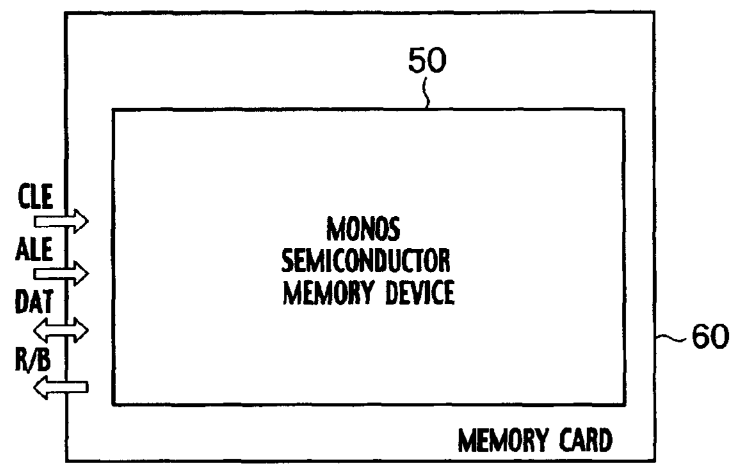
FIG. 55 is a schematic block constitutional diagram showing an internal structure of a memory card to which the semiconductor integrated circuit system of the seventh embodiment of the present invention is applied.

As an example, a memory card 60 which includes a MONOS semiconductor memory device 50 having a MONOS memory cell is provided as shown in FIG. 55. The semiconductor integrated circuit of each of the first to seventh embodiments can be applied to the MONOS semiconductor memory device 50. As shown in FIG. 55, the memory card 60 can operate to receive a predetermined signal from an external device (not shown) or output a predetermined signal to an external device (not shown).

A signal line DAT, a command line enable signal line CLE, an address line enable signal line ALE, and a ready/busy signal line R/B are connected to the memory card 60 which incorporates the MONOS semiconductor memory device 50. The signal line DAT transfers a data signal, an address signal or a command signal. The command line enable signal line CLE transmits a signal indicating that the command signal has been transferred on the signal line DAT. The address line enable signal line ALE transmits a signal indicating that the address signal has been transferred on the signal line DAT. The ready/busy signal line R/B transmits a signal indicating whether the semiconductor memory device 50 is ready or not.

APPLICATION EXAMPLE 2

Figure 56:
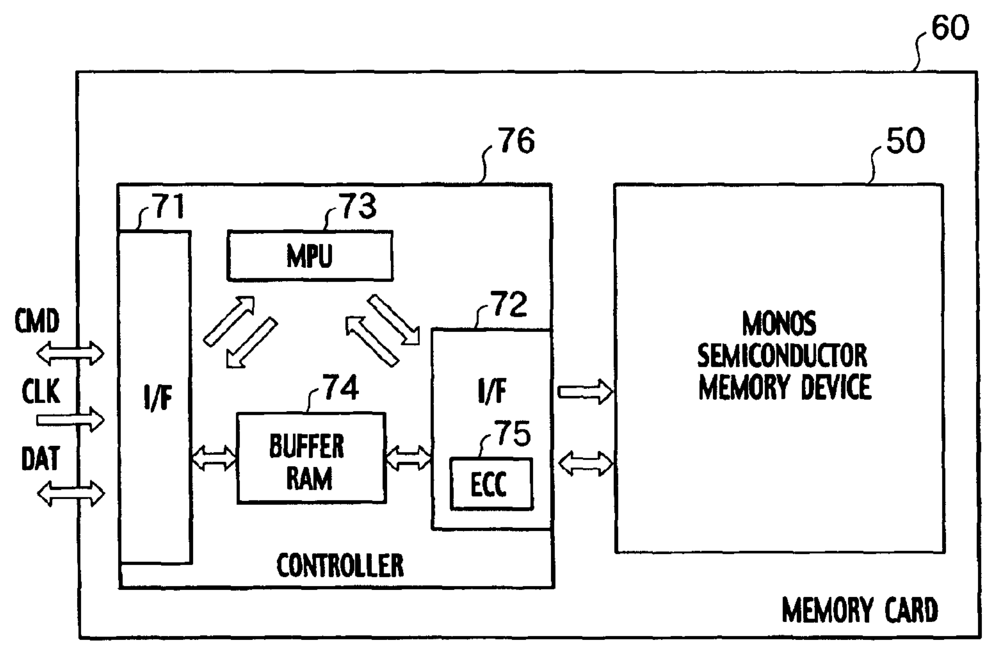
FIG. 56 is a schematic block constitutional diagram showing the internal structure of the memory card to which the semiconductor integrated circuit system of the seventh embodiment of the present invention is applied.

As shown in FIG. 56, different from the example of the memory card of FIG. 55, another specific example of the memory card 60 includes a controller 76 which controls the MONOS semiconductor memory device 50 and which transmits/receives a predetermined signal to/from an external device, in addition to the MONOS semiconductor memory device 50. The controller 76 includes interface units (I/F) 71 and 72, a microprocessor unit (MPU) 73, a buffer RAM 74, and an error correction code unit (ECC) 75 included in the interface unit (I/F) 72.

The interface unit (I/F) 71 transmits/receives a predetermined signal to/from the external device, whereas the interface unit (I/F) 72 transmits/receives a predetermined signal to/from the MONOS semiconductor memory device 50. The microprocessor unit (MPU) 73 converts a logic address into a physical address. The buffer RAM 74 temporarily stores data. The error correction code unit (ECC) 75 generates an error correction code.

A command signal line CMD, a clock signal line CLK, and a signal line DAT are connected to the memory card 60. The number of control signal lines, a bit width of the signal line DAT and circuitry of the controller 76 can be changed as occasion demands.

APPLICATION EXAMPLE 3

Figure 57:
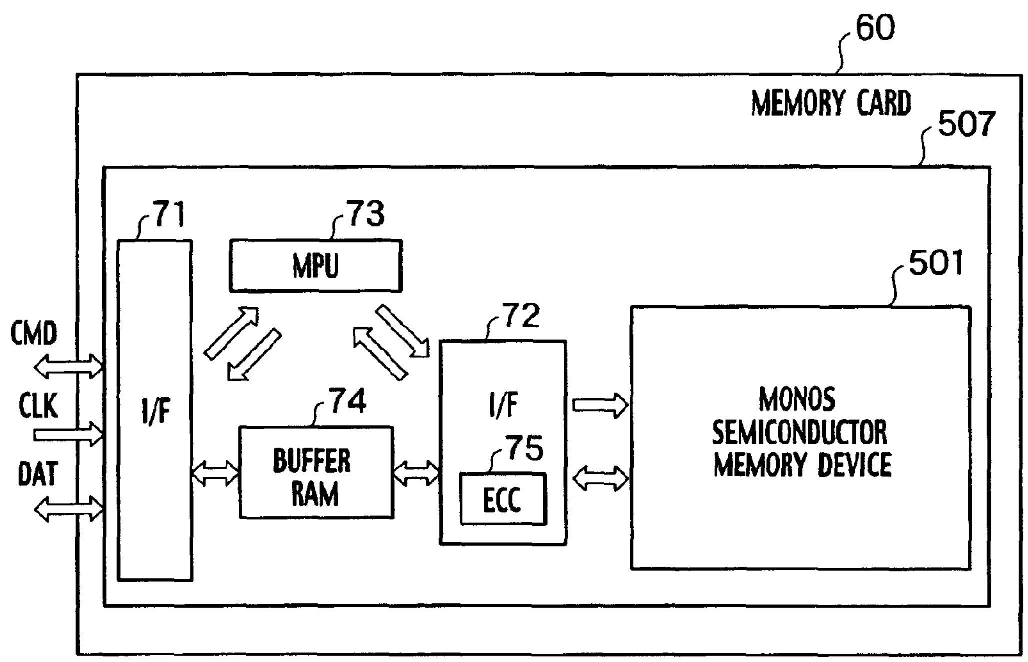
FIG. 57 is a schematic block constitutional diagram showing the internal structure of the memory card to which the semiconductor integrated circuit system of the seventh embodiment of the present invention is applied.

As shown in FIG. 57, yet another example of the memory card 60 integrates interface units (I/F) 71 and 72, a microprocessor unit (MPU) 73, a buffer RAM 74, an error correction code unit (ECC) 75 included in the interface unit (I/F) 72, and a MONOS semiconductor memory device 501 all in a single chip to provide a system LSI chip 507. Such a system LSI chip 507 is incorporated in the memory card 60.

APPLICATION EXAMPLE 4

Figure 58:
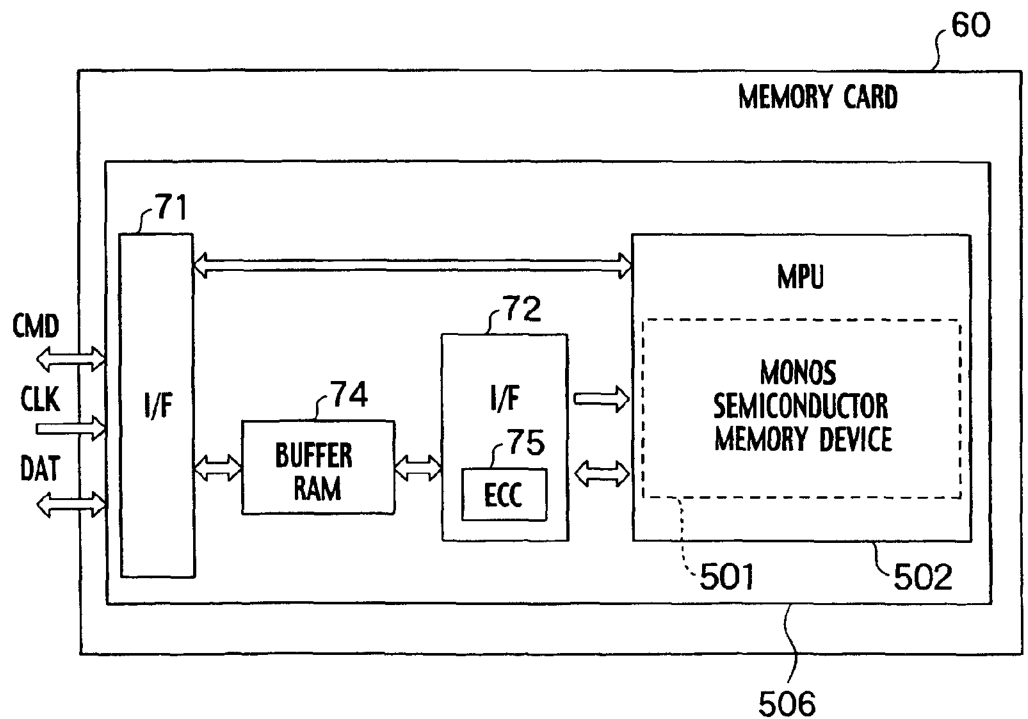
FIG. 58 is a schematic block constitutional diagram showing the internal structure of the memory card to which the semiconductor integrated circuit system of the seventh embodiment of the present invention is applied.

As shown in FIG. 58, yet another example of the memory card 60 forms a MONOS semiconductor memory device 501 in a microprocessor unit (MPU) 73 to provide a MONOS memory combination MPU 502, and integrates interface units (I/F) 71 and 72, a buffer RAM 74, and an error correction code unit (ECC) 75 included in the interface unit (I/F) 72, all in a single chip to realize a system LSI chip 506. Such a system LSI chip 506 is incorporated in the memory card 60.

APPLICATION EXAMPLE 5

Figure 59:
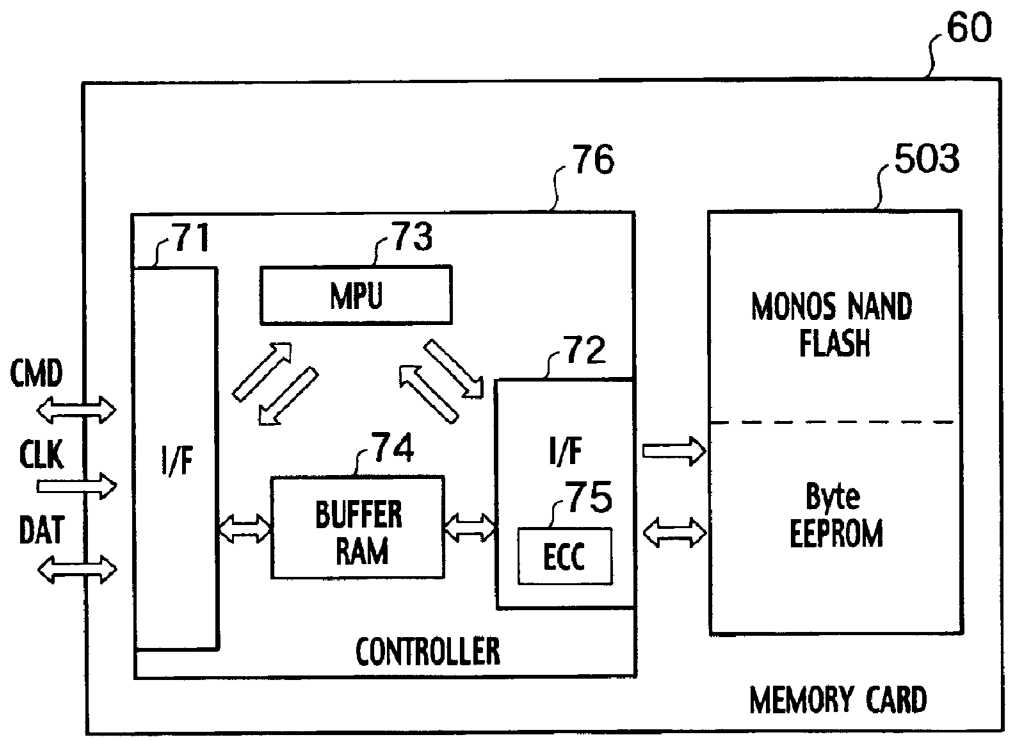
FIG. 59 is a schematic block constitutional diagram showing the internal structure of the memory card to which the semiconductor integrated circuit system of the seventh embodiment of the present invention is applied.

As shown in FIG. 59, in place of the MONOS semiconductor memory device 50 shown in FIG. 55 or 56, yet another example of the memory card 60 uses a MONOS flash memory 503 in an EEPROM mode having a ROM region which is provided by a NAND type MONOS flash memory and a byte type EEPROM.

Needless to say, as shown in FIG. 57, the MONOS flash memory 503 in the EEPROM mode having a ROM region may be formed on the same chip as the controller 76 portion to constitute a system LSI chip 507 in a single chip. Additionally, as shown in FIG. 58, a semiconductor memory region constituted by a MONOS flash memory 503 in a EEPROM mode having a ROM region may be formed in the microprocessor unit (MPU) 73 to provide a MONOS memory combination MPU 502, and the interface units (I/F) 71 and 72, and the buffer RAM 74 all being integrated in a single chip to constitute a system LSI chip 506.

APPLICATION EXAMPLE 6

Figure 60:
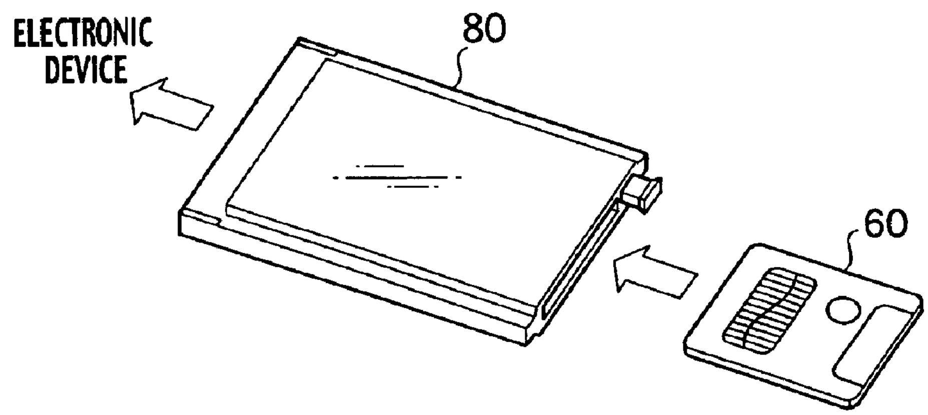
FIG. 60 is a schematic constitutional view showing the memory card and a card holder to which the semiconductor integrated circuit system of the seventh embodiment of the present invention is applied.

For the application examples of the memory card 60 shown in FIGS. 56 to 59, a memory card holder 80 is provided as shown in FIG. 60. The memory card holder 80 can house the memory card 60 which includes the semiconductor integrated circuit described above with reference to each of the first to seventh embodiments, as a MONOS semiconductor memory device 50, 501, 502, 503. The memory card holder 80 is connected to an electronic device (not shown), and can operate as an interface between the memory card 60 and the electronic device. The memory card holder 80 can execute various functions together with a plurality of functions of the controller 76, the microprocessor unit (MPU) 73, the buffer RAM 74, the error correction code unit (ECC) 75, the interface units (I/F) 71 and 72 and the like, in the memory card 60 shown in FIGS. 56 to 59.

APPLICATION EXAMPLE 7

Figure 61:
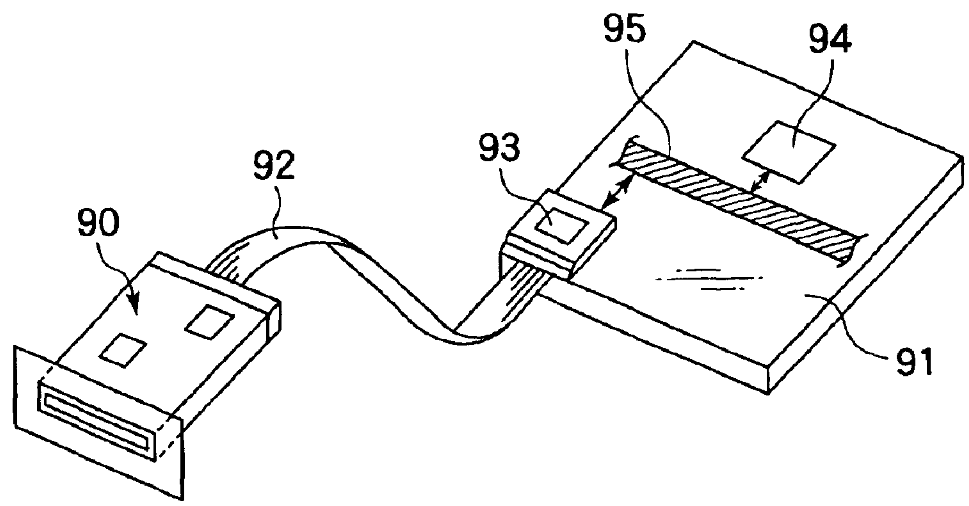
FIG. 61 is a schematic constitutional view of a connecting apparatus which can receive the memory card and the card holder to which the semiconductor integrated circuit system of the seventh embodiment of the present invention is applied.

Yet another application example is described by referring to FIG. 61. FIG. 61 shows a connecting apparatus 90 which can house the memory card 60 or the memory card holder 80. In one of the memory card 60 and the memory card holder 80, as the MONOS semiconductor memory device 50, the MONOS semiconductor memory device 501, the MONOS memory combination MPU 502, or the MONOS flash memory 503 of the EEPROM mode having a ROM region, the semiconductor integrated circuit described above with reference to each of the first to seventh embodiments of the present invention is provided. The memory card 60 or the memory card holder 80 is fixed and electrically connected to the connecting apparatus 90. The connecting apparatus 90 is connected through a connection wire 92 and an interface circuit 93 to a circuit board 91 which includes a CPU 94 and a bus 95.

APPLICATION EXAMPLE 8

Figure 62:
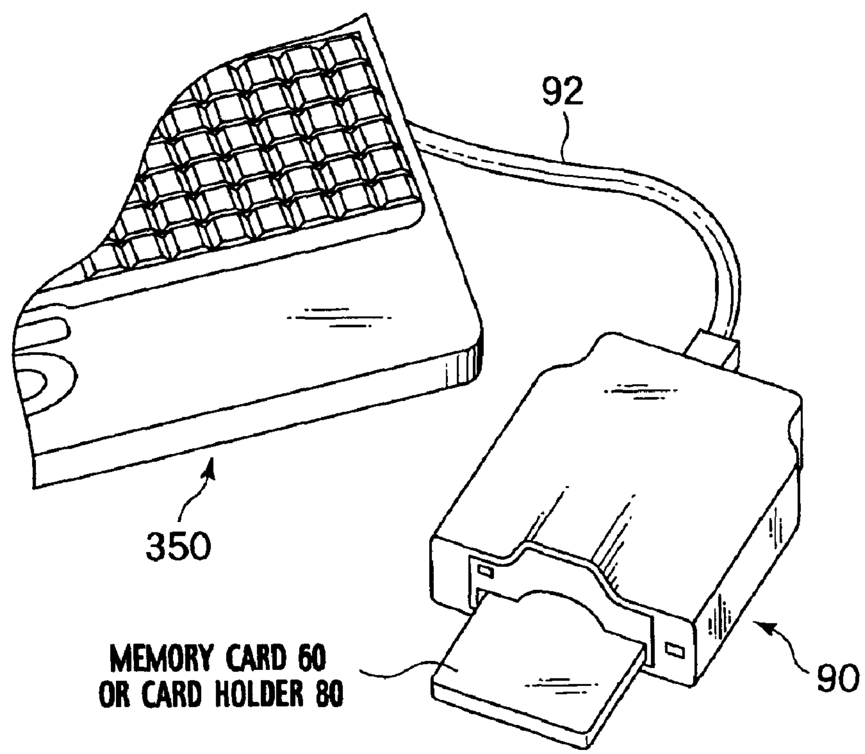
FIG. 62 is a schematic constitutional view of the connecting apparatus which incorporates the memory card to which the semiconductor integrated circuit system of the seventh embodiment of the present invention is applied, and which is connected it through a connection wire to a personal computer.

Another application example is described by referring to FIG. 62. In one of the memory card 60 and the memory card holder 80, as the MONOS semiconductor memory device 50, the MONO semiconductor memory device 501, the MONOS memory combination MPU 502, or the MONOS flash memory 503 in the EEPROM mode having a ROM region, the nonvolatile semiconductor memory device described above with reference to each of the first to seventh embodiments of the present invention is provided. The memory card 60 or the memory card holder 80 is fixed and electrically connected to the connecting apparatus 90. The connecting apparatus 90 is connected through a connection wire 92 to a personal computer (PC) 350.

APPLICATION EXAMPLE 9

Figure 63:
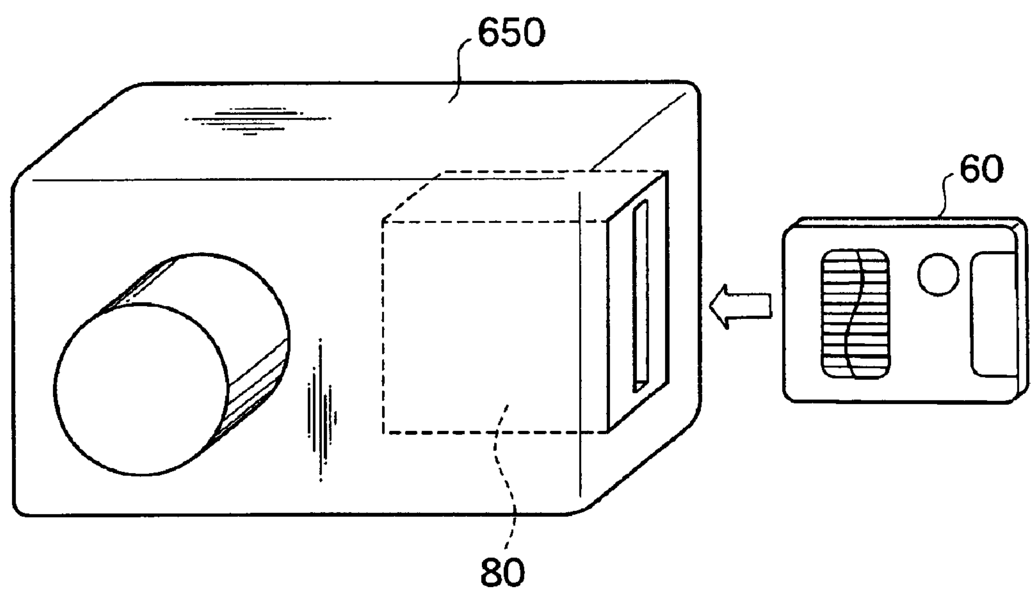
FIG. 63 is a view showing a digital camera which can incorporate the memory card to which the semiconductor integrated circuit system of the seventh embodiment of the present invention is applied.

Another application example is described by referring to FIG. 63. In the memory card 60, as the MONOS semiconductor memory device 50, the MONOS semiconductor memory device 501, the MONOS memory combination MPU 502, or the MONOS flash memory 503 in the EEPROM mode having a ROM region, the nonvolatile semiconductor memory device described above with reference to each of the first to seventh embodiments is provided. FIG. 63 shows an example of applying such a memory card 60 to a digital camera 650 which incorporates the memory card holder 80.

APPLICATION EXAMPLE 10

Figure 64:
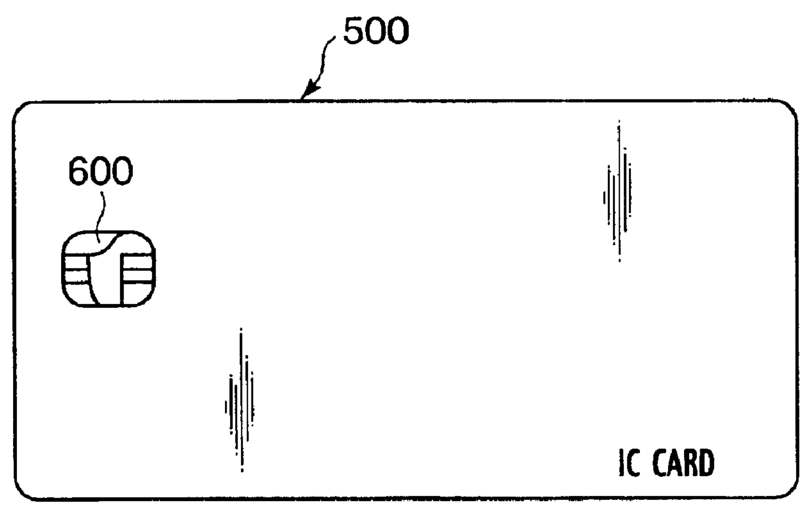
FIG. 64 is a schematic constitutional view of an IC card to which the semiconductor integrated circuit system of the seventh embodiment of the present invention is applied.
Figure 65:
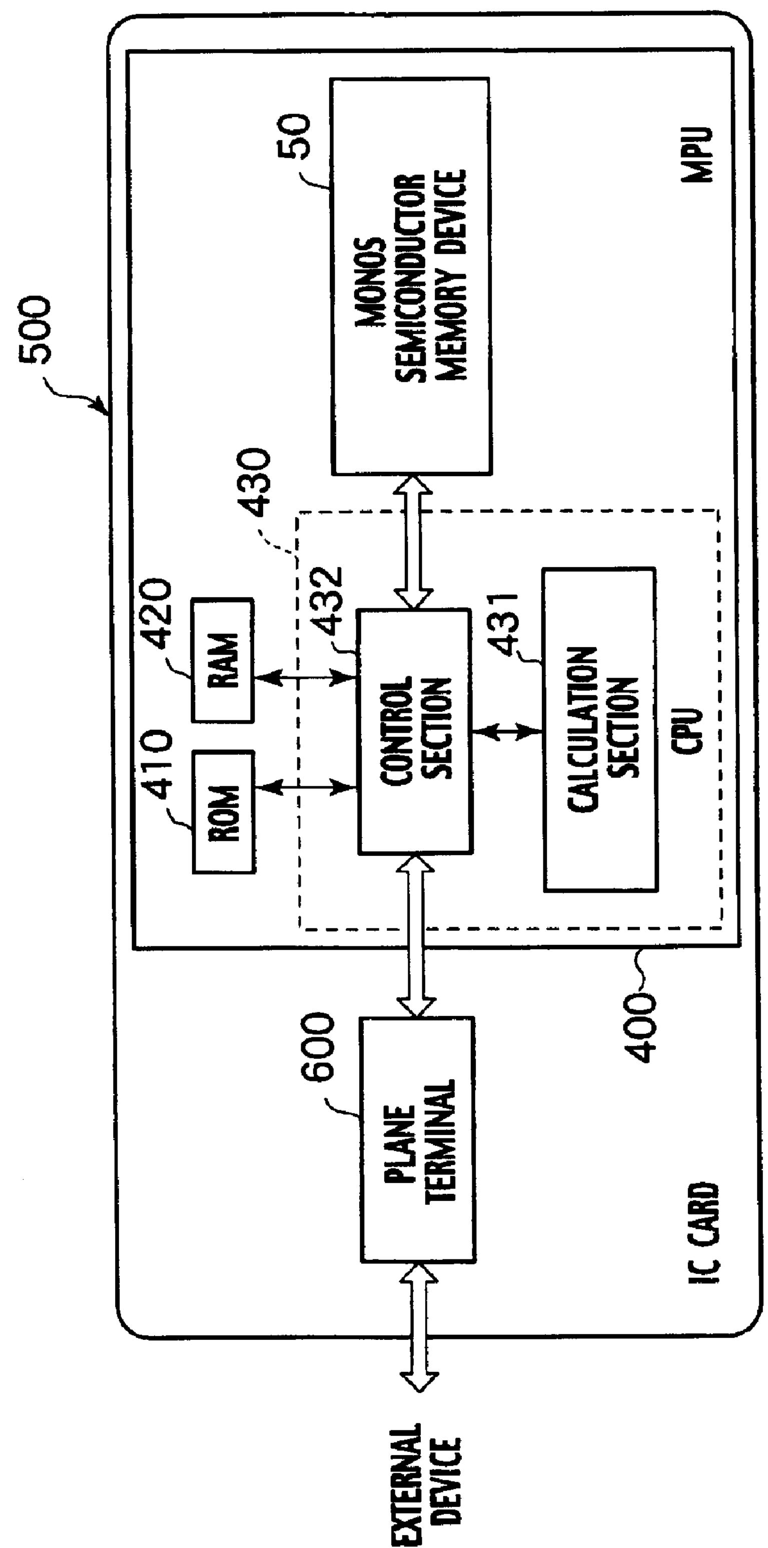
FIG. 65 is a schematic block constitutional diagram showing an internal structure of the IC card to which the semiconductor integrated circuit system of the seventh embodiment of the present invention is applied.

As shown in FIGS. 64 and 65, another application example of the semiconductor integrated circuit of each of the first to seventh embodiments of the present invention includes an interface circuit (IC) card 500 which includes an MPU 400 constituted by a MONOS semiconductor memory device 50, a ROM 410, a RAM 420 and a CPU 430, and a plane terminal 600. The IC card 500 can be coupled through the plane terminal 600 to an external device. The plane terminal 600 is coupled to the MPU 400 in the IC card 500. The CPU 430 includes a calculation section 431 and a control section 432. The control section 432 is coupled to the MONOS semiconductor device 50, the ROM 410 and the RAM 420. Preferably, the MPU 400 is mounted on one surface of the IC card 500, and the plane terminal 600 is formed on the other surface of the IC card 500. In FIG. 65, the semiconductor integrated circuit described above with reference to each of the first to seventh embodiments of the present invention can be applied to the MONOS semiconductor memory device 50 or the ROM 410. Moreover, an operational mode of the nonvolatile semiconductor memory device, constituted by the semiconductor integrated circuit, may be a page mode, a byte mode and an EEPROM mode having a ROM region.

APPLICATION EXAMPLE 11

Figure 66:
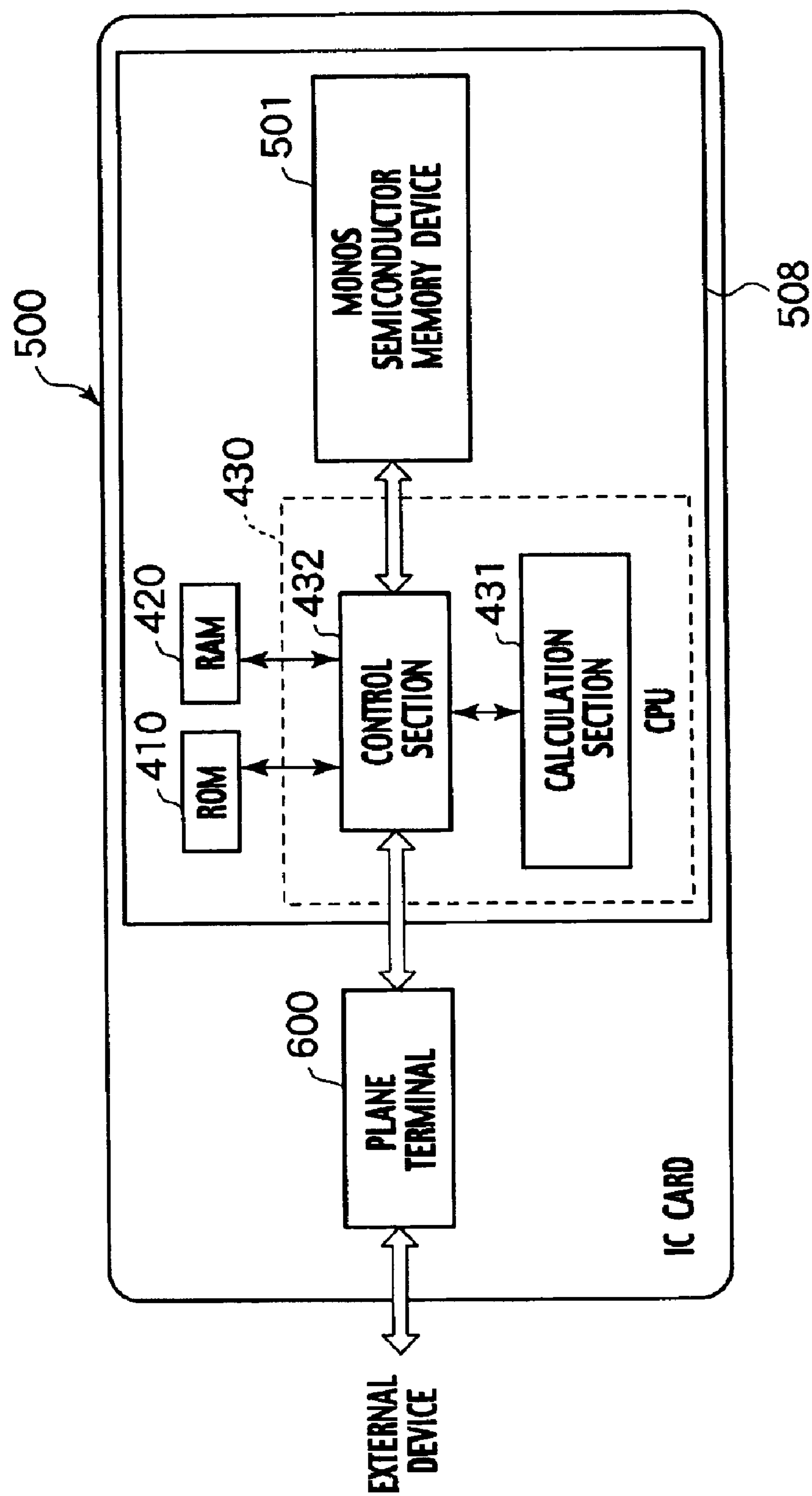
FIG. 66 is a schematic block constitutional diagram showing the internal structure of the IC card to which the semiconductor integrated circuit system of the seventh embodiment of the present invention is applied.

In yet anther example of the IC card 500, as shown in FIG. 66, a ROM 410, a RAM 420, a CPU 430, and a MONOS semiconductor memory device 501 are all integrated in a single chip to constitute a system LSI chip 508. Such a system LSI chip 508 is incorporated in the IC card 500. In FIG. 66, the semiconductor integrated circuit described above with reference to each of the first to sixth embodiments of the present invention can be applied to the MONOS semiconductor memory device 501 and the ROM 410. Moreover, an operational mode of the nonvolatile semiconductor memory device constituted by the semiconductor integrated circuit, may be a page mode, a byte mode and an EEPROM mode having a ROM region.

APPLICATION EXAMPLE 12

Figure 67:
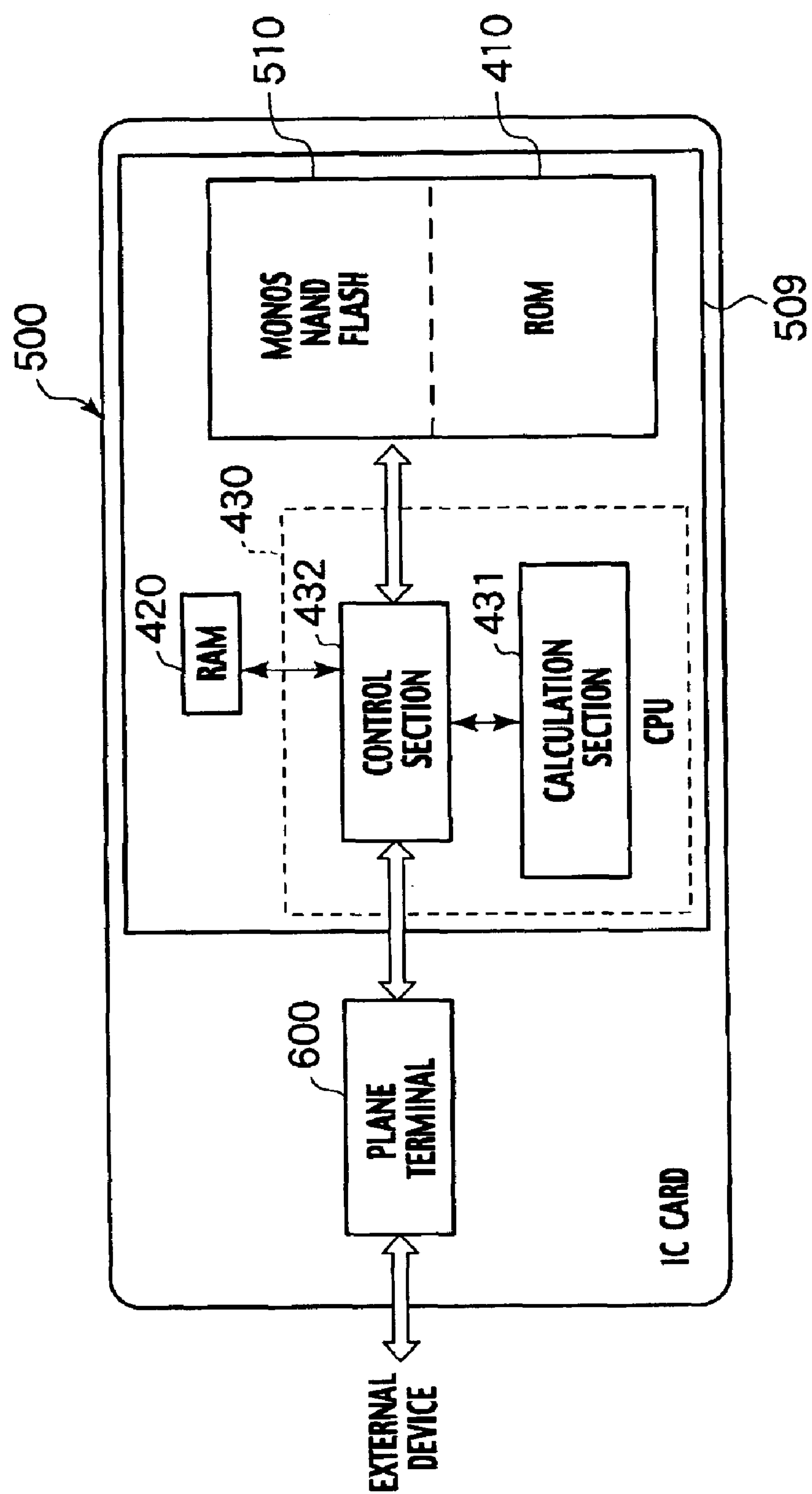
FIG. 67 is a schematic block constitutional diagram showing the internal structure of the IC card to which the semiconductor integrated circuit system of the seventh embodiment of the present invention is applied.

In yet another example of the IC card 500, as shown in FIG. 67, a ROM 410 is incorporated in a MONOS semiconductor memory device 501 to constitute a MONOS flash memory 510 in an EEPROM mode having a ROM region. Moreover, the MONOS flash memory 510 in the EEPROM mode having a ROM region, a RAM 420, and a CPU 430 are all integrated in a single chip to constitute a system LSI chip 509. Such a system LSI chip 509 is incorporated in the IC card 500.

APPLICATION EXAMPLE 13

Figure 68:
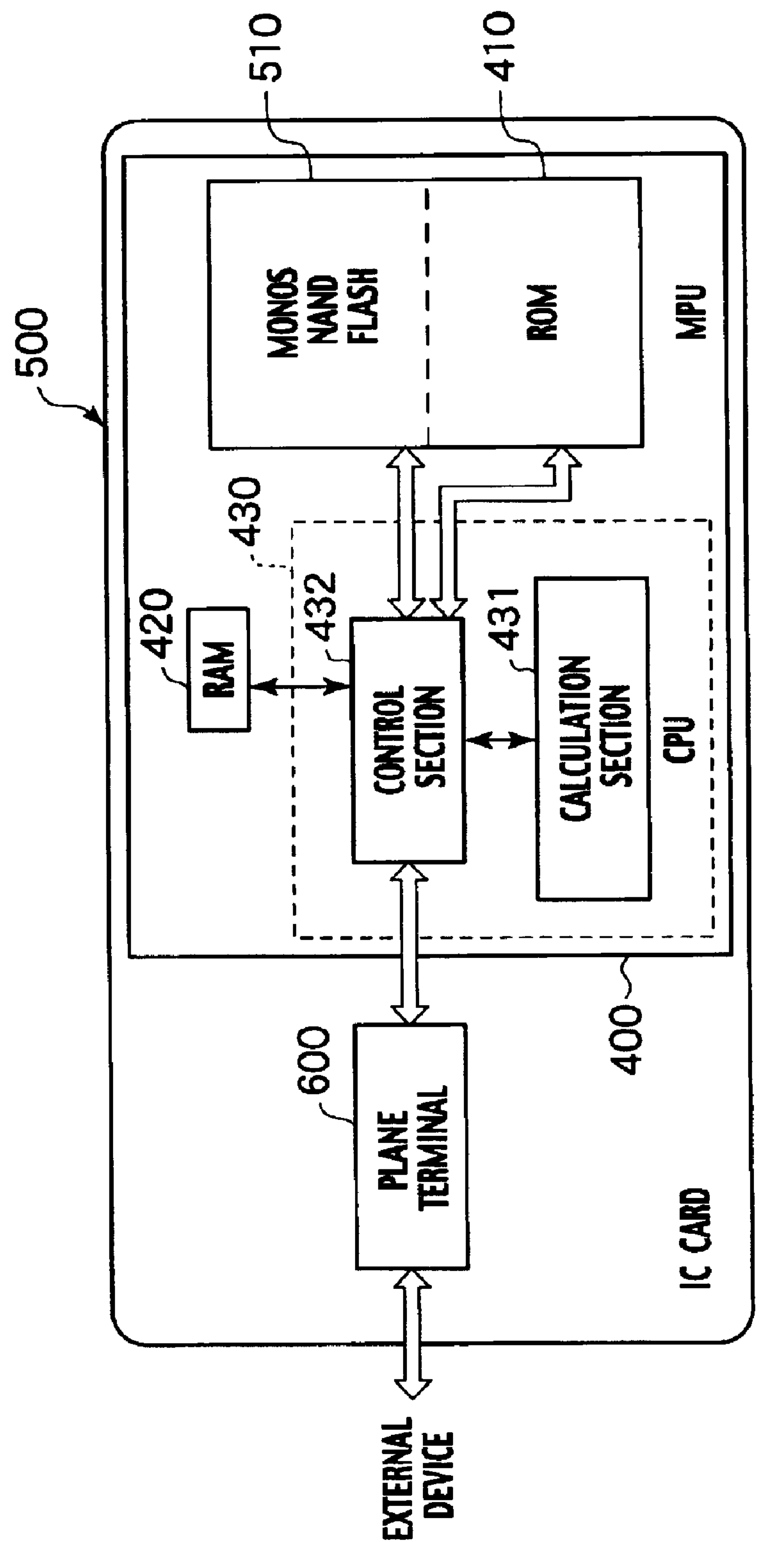
FIG. 68 is a schematic block constitutional diagram showing the internal structure of the IC card to which the semiconductor integrated circuit system of the seventh embodiment of the present invention is applied.

In yet another example of the IC card 500, as shown in FIG. 68, in the MONOS semiconductor memory device 50 shown in FIG. 65, a ROM 410 is incorporated to constitute a MONOS flash memory 510 in an EEPROM mode having a ROM region. The MONOS flash memory 510 in the EEPROM mode having a ROM region is incorporated in an MPU 400 as in the case shown in FIG. 65.

The foregoing embodiments and examples can be implemented in combination.

Other implementations are readily discernable to one of those skilled in the art when the present description is read in view of the description in U.S. Pat. No. 6,002,605, which is incorporated herein by reference in its entirely.

(Other Embodiments)

Various modifications will become possible for those skilled in the art after receiving the teachings of the present disclosure without departing from the scope thereof.

For example, instead of the silicon nitride layer 22, a high-κ dielectric insulating layer such as $Al_2O_3$, $HfO_2$ may be utilized as a charge storage layer, when the high-κ dielectric insulating layer has a high ratio of an etching selectivity relative to a silicon dioxide layer.

Thus, needless to say, the present invention includes various embodiments or the like not described here. Therefore, the technical scope of the present invention is defined only by proper appended claims.

What is claimed is:

1. A semiconductor integrated circuit comprising:

a semiconductor substrate;

a plurality of memory cells provided on the semiconductor substrate and having a first gate insulating layer of a stacked structure which includes a silicon nitride layer to be a charge storage layer, and having a source and drain diffused layer and a gate electrode;

an inter-layer insulating layer provided on the memory cell;

a metal wiring provided on the inter-layer insulating layer;

a contact plug buried in the inter-layer insulating layer and connecting the metal wiring to at least one of the source and drain diffused layer of the memory cell, and an isolation region which electrically isolates neighboring cells of the plurality of memory cells adjacent to the contact plug;

wherein the silicon nitride layer is provided above the isolation region adjacent to the contact plug and is the same silicon nitride layer of the charge storage layer.

2. The semiconductor integrated circuit of claim 1, wherein the contact plug is self-aligned to the isolation region and connected to at least one of the source and drain diffused layer of the memory cell.

3. The semiconductor integrated circuit of claim 1, further comprising:

a barrier insulating layer provided underneath the inter-layer insulating layer, with a silicon nitride layer overlaying both the memory cell and the isolation region; and a stacked layer provided with the silicon nitride layer of the barrier insulating layer and the silicon nitride layer used as the first gate insulating layer, wherein the stacked layer is formed above the isolation region.

4. The semiconductor integrated circuit of claim 1, wherein the silicon nitride layer on the isolation region as an etching stopper in an etching process of the inter-layer insulating layer.

* * * * *